(12) United States Patent
Brick et al.

(10) Patent No.: US 11,610,868 B2
(45) Date of Patent: Mar. 21, 2023

(54) μ-LED, μ-LED DEVICE, DISPLAY AND METHOD FOR THE SAME

(71) Applicant: OSRAM Opto Semiconductors GmbH, Regensburg (DE)

(72) Inventors: Peter Brick, Regensburg (DE); Jean-Jacques Drolet, Obertraubling (DE); Hubert Halbritter, Dietfurt-Toeging (DE); Laura Kreiner, Regensburg (DE); Thomas Schwarz, Regensburg (DE); Julia Stolz, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 17/039,097

(22) Filed: Sep. 30, 2020

(65) Prior Publication Data
US 2021/0082886 A1   Mar. 18, 2021

Related U.S. Application Data

(63) Continuation of application No. PCT/EP2020/052191, filed on Jan. 29, 2020.

(30) Foreign Application Priority Data

Apr. 23, 2019   (DE) ...................... 10 2019 110 199.8
May 14, 2019   (DE) ...................... 10 2019 112 616.9
(Continued)

(51) Int. Cl.
*H01L 25/075*   (2006.01)
*H01L 33/60*   (2010.01)
(Continued)

(52) U.S. Cl.
CPC .......... *H01L 25/0753* (2013.01); *H01L 33/24* (2013.01); *H01L 33/505* (2013.01);
(Continued)

(58) Field of Classification Search
CPC .................................................... H01L 25/0753
(Continued)

(56) References Cited

U.S. PATENT DOCUMENTS 4,979,002 A   12/1990   Pankove
5,103,271 A   4/1992   Izumiya et al.
(Continued)

FOREIGN PATENT DOCUMENTS

DE   19744793 A1   4/1998
DE   19751649 A1   5/1999
(Continued)

OTHER PUBLICATIONS

International Search Report for International Patent Application No. PCT/EP2020/058997, dated Mar. 5, 2021 (10 pages).
(Continued)

*Primary Examiner* — Hsin Yi Hsieh
(74) *Attorney, Agent, or Firm* — ArentFox Schiff LLP

(57) ABSTRACT

The invention relates to various aspects of a μ-LED or a μ-LED array for augmented reality or lighting applications, in particular in the automotive field. The μ-LED is characterized by particularly small dimensions in the range of a few μm.

17 Claims, 32 Drawing Sheets

(30) Foreign Application Priority Data

| | | |
|---|---|---|
| May 14, 2019 | (DE) | 10 2019 112 639.8 |
| Jun. 12, 2019 | (DE) | 10 2019 115 991.1 |
| Jun. 14, 2019 | (DE) | 10 2019 116 313.7 |
| Jul. 5, 2019 | (DE) | 10 2019 118 251.4 |

(51) Int. Cl.
*H01L 33/50* (2010.01)
*H01L 33/24* (2010.01)
*H01L 33/32* (2010.01)

(52) U.S. Cl.
CPC .............. *H01L 33/60* (2013.01); *H01L 33/32* (2013.01); *H01L 2933/0083* (2013.01); *H01L 2933/0091* (2013.01)

(58) Field of Classification Search
USPC ......................................................... 257/98
See application file for complete search history.

(56) References Cited

U.S. PATENT DOCUMENTS

| | | | |
|---|---|---|---|
| 5,526,063 | A | 6/1996 | Joubert et al. |
| 5,537,171 | A | 7/1996 | Ogino et al. |
| 7,808,005 | B1 | 10/2010 | Fattal et al. |
| 8,349,116 | B1 | 1/2013 | Bibl et al. |
| 8,586,965 | B2 | 11/2013 | Toyoda et al. |
| 9,202,988 | B2 | 12/2015 | Yoshida et al. |
| 9,368,683 | B1 | 6/2016 | Meitl et al. |
| 10,096,585 | B2 | 10/2018 | Tanaka et al. |
| 10,162,182 | B2 | 12/2018 | Jepsen |
| 10,177,195 | B2 | 1/2019 | Ahmed et al. |
| 10,466,487 | B2 | 11/2019 | Blum et al. |
| 10,802,334 | B2 | 10/2020 | Kim et al. |
| 10,903,193 | B2 | 1/2021 | Yamada |
| 10,963,103 | B1 | 3/2021 | Shahmohammadi |
| 11,156,759 | B2 | 10/2021 | Brick et al. |
| 2003/0141507 | A1 | 7/2003 | Krames et al. |
| 2003/0189125 | A1 | 10/2003 | Trierenberg |
| 2004/0146219 | A1 | 7/2004 | Sathyanarayana |
| 2004/0189627 | A1 | 9/2004 | Shirasaki et al. |
| 2005/0194598 | A1 | 9/2005 | Kim et al. |
| 2005/0237488 | A1 | 10/2005 | Yamasaki et al. |
| 2006/0002247 | A1 | 1/2006 | Kim et al. |
| 2008/0061304 | A1 | 3/2008 | Huang et al. |
| 2009/0045416 | A1* | 2/2009 | Bierhuizen ............ H01L 33/46 257/E33.001 |
| 2009/0291237 | A1* | 11/2009 | Park .................... H01L 51/5275 428/32.6 |
| 2009/0315054 | A1 | 12/2009 | Kim et al. |
| 2010/0019697 | A1 | 1/2010 | Korsunsky et al. |
| 2010/0163894 | A1 | 7/2010 | Uemura et al. |
| 2010/0252103 | A1 | 10/2010 | Yao et al. |
| 2011/0151602 | A1 | 6/2011 | Speier |
| 2011/0204327 | A1 | 8/2011 | Hiruma et al. |
| 2012/0223289 | A1 | 9/2012 | Gwo et al. |
| 2013/0063413 | A1 | 3/2013 | Miyake |
| 2013/0063815 | A1 | 3/2013 | Kubota |
| 2013/0082624 | A1 | 4/2013 | Brassfield et al. |
| 2014/0008677 | A1 | 1/2014 | Zhu et al. |
| 2014/0111559 | A1 | 4/2014 | Yang et al. |
| 2014/0131753 | A1 | 5/2014 | Ishida et al. |
| 2014/0319560 | A1* | 10/2014 | Tischler ................ H01L 33/56 257/98 |
| 2014/0340900 | A1 | 11/2014 | Bathurst et al. |
| 2015/0103404 | A1 | 4/2015 | Rudy et al. |
| 2015/0187991 | A1 | 7/2015 | McGroddy et al. |
| 2015/0207399 | A1 | 7/2015 | Li et al. |
| 2015/0280086 | A1 | 10/2015 | Jang et al. |
| 2016/0315218 | A1 | 10/2016 | Bour et al. |
| 2016/0341942 | A1 | 11/2016 | Cheon et al. |
| 2017/0082263 | A1 | 3/2017 | Byrnes et al. |
| 2017/0254518 | A1 | 9/2017 | Vasylyev |
| 2017/0278733 | A1 | 9/2017 | Chang et al. |
| 2017/0352309 | A1 | 12/2017 | Chang et al. |
| 2017/0352313 | A1 | 12/2017 | Miyake |
| 2017/0371087 | A1* | 12/2017 | You ........................ G02B 6/00 |
| 2018/0012540 | A1 | 1/2018 | Hosoyachi et al. |
| 2018/0033768 | A1* | 2/2018 | Kumar ..................... H01L 24/97 |
| 2018/0075798 | A1 | 3/2018 | Nho et al. |
| 2018/0097033 | A1 | 4/2018 | Ahmed et al. |
| 2018/0114878 | A1 | 4/2018 | Danesh et al. |
| 2018/0180249 | A1 | 6/2018 | Yamada et al. |
| 2018/0182298 | A1 | 6/2018 | Jang et al. |
| 2018/0211595 | A1 | 7/2018 | Takahashi et al. |
| 2018/0247586 | A1 | 8/2018 | Vahid Far et al. |
| 2018/0275410 | A1 | 9/2018 | Yeoh et al. |
| 2018/0301433 | A1 | 10/2018 | Robin et al. |
| 2018/0323116 | A1 | 11/2018 | Wu et al. |
| 2018/0331258 | A1 | 11/2018 | Halbritter et al. |
| 2018/0342492 | A1 | 11/2018 | Lu |
| 2018/0367769 | A1 | 12/2018 | Greenberg |
| 2019/0013439 | A1 | 1/2019 | Sung et al. |
| 2019/0044023 | A1 | 2/2019 | Cheng et al. |
| 2019/0058081 | A1 | 2/2019 | Ahmed et al. |
| 2019/0113727 | A1 | 4/2019 | Tamma |
| 2019/0165209 | A1 | 5/2019 | Bonar et al. |
| 2019/0174079 | A1 | 6/2019 | Anthony et al. |
| 2019/0229097 | A1* | 7/2019 | Takeya ................ H01L 33/0093 |
| 2019/0258346 | A1* | 8/2019 | Cheng ................. H01L 27/1214 |
| 2019/0293939 | A1 | 9/2019 | Sluka |
| 2019/0305185 | A1 | 10/2019 | Lauermann et al. |
| 2020/0119233 | A1 | 4/2020 | Dupont |
| 2020/0219855 | A1 | 7/2020 | Chen et al. |
| 2020/0227594 | A1 | 7/2020 | Kuo |
| 2020/0343230 | A1 | 10/2020 | Sizov et al. |
| 2020/0357103 | A1 | 11/2020 | Wippermann et al. |
| 2020/0366067 | A1* | 11/2020 | David ..................... H01S 5/423 |
| 2021/0080637 | A1 | 3/2021 | Brick et al. |
| 2021/0083152 | A1 | 3/2021 | Biebersdorf et al. |
| 2021/0104574 | A1 | 4/2021 | Behringer et al. |
| 2021/0166618 | A1 | 6/2021 | Baumheinrich et al. |
| 2021/0313497 | A1* | 10/2021 | Pourquier ........... H01L 25/0753 |
| 2021/0325594 | A1 | 10/2021 | Meng et al. |
| 2021/0405276 | A1 | 12/2021 | Brick et al. |

FOREIGN PATENT DOCUMENTS

| | | |
|---|---|---|
| DE | 19911717 A1 | 9/2000 |
| DE | 10009782 A1 | 9/2001 |
| DE | 102007043877 A1 | 1/2009 |
| DE | 102007046339 A1 | 4/2009 |
| DE | 102005063159 B4 | 5/2009 |
| DE | 102013104273 A1 | 10/2014 |
| DE | 102017106755 A1 | 10/2018 |
| DE | 102017109083 A1 | 10/2018 |
| DE | 102018108022 A1 | 10/2018 |
| DE | 102017114369 A1 | 1/2019 |
| DE | 102018113363 A1 | 12/2019 |
| DE | 102018119312 A1 | 2/2020 |
| DE | 102018119376 A1 | 2/2020 |
| EP | 0488772 A1 | 6/1992 |
| EP | 1544660 A1 | 6/2005 |
| EP | 1553640 A1 | 7/2005 |
| EP | 1887634 A2 | 2/2008 |
| EP | 2323185 A2 | 5/2011 |
| EP | 2396818 A2 | 12/2011 |
| EP | 2430652 | 3/2012 |
| EP | 2609624 | 3/2012 |
| EP | 2477240 A1 | 7/2012 |
| EP | 2506321 A1 | 10/2012 |
| EP | 2642537 A2 | 9/2013 |
| EP | 2685155 A2 | 1/2014 |
| EP | 2750208 A2 | 7/2014 |
| EP | 2838130 A1 | 2/2015 |
| EP | 2924490 A2 | 9/2015 |
| EP | 2980866 A1 | 2/2016 |
| EP | 2986826 A1 | 2/2016 |
| EP | 3010048 A1 | 4/2016 |
| EP | 3031086 A1 | 6/2016 |
| EP | 2676528 B1 | 8/2017 |
| EP | 3226042 A1 | 10/2017 |
| EP | 2704215 B1 | 4/2018 |

(56) References Cited

FOREIGN PATENT DOCUMENTS

| | | |
|---|---|---|
| EP | 33673774 A1 | 8/2018 |
| JP | H06244457 A | 9/1994 |
| JP | 2007264610 A | 10/2007 |
| JP | 2007324416 A | 12/2007 |
| JP | 2009186794 A | 8/2009 |
| JP | 2015099238 A | 5/2015 |
| KR | 20130052944 A | 5/2013 |
| WO | 2004084318 A1 | 9/2004 |
| WO | 2006035212 A1 | 4/2006 |
| WO | 2007001099 A1 | 1/2007 |
| WO | 2009082121 A2 | 7/2009 |
| WO | 2010019594 A2 | 2/2010 |
| WO | 2010132552 A1 | 11/2010 |
| WO | 2010149027 A1 | 12/2010 |
| WO | 2011069747 A1 | 6/2011 |
| WO | 2011117056 A1 | 9/2011 |
| WO | 2011160051 A2 | 12/2011 |
| WO | 2012014857 A1 | 2/2012 |
| WO | 2013026440 A2 | 2/2013 |
| WO | 2014047113 A1 | 3/2014 |
| WO | 2014093063 A1 | 6/2014 |
| WO | 2015138102 A1 | 9/2015 |
| WO | 2016025325 A1 | 2/2016 |
| WO | 2016054092 A1 | 4/2016 |
| WO | 2016060677 A1 | 4/2016 |
| WO | 2017087312 A1 | 5/2017 |
| WO | 2017111827 A1 | 6/2017 |
| WO | 2017120320 A1 | 7/2017 |
| WO | 2017120341 A1 | 7/2017 |
| WO | 2017197576 A1 | 11/2017 |
| WO | 2018117382 A1 | 6/2018 |
| WO | 2018123280 A1 | 7/2018 |
| WO | 2020157149 A1 | 8/2020 |

OTHER PUBLICATIONS

Buljan et al., "Ultra-Compact Multichannel Freeform Optics for 4xWUXGA OLED Microdisplays," Proc. SPIE 10676, Digital Optics for Immersive Displays, 9 pages (2018).
Fortuna, "Integrated Nanoscale Antenna-LED for On-Chip Optical Communication," UC Berkeley, 146 pages (2017).
Li et al., "Waveguiding in Vertical Cavity Quantum-Well Structure Defined by Ion Implantation," J. Lightwave Technol. 16, pp. 1498-1508 (1998).
Ogihara et al., "1200 Dots-Per-Inch Light Emitting Diode Array Fabricated by Solid-Phase Zinc Diffusion," IEICE Transactions on Electronics, 80;3, pp. 489-497 (1997).
Stevens et al., "Varifocal Technologies Providing Prescription and VAC Mitigation in HMDs Using Alvarez Lenses," Proc. SPIE 10676, Digital Optics for Immersive Displays, 18 pages (2018).
Tomioka et al., "Selective-Area Growth of III-V Nanowires and Their Applications," Journal of Materials Research, 26(17), pp. 2127-2141 (2011).
Waldern et al., "DigiLens Switchable Bragg Grating Waveguide Optics for Augmented Reality Applications," Proc. SPIE 10676, Digital Optics for Immersive Displays, 17 pages (2018).
Wheelwright et al., "Field of View: Not Just a Number," Proc. SPIE 10676, Digital Optics for Immersive Displays, 8 pages (2018).
Yu et al., "Hybrid LED Driver for Multi-Channel Output with High Consistency," 2015 IEEE 11th International Conference on ASIC (ASICON), Chengdu, 4 pages (2015).
Huang et al., "Metasurface Holography: From Fundamentals to Applications," Nanophotonics. 7(6), pp. 1169-1190 (2018).
International Search Report for International Patent Application No. PCT/EP2020/058547, dated Mar. 26, 2021 (9 pages).

* cited by examiner

| | App. Field | Usecase | Viewing Distance [cm] | Min. Size X*Y [cm] | Max. Size X*Y [cm] | PPI | PP [μm] | Res. Type |
|---|---|---|---|---|---|---|---|---|
| Direct Emitter Display | Auto | Low res HuD | tbd | tbd | tbd | tbd | tbd | tbd |
| | Auto | Multi Media Display Rear | 30 - 40 | 15*10 | 25*15 | ≥ 250 | ≤ 102 | mid res |
| | Auto | Rear View Mirror / Replacement | 25 - 70 | 16*6 | 30*15 | ≥ 250 | ≤ 102 | |
| | Auto | Display in the Window Pillars | 25 - 150 | 20*5 | 100*30 | ≥ 250 | ≤ 102 | |
| | Auto | Cluster | 40 - 70 | 20*10 | 90*30 | ≥ 200 | ≤ 127 | |
| | Auto | Center Stack | 40 - 70 | 12*9 | 40*25 | ≥ 200 | ≤ 127 | |
| | Auto | Small Distributed info Displays (e.g. AC Control) | 40 - 70 | 1*0,5 | 6*6 | ≥ 200 | ≤ 127 | |
| | Auto | Extended Cluster Across Dash Board | 40 - 70 | 150*10 | 180*30 | ≥ 200 | ≤ 127 | |
| | Auto | Exterior Advertisement good resolution | 50 - 150 | 30*30 | 50*150 | ≥ 100 | ≤ 254 | |
| | Auto | Roof / Sky | 20 - 40 | 70*40 | 200*180 | ≥ 50 | ≤ 508 | low res |
| | Auto | RCL | 200 - .... | 20*10 | 50*30 | ≥ 50 | ≤ 508 | |
| | Auto | Decoration Style Displays | 20 - 200 | 20*10 | 180*30 | ≥ 50 | ≤ 508 | |
| | MM | Command & Control | 300-1500 | 200*200 | 5000*300 | ≤ 30 | ≥ 847 | very low res |
| | MM | Conference/Board Rooms | 1000-10000 | 70*180 | 300*600 | ≤ 30 | ≥ 847 | |
| | Auto | Pedestrian Communication | 200-...... | tbd | tbd | ≥ 25 | ≤ 1016 | |
| | Auto | Exterior Advertisement | 50-2000 | 30*30 | 50*150 | ≥ 25 | ≤ 1016 | |
| | MM | Electronic Posters | 50-2000 | 100*200 | 200*400 | ≥ 25 | ≤ 1016 | |
| | MM | Cinema | 3000-50000 | 500*300 | 800*2000 | ≤ 10 | ≥ 2540 | |

FIG. 3B-1

| | | | | | | | |
|---|---|---|---|---|---|---|---|
| Transparent Direct Emitter Display | Auto | Rear View Mirror | 25 - 70 | 15*10 | 30*15 | ≥ 250 | ≤ 102 | mid res |
| | Auto | Vanity Mirror | 25 - 70 | 7*4 | 90*90 | ≥ 250 | ≤ 102 | |
| | Auto | Side View Mirror | 40 – 70 | 12*8 | 20*15 | ≥ 200 | ≤ 127 | |
| | Auto | Side Window status indicators | 40 – 70 | 2*2 | 15*3 | ≥ 200 | ≤ 127 | |
| | Auto | Stacked Display (3D Cluster) | 40 – 70 | 20*10 | 180*30 | ≥ 200 | ≤ 127 | |
| | Auto | Panorama Roof Display | 20 - 40 | 70*40 | 200*180 | ≥ 50 | ≤ 508 | low res |
| | MM | Advertisement | 50-2000 | 100*200 | 200*400 | ≥ 25 | ≤ 1016 | very low res |
| | Auto | Rear/Side Window Display (Outside Communication, Rear Light, Turn Indicator) | 200 - 1000 | 20*20 | 180*150 | ≥ 10 | ≤ 2540 | |
| | Auto | CHMSL (Center High Mounted Stop Light) | 200 - …… | 20*10 | 180*15 | ≥ 10 | ≤ 2540 | |
| | Auto | Peripheral Display (e.g. Wind Shield, Side Windows, etc…) | 40 – 70 | 5*5 | 180*15 | ≥ 10 | ≤ 2540 | |
| | Auto | Wind Shield Display for Autonomous Communication (Full Size) | 200 - 1000 | 3*50 | 180*150 | ≥ 10 | ≤ 2540 | |

FIG. 3B-2

| | App. Field | Usecase | Viewing Distance [cm] | Min. Size X* Y [cm] | Max. Size X* Y [cm] | PPI | PP [μm] | Res. Type |
|---|---|---|---|---|---|---|---|---|
| Direct Emitter Display | Auto | Low res HuD | tbd | tbd | tbd | tbd | tbd | tbd |
| | Auto | Multi Media Display Rear | 30 - 40 | 15*10 | 25*15 | ≥ 250 | ≤ 102 | mid res |
| | Auto | Rear View Mirror / Replacement | 25 - 70 | 16*6 | 30*15 | ≥ 250 | ≤ 102 | |
| | Auto | Display in the Window Pillars | 25 - 150 | 20*5 | 100*30 | ≥ 250 | ≤ 102 | |
| | Auto | Cluster | 40 - 70 | 20*10 | 90*30 | ≥ 200 | ≤ 127 | |
| | Auto | Center Stack | 40 - 70 | 12*9 | 40*25 | ≥ 200 | ≤ 127 | |
| | Auto | Small Distributed info Displays (e.g. AC Control) | 40 - 70 | 1*0,5 | 6*6 | ≥ 200 | ≤ 127 | |
| | Auto | Extended Cluster Across Dash Board | 40 - 70 | 150*10 | 180*30 | ≥ 200 | ≤ 127 | |
| | Auto | Exterior Advertisement good resolution | 50 - 150 | 30*30 | 50*150 | ≥ 100 | ≤ 254 | |
| | Auto | Roof / Sky | 20 - 40 | 70*40 | 200*180 | ≥ 50 | ≤ 508 | low res |
| | Auto | RCL | 200 - .... | 20*10 | 50*30 | ≥ 50 | ≤ 508 | |
| | Auto | Decoration Style Displays | 20 - 200 | 20*10 | 180*30 | ≥ 50 | ≤ 508 | |
| | MM | Command & Control | 300-1500 | 200*200 | 5000*300 | ≤ 30 | ≥ 847 | very low res |
| | MM | Conference/Board Rooms | 1000-10000 | 70*180 | 300*600 | ≤ 30 | ≥ 847 | |
| | Auto | Pedestrian Communication | 200-...... | tbd | tbd | ≥ 25 | ≤ 1016 | |
| | Auto | Exterior Advertisement | 50-2000 | 30*30 | 50*150 | ≥ 25 | ≤ 1016 | |
| | MM | Electronic Posters | 50-2000 | 100*200 | 200*400 | ≥ 25 | ≤ 1016 | |
| | MM | Cinema | 3000-50000 | 500*300 | 800*2000 | ≤ 10 | ≥ 2540 | |

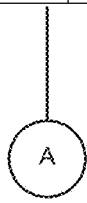

FIG. 3B

| | | | | | | | |
|---|---|---|---|---|---|---|---|
| Transparent Direct Emitter Display | Auto | Rear View Mirror | 25 – 70 | 15*10 | 30*15 | ≥ 250 | ≤ 102 | mid res |
| | Auto | Vanity Mirror | 25 – 70 | 7*4 | 90*90 | ≥ 250 | ≤ 102 | |
| | Auto | Side View Mirror | 40 – 70 | 12*8 | 20*15 | ≥ 200 | ≤ 127 | |
| | Auto | Side Window status indicators | 40 – 70 | 2*2 | 15*3 | ≥ 200 | ≤ 127 | |
| | Auto | Stacked Display (3D Cluster) | 40 – 70 | 20*10 | 180*30 | ≥ 200 | ≤ 127 | |
| | Auto | Panorama Roof Display | 20 – 40 | 70*40 | 200*180 | ≥ 50 | ≤ 508 | low res |
| | MM | Advertisement | 50-2000 | 100*200 | 200*400 | ≥ 25 | ≤ 1016 | very low res |
| | Auto | Rear/Side Window Display (Outside Communication, Rear Light, Turn Indicator) | 200 – 1000 | 20*20 | 180*150 | ≥ 10 | ≤ 2540 | |
| | Auto | CHMSL (Center High Mounted Stop Light) | 200 – ...... | 20*10 | 180*15 | ≥ 10 | ≤ 2540 | |
| | Auto | Peripheral Display (e.g. Wind Shield, Side Windows, etc...) | 40 – 70 | 5*5 | 180*15 | ≥ 10 | ≤ 2540 | |
| | Auto | Wind Shield Display for Autonomous Communication (Full Size) | 200 – 1000 | 3*50 | 180*150 | ≥ 10 | ≤ 2540 | |

FIG. 3B

μ-LED, μ-LED DEVICE, DISPLAY AND METHOD FOR THE SAME

This patent application claims the priorities of the German applications DE 10 2019 116 313.7 of 14 Jun. 2019, DE 10 2019 118 251.4 of 5 Jul. 2019, DE 10 2019 112 616.9 of 14 May 2019, DE 10 2019 110 499.8 of 23 Apr. 2019, DE 10 2019 112 639.8 of 14 May 2019, DE 10 2019 115 991.1 of 12 Jun. 2019, as well as the priority of the Danish application DK PA201970059 of 29 Jan. 2019, the disclosure of which are incorporated herein by way of reference. Finally, this application also claims priority from the PCT application PCT/EP2020/052191 of 29 Jan. 2020. The disclosure of PCT/EP2020/052191 is incorporated herein by reference in its entirety.

BACKGROUND

The ongoing current developments within the Internet of Things and the field of communication have opened the door for various new applications and concepts. For development, service and manufacturing purposes, these concepts and applications offer increased effectiveness and efficiency.

One aspect of new concepts is based on augmented or virtual reality. A general definition of "augmented reality" is given by an "interactive experience of the real environment, whereby the objects from it, which are in the real world, are augmented by computer generated perceptible information".

The information is mostly transported by visualization, but is not limited to visual perception. Sometimes haptic or other sensory perceptions can be used to expand reality. In the case of visualization, the superimposed sensory-visual information can be constructive, i.e. additional to the natural environment, or it can be destructive, for example by obscuring parts of the natural environment. In some applications, it is also possible to interact with the superimposed sensory information in one way or another. In this way, augmented reality reinforces the ongoing perception of the user of the real environment.

In contrast, "virtual reality" completely replaces the real environment of the user with an environment that is completely simulated. In other words, while in an augmented reality environment the user is able to perceive the real world at least partially, in a virtual reality the environment is completely simulated and may differ significantly from reality.

Augmented Reality can be used to improve natural environmental situations, enriching the user's experience or supporting the user in performing certain tasks. For example, a user may use a display with augmented reality features to assist him in performing certain tasks. Because information about a real object is superimposed to provide clues to the user, the user is supported with additional information, allowing the user to act more quickly, safely and effectively during manufacturing, repair or other services. In the medical field, augmented reality can be used to guide and support the doctor in diagnosing and treating the patient. In development, an engineer may experience the results of his experiments directly and can therefore evaluate the results more easily. In the tourism or event industry, augmented reality can provide a user with additional information about sights, history, and the like. Augmented Reality can support the learning of activities or tasks.

SUMMARY

In the following summary different aspects for μ-displays in the automotive and augmented reality applications are explained. This includes devices, displays, controls, process engineering methods and other aspects suitable for augmented reality and automotive applications. This includes aspects which are directed to light generation by means of displays, indicators or similar. In addition, control circuits, power supplies and aspects of light extraction, light guidance and focusing as well as applications of such devices are listed and explained by means of various examples.

Because of the various limitations and challenges posed by the small size of the light-generating components, a combination of the various aspects is not only advantageous, but often necessary. For ease of reference, this disclosure is divided into several sections with similar topics. However, this should explicitly not be understood to mean that features from one topic can not be combined with others. Rather, aspects from different topics should be combined to create a display for augmented reality or other applications or even in the automotive sector.

For considerations of the following solutions, some terms and expressions should be explained in order to define a common and equal understanding. The terms listed are generally used with this understanding in this document. In individual cases, however, there may be deviations from the interpretation, whereby such deviation will be specifically referred to.

"Active Matrix Display"

The term "active matrix display" was originally used for liquid crystal displays containing a matrix of thin film transistors that drive LCD pixels. Each individual pixel has a circuit with active components (usually transistors) and power supply connections. At present, however, this technology should not be limited to liquid crystals, but should also be used in particular for driving μ-LEDs or μ-displays.

"Active Matrix Carrier Substrate"

"Active matrix carrier substrate" or "active matrix backplane" means a drive for light emitting diodes of a display with thin-film transistor circuits. The circuits may be integrated into the backplane or mounted on it. The "active matrix carrier substrate" has one or more interface contacts, which form an electrical connection to a μ-LED display structure. An "active-matrix carrier substrate" can thus be part of an active-matrix display or support it.

"Active Layer"

The active layer is referred to as the layer in an optoelectronic component or light emitting diode in which charge carriers recombine. In its simplest form, the active layer can be characterized by a region of two adjacent semiconductor layers of different conductivity type. More complex active layers comprise quantum wells (see there), multi-quantum wells or other structures that have additional properties. Similarly, the structure and material systems can be used to adjust the band gap (see there) in the active layer, which determines the wavelength and thus the color of the light.

"Alvarez Lens Array"

With the use of Alvarez lens pairs, a beam path can be adapted to video eyewear. An adjustment optic comprises an Alvarez lens arrangement, in particular a rotatable version with a Moire lens arrangement. Here, the beam deflection is determined by the first derivative of the respective phase plate relief, which is approximated, for example, by $z=ax2+by2+cx+dy+e$ for the transmission direction z and the transverse directions x and y, and by the offset of the two phase plates arranged in pairs in the transverse directions x and y. For further design alternatives, swiveling prisms are provided in the adjustment optics.

"Augmented Reality (AR)"

This is an interactive experience of the real environment, where the subject of the picking up is located in the real world and is enhanced by computer-generated perceptible information. Extended reality is the computer-aided extension of the perception of reality by means of this computer-generated perceptible information. The information can address all human sensory modalities. Often, however, augmented reality is only understood to be the visual representation of information, i.e. the supplementation of images or videos with computer-generated additional information or virtual objects by means of fade-in/overlay. Applications and explanations of the mode of operation of Augmented Reality can be found in the introduction and in the following in execution examples.

"Automotive."

Automotive generally refers to the motor vehicle or automobile industry. This term should therefore cover this branch, but also all other branches of industry which include µ-displays or generally light displays—with very high resolution and µ-LEDs.

"Bandgap"

Bandgap, also known as band gap or forbidden zone, is the energetic distance between the valence band and conduction band of a solid-state body. Its electrical and optical properties are largely determined by the size of the band gap. The size of the band gap is usually specified in electron volts (eV). The band gap is thus also used to differentiate between metals, semiconductors and insulators. The band gap can be adapted, i.e. changed, by various measures such as spatial doping, deforming of the crystal lattice structure or by changing the material systems. Material systems with so-called direct band gap, i.e. where the maximum of the valence band and a minimum of the conduction band in the pulse space are superimposed, allow a recombination of electron-hole pairs under emission of light.

"Bragg Grid"

Fibre Bragg gratings are special optical interference filters inscribed in optical fibres. Wavelengths that lie within the filter bandwidth around AB are reflected. In the fiber core of an optical waveguide, a periodic modulation of the refractive index is generated by means of various methods. This creates areas with high and low refractive indexes that reflect light of a certain wavelength (bandstop). The center wavelength of the filter bandwidth in single-mode fibers results from the Bragg condition.

"Directionality"

Directionality is the term used to describe the radiation pattern of a µ-LED or other light-emitting device. A high directionality corresponds to a high directional radiation, or a small radiation cone. In general, the aim should be to obtain a high directional radiation so that crosstalk of light into adjacent pixels is avoided as far as possible. Accordingly, the light-emitting component has a different brightness depending on the viewing angle and thus differs from a Lambert emitter.

The directionality can be changed by mechanical measures or other measures, for example on the side intended for the emission. In addition to lenses and the like, this includes photonic crystals or pillar structures (columnar structures) arranged on the emitting surface of a pixelated array or on an arrangement of, in particular, µ-LEDs. These generate a virtual band gap that reduces or prevents the propagation of a light vector along the emitting surface.

"Far Field"

The terms near field and far field describe spatial areas around a component emitting an electromagnetic wave, which differ in their characterization. Usually the space regions are divided into three areas: reactive near field, transition field and far field. In the far field, the electromagnetic wave propagates as a plane wave independent of the radiating element.

"Fly Screen Effect"

The Screen Door Effect (SDE) is a permanently visible image artefact in digital video projectors. The term fly screen effect describes the unwanted black space between the individual pixels or their projected information, which is caused by technical reasons, and takes the form of a fly screen. This distance is due to the construction, because between the individual LCD segments run the conductor paths for control, where light is swallowed and therefore cannot hit the screen. If small optoelectronic lighting devices and especially µ-LEDs are used or if the distance between individual light emitting diodes is too great, the resulting low packing density leads to possibly visible differences between pointy illuminated and dark areas when viewing a single pixel area. This so-called fly screen effect (screen door effect) is particularly noticeable at a short viewing distance and thus especially in applications such as VR glasses. Sub-pixel structures are usually perceived and perceived as disturbing when the illumination difference within a pixel continues periodically across the matrix arrangement. Accordingly, the fly screen effect in automotive and augmented reality applications should be avoided as far as possible.

"Flip Chip"

Flip-chip assembly is a process of assembly and connection technology for contacting unpackaged semiconductor chips by means of contact bumps, or short "bumps". In flip-chip mounting, the chip is mounted directly, without any further connecting wires, with the active contacting side down—towards the substrate/circuit carrier—via the bumps. This results in particularly small package dimensions and short conductor lengths. A flip-chip is thus in particular an electronic semiconductor component contacted on its rear side. The mounting may also require special transfer techniques, for example using an auxiliary carrier. The radiation direction of a flip chip is then usually the side opposite the contact surfaces.

"Flip-Flop"

A flip-flop, often called a bi-stable flip-flop or bi-stable flip-flop element, is an electronic circuit that has two stable states of the output signal. The current state depends not only on the input signals present at the moment, but also on the state that existed prior to the time under consideration. A dependence on time does not exist, but only on events. Due to the bi-stability, the flip-flop can store a data quantity of a single bit for an unlimited time. In contrast to other types of storage, however, power supply must be permanently guaranteed.

The flip-flop, as the basic component of sequential circuits, is an indispensable component of digital technology and thus a fundamental component of many electronic circuits, from quartz watches to microprocessors. In particular, as an elementary one-bit memory, it is the basic element of static memory components for computers. Some designs can use different types of flip-flops or other buffer circuits to store state information. Their respective input and output signals are digital, i.e. they alternate between logical "false" and logical "true". These values are also known as "low" 0 and "high" 1.

"Head-Up Display"

The head-up display is a display system or projection device that allows users to maintain their head position or viewing direction by projecting information into their field of vision. The Head-up Display is an augmented reality system. In some cases, a Head-Up Display has a sensor to determine the direction of vision or orientation in space.

"Horizontal Light Emitting Diode"

With horizontal LEDs, the electrical connections are on a common side of the LED. This is often the back of the LED facing away from the light emission surface. Horizontal LEDs therefore have contacts that are only formed on one surface side.

"Interference Filter"

Interference filters are optical components that use the effect of interference to filter light according to frequency, i.e. color for visible light.

"Collimation"

In optics, collimation refers to the parallel direction of divergent light beams. The corresponding lens is called collimator or convergent lens. A collimated light beam contains a large proportion of parallel rays and is therefore minimally spread when it spreads. A use in this sense refers to the spreading of light emitted by a source. A collimated beam emitted from a surface has a strong dependence on the angle of radiation. In other words, the radiance (power per unit of a fixed angle per unit of projected source area) of a collimated light source changes with increasing angle. Light can be collimated by a number of methods, for example by using a special lens placed in front of the light source. Consequently, collimated light can also be considered as light with a very high directional dependence.

"Converter Material"

Converter material is a material, which is suitable for converting light of a first wavelength into a second wavelength. The first wavelength is shorter than the second wavelength. This includes various stable inorganic as well as organic dyes and quantum dots. The converter material can be applied and structured in various processes.

"Lambert Lamps"

For many applications, a so-called Lambertian radiation pattern is required. This means that a light-emitting surface ideally has a uniform radiation density over its area, resulting in a vertically circular distribution of radiant intensity. Since the human eye only evaluates the luminance (luminance is the photometric equivalent of radiance), such a Lambertian material appears to be equally bright regardless of the direction of observation. Especially for curved and flexible display surfaces, this uniform, angle-independent brightness can be an important quality factor that is sometimes difficult to achieve with currently available displays due to their design and LED technology.

LEDs and µ-LEDs resemble a Lambert spotlight and emit light in a large spatial angle. Depending on the application, further measures are taken to improve the radiation characteristics or to achieve greater directionality (see there).

"Conductivity Type"

The term "conductivity type" refers to the majority of (n- or p-) charge carriers in a given semiconductor material. In other words, a semiconductor material that is n-doped is considered to be of n-type conductivity. Accordingly, if a semiconductor material is n-type, then it is n-doped. The term "active" region in a semiconductor refers to a border region in a semiconductor between an n-doped layer and a p-doped layer. In this region, a radiative recombination of p- and n-type charge carriers takes place. In some designs, the active region is still structured and includes, for example, quantum well or quantum dot structures.

"Light Field Display"

Virtual retinal display (VNA) or light field display is referred to a display technology that draws a raster image directly onto the retina of the eye. The user gets the impression of a screen floating in front of him. A light field display can be provided in the form of glasses, whereby a raster image is projected directly onto the retina of a user's eye. In the virtual retina display, a direct retinal projection creates an image within the user's eye. The light field display is an augmented reality system.

"Lithography" or "Photolithography"

Photolithography is one of the central methods of semiconductor and microsystem technology for the production of integrated circuits and other products. The image of a photomask is transferred onto a photosensitive photoresist by means of exposure. Afterwards, the exposed areas of the photoresist are dissolved (alternatively, the unexposed areas can be dissolved if the photoresist is cured under light). This creates a lithographic mask that allows further processing by chemical and physical processes, such as applying material to the open areas or etching depressions in the open areas. Later, the remaining photoresist can also be removed.

"µ-LED"

A µ-LED is an optoelectronic component whose edge lengths are less than 70 µm, especially down to less than 20 µm, especially in the range of 1 µm to 10 µm. Another range is between 10 to 30 µm. This results in an area of a few hundred µm$^2$ down to several tens of µm$^2$. For example, a µ-LED can comprise an area of about 60 µm$^2$ with an edge length of about 8 µm. In some cases, a µ-LED has an edge length of 5 µm or less, resulting in a size of less than 30 µm$^2$. Typical heights of such µ-LEDs are, for example, in the range of 1.5 µm to 10 µm.

In addition to classic lighting applications, displays are the main applications for µ-LEDs. The µ-LEDs form pixels or subpixels and emit light of a defined color. Due to their small pixel size and high density with a small pitch, µ-LEDs are suitable for small monolithic displays for AR applications, among other things.

Due to the above-mentioned very small size of a µ-LED, the production and processing is significantly more difficult compared to previous larger LEDs. The same applies to additional elements such as contacts, package, lenses etc. Some aspects that can be realized with larger optoelectronic components cannot be produced with µ-LEDs or only in a different way. In this respect, a µ-LED is therefore significantly different from a conventional LED, i.e. a light emitting device with an edge length of 200 µm or more.

"µ-LED Array"

See at µ-Display

"µ-Display"

A µ-display or µ-LED array is a matrix with a plurality of pixels arranged in defined rows and columns. With regard to its functionality, a µ-LED array often forms a matrix of µ-LEDs of the same type and color. Therefore, it rather provides a lighting surface. The purpose of a µ-display, on the other hand, is to transmit information, which often results in the demand for different colors or an addressable control for each individual pixel or subpixel. A µ-display can be made up of several µ-LED arrays, which are arranged together on a backplane or other carrier. Likewise, a µ-LED array can also form a µ-Display.

The size of each pixel is in the order of a few µm, similar to µ-LEDs. Consequently, the overall dimension of a p display with 1920*1080 pixels with a µ-LED size of 5 µm per pixel and directly adjacent pixels is in the order of a few 10 mm². In other words, a μ-display or μ-LED array is a small-sized arrangement, which is realized by means of μ-LEDs.

μ-displays or μ-LED arrays can be formed from the same, i.e. from one work piece. The μ-LEDs of the μ-LED array can be monolithic. Such μ-displays or μ-LED arrays are called monolithic μ-LED arrays or μ-displays.

Alternatively, both assemblies can be formed by growing μ-LEDs individually on a substrate and then arranging them individually or in groups on a carrier at a desired distance from each other using a so-called Pick & Place process. Such μ-displays or μ-LED arrays are called non-monolithic. For non-monolithic μ-displays or μ-LED arrays, other distances between individual μ-LEDs are also possible. These distances can be chosen flexibly depending on the application and design. Thus, such μ-displays or μ-LED arrays can also be called pitch-expanded. In the case of pitch-expanded μ-displays or μ-LED arrays, this means that the μ-LEDs are arranged at a greater distance than on the growth substrate when transferred to a carrier. In a non-monolithic μ-display or μ-LED array, each individual pixel can comprise a blue light-emitting μ-LED and a green light-emitting μ-LED as well as a red light-emitting μ-LED.

To take advantage of different advantages of monolithic μ-LED arrays and non-monolithic μ-LED arrays in a single module, monolithic μ-LED arrays can be combined with non-monolithic μ-LED arrays in a μ-display. Thus, μ-displays can be used to realize different functions or applications. Such a display is called a hybrid display.

"μ-LED Nano Column"

A μ-LED nano column is generally a stack of semiconductor layers with an active layer, thus forming a μ-LED. The μ-LED nano column has an edge length smaller than the height of the column. For example, the edge length of a μ-LED nanopillar is approximately 10 nm to 300 nm, while the height of the device can be in the range of 200 nm to 1 μm or more.

"μ-Rod"

μ-rod or Rod designates in particular a geometric structure, in particular a rod or bar or generally a longitudinally extending, for example cylindrical, structure. μ-rods are produced with spatial dimensions in the μm to nanometer range. Thus, nanorods are also included here.

"Nanorods"

In nanotechnology, nanorods are a design of nanoscale objects. Each of their dimensions is in the range of about 10 nm to 500 nm. They may be synthesized from metal or semiconducting materials. Aspect ratios (length divided by width) are 3 to 5. Nanorods are produced by direct chemical synthesis. A combination of ligands acts as a shape control agent and attaches to different facets of the nanorod with different strengths. This allows different shapes of the nanorod with different growth rates to produce an elongated object. μLED nanopillars are such nanorods.

"Miniature LED"

Their dimensions range from 100 μm to 750 μm, especially in the range larger than 150 μm.

"Moiré Effect" and "Moiré Lens Arrangement"

The moiré effect refers to an apparent coarse raster that is created by overlaying regular, finer rasters. The resulting pattern, whose appearance is similar to patterns resulting from interference, is a special case of the aliasing effect by subsampling. In the field of signal analysis, aliasing effects are errors that occur when the signal to be sampled contains frequency components that are higher than half the sampling frequency. In image processing and computer graphics, aliasing effects occur when images are scanned and result in patterns that are not included in the original image. A moire lens array is a special case of an Alvarez lens array.

"Monolithic Construction Element"

A monolithic construction element is a construction element made of one piece. A typical such device is for example a monolithic pixel array, where the array is made of one piece and the μ-LEDs of the array are manufactured together on one carrier.

"Optical Mode"

A mode is the description of certain temporally stationary properties of a wave. The wave is described as the sum of different modes. The modes differ in the spatial distribution of the intensity. The shape of the modes is determined by the boundary conditions under which the wave propagates. The analysis according to vibration modes can be applied to both standing and continuous waves. For electromagnetic waves, such as light, laser and radio waves, the following types of modes are distinguished: TEM or transverse electromagnetic mode, TE or H modes, TM or E modes. TEM or transverse electromagnetic mode: Both the electric and the magnetic field components are always perpendicular to the direction of propagation. This mode is only propagation-capable if either two conductors (equipotential surfaces) insulated from each other are available, for example in a coaxial cable, or no electrical conductor is available, for example in gas lasers or optical fibers. TE or H modes: Only the electric field component is perpendicular to the direction of propagation, while the magnetic field component is in the direction of propagation. TM or E modes: Only the magnetic field component is perpendicular to the propagation direction, while the electric field component points in the propagation direction.

"Optoelectronic Device"

An optoelectronic component is a semiconductor body that generates light by recombination of charge carriers during operation and emits it. The light generated can range from the infrared to the ultraviolet range, with the wavelength depending on various parameters, including the material system used and doping. An optoelectronic component is also called a light emitting diode.

For the purpose of this disclosure, the term optoelectronic device or also light-emitting device is used synonymously. A μ-LED (see there) is thus a special optoelectronic device with regard to its geometry. In displays, optoelectronic components are usually monolithic or as individual components placed on a matrix.

"Passive Matrix Backplane" or "Passive Matrix Carrier Substrate"

A passive matrix display is a matrix display, in which the individual pixels are driven passively (without additional electronic components in the individual pixels). A light emitting diode of a display can be controlled by means of IC circuits. In contrast, displays with active pixels driven by transistors are referred to as active matrix displays. A passive matrix carrier substrate is part of a passive matrix display and carries it.

"Photonic Crystal" or "Photonic Structure"

A photonic structure can be a photonic crystal, a quasi-periodic or deterministically aperiodic photonic structure. The photonic structure generates a band structure for photons by a periodic variation of the optical refractive index. This band structure can comprise a band gap in a certain frequency range. As a result, photons cannot propagate through the photonic structure in all spatial directions. In particular, propagation parallel to a surface is often blocked, but perpendicular to it is possible. In this way, the photonic structure or the photonic crystal determines a propagation in a certain direction. It blocks or reduces this in one direction and thus generates a beam or a bundle of rays of radiation directed as required into the room or radiation area provided for this purpose.

Photonic crystals are photonic structures occurring or created in transparent solids. Photonic crystals are not necessarily crystalline—their name derives from analogous diffraction and reflection effects of X-rays in crystals due to their lattice constants. The structure dimensions are equal to or greater than a quarter of the corresponding wavelength of the photons, i.e. they are in the range of fractions of a μm to several μm. They are produced by classical lithography or also by self-organizing processes.

Similar or the same property of a photonic crystal can alternatively be produced with non-periodic but nevertheless ordered structures. Such structures are especially quasiperiodic structures or deterministically aperiodic structures. These can be for example spiral photonic arrangements.

In particular, so-called two-dimensional photonic crystals are mentioned here as examples, which exhibit a periodic variation of the optical refractive index in two mutually perpendicular spatial directions, especially in two spatial directions parallel to the light-emitting surface and perpendicular to each other.

However, there are also one-dimensional photonic structures, especially one-dimensional photonic crystals. A one-dimensional photonic crystal exhibits a periodic variation of the refractive index along one direction. This direction can be parallel to the light exit plane. Due to the one-dimensional structure, a beam can be formed in a first spatial direction. Thereby a photonic effect can be achieved already with a few periods in the photonic structure. For example, the photonic structure can be designed in such a way that the electromagnetic radiation is at least approximately collimated with respect to the first spatial direction. Thus, a collimated beam can be generated at least with respect to the first direction in space.

"Pixel"

Pixel, pixel, image cell or picture element refers to the individual color values of a digital raster graphic as well as the area elements required to capture or display a color value in an image sensor or screen with raster control. A pixel is thus an addressable element in a display device and comprises at least one light-emitting device. A pixel has a certain size and adjacent pixels are separated by a defined distance or pixel space. In displays, especially μ-displays, often three (or in case of additional redundancy several) subpixels of different color are combined to one pixel.

"Planar Array"

A planar array is an essentially flat surface. It is often smooth and without protruding structures. Roughness of the surface is usually not desired and does not have the desired functionality. A planar array is for example a monolithic, planar array with several optoelectronic components.

"Pulse Width Modulation"

Pulse width modulation or PWM is a type of modulation for driving a component, in particular a μ-LED. Here the PWM signal controls a switch that is configured to switch a current through the respective μ-LED on and off so that the μ-LED either emits light or does not emit light. With the PWM, the output provides a square wave signal with a fixed frequency f. The relative quantity of the switch-on time compared to the switch-off time during each period T (=1/f) determines the brightness of the light emitted by the μ-LED. The longer the switch-on time, the brighter the light.

"Quantum Well"

A quantum well or quantum well refers to a potential in a band structure in one or more semiconductor materials that restricts the freedom of movement of a particle in a spatial dimension (usually in the z-direction). As a result, only one planar region (x, y plane) can be occupied by charge carriers. The width of the quantum well significantly determines the quantum mechanical states that the particles can assume and leads to the formation of energy levels (sub-bands), i.e. the particle can only assume discrete (potential) energy values.

"Recombination"

In general, a distinction is made between radiative and non-radiative recombination. In the latter case, a photon is generated which can leave a component. A non-radiative recombination leads to the generation of phonons, which heat a component. The ratio of radiative to non-radiative recombination is a relevant parameter and depends, among other things, on the size of the component. In general, the smaller the component, the smaller the ratio and non-radiative recombination increases in relation to radiative recombination.

"Refresh Time"

Refresh time is the time after which a cell of a display or similar must be rewritten so that it either does not lose the information or the refresh is predetermined by external circumstances.

"Die" or "Light-emitting body"

A light-emitting body or also a die is a semiconductor structure which is separated from a wafer after production on a wafer and which is suitable for generating light after an electrical contact during operation. In this context, a die is a semiconductor structure, which contains an active layer for light generation. The die is usually separated after contacting, but can also be processed further in the form of arrays.

"Slot Antenna"

A slot antenna is a special type of antenna in which instead of surrounding a metallic structure in space with air (as a nonconductor), an interruption of a metallic structure (e.g. a metal plate, a waveguide, etc.) is provided. This interruption causes an emission of an electromagnetic wave whose wavelength depends on the geometry of the interruption. The interruption often follows the principle of the dipole, but can theoretically have any other geometry. A slot antenna thus comprises a metallic structure with a cavity resonator having a length of the order of magnitude of wavelengths of visible light. The metallic structure can be located in or surrounded by an insulating material. Usually, the metallic structure is earthed to set a certain potential.

"Field of Vision"

Field of view (FOV) refers to the area in the field of view of an optical device, a sun sensor, the image area of a camera (film or picking up sensor) or a transparent display within which events or changes can be perceived and recorded. In particular, a field of view is an area that can be seen by a human being without movement of the eyes. With reference to augmented reality and an apparent object placed in front of the eye, the field of view comprises the area indicated as a number of degrees of the angle of vision during stable fixation of the eye.

"Subpixels"

A subpixel (approximately "subpixel") describes the inner structure of a pixel. In general, the term subpixel is associated with a higher resolution than can be expected from a single pixel. A pixel can also consist of several smaller subpixels, each of which radiates a single color. The overall color impression of a pixel is created by mixing the individual subpixels. A subpixel is thus the smallest addressable unit in a display device. A subpixel also comprises a certain size that is smaller than the size of the pixel to which the subpixel is assigned.

"Vertical Light Emitting Diode"

In contrast to the horizontal LED, a vertical LED comprises one electrical connection on the front and one on the back of the LED. One of the two sides also forms the light emission surface. Vertical LEDs thus comprise contacts that are formed towards two opposite main surface sides. Accordingly, it is necessary to deposit an electrically conductive but transparent material so that on the one hand, electrical contact is ensured and on the other hand, light can pass through.

"Virtual Reality"

Virtual reality, or VR for short, is the representation and simultaneous perception of reality and its physical properties in a real-time computer-generated, interactive virtual environment. A virtual reality can completely replace the real environment of an operator with a fully simulated environment.

In addition to the structure of a μ-LED and various methods for its manufacture, the following aspects of light extraction may be useful for the realization of the various embodiments and applications concerning augmented reality described herein and in the PCT application PCT/EP2020/052191 incorporated herein by reference.

In one aspect a rear decoupling can be provided. For this purpose, a semiconductor layer stack with a first doped and a second doped layer is provided, which is arranged on a substrate. The area of the substrate facing away from the layer stack is designed for light extraction. The layer stack comprises an active region which is arranged between the first doped and the second doped layer. The layer stack is provided with a reflective contact on the surface facing away from the substrate. The reflective contact extends isolated from the doped layers along a side surface to the substrate surface. The shape of this reflective contact is spherical or paraboloidal or ellipsoidal to direct the light generated in the active layer towards the substrate. The substrate is either very thin or transparent. Further light shaping and/or outcoupling measures can be provided on the area of the substrate facing away from the layer stack.

In the previous aspects of improving light extraction, the focus was on the directionality of the emitted light, among other things. For many applications, however, a Lambertian radiation characteristic is required. This means that a light-emitting surface ideally has a uniform radiation density over its area, resulting in a vertically circular distribution of radiant intensity. For a user, this surface then appears equally bright from different viewing angles. In addition, such a uniform distribution can be more easily reshaped by light-shaping elements arranged downstream.

It is therefore proposed that an optical pixel element for generating a pixel of a display should comprise of a flat carrier substrate and at least one μ-LED with rear output. The PLED forms an optical emitter chip. A flat carrier substrate is understood to be, for example, a silicon wafer, semiconductor materials such as LTPS or IGZO, insulation material or similar suitable flat carrier structure, which can accommodate a large number of μ-LEDs arranged next to each other on its surface.

The function of such a carrier substrate is, among other things, the accommodation of functional elements such as ICs, electronics, power sources for the μ-LEDs, electrical contacts, lines and connections, but also, in particular, the accommodation of the light-emitting μ-LEDs. The carrier substrate can be rigid or flexible. Typical dimensions of a carrier substrate can, for example, be 0.5-1.1 mm thick. Polyimide substrates with thicknesses in the range of 15 μm are also known.

The at least one μ-LED is arranged on one side of the carrier substrate. In other words, the carrier substrate has two opposite main surfaces, which are referred to here as the assembly side and the display side. The assembly side is the surface of the carrier substrate, often also referred to as the top side, which accommodates the at least one μ-LED and which may further comprise optical or electrical and mechanical components or layers.

The display side should describe the side of the carrier substrate facing a user and on which the pixels for display should be perceived. In addition, a carrier substrate plane is described, which extends parallel to the two main surfaces of the carrier substrate in the same plane. The at least one μ-LED is configured to emit light transverse to the carrier substrate plane in a direction away from the carrier substrate. However, this property should not exclude that light components are also emitted directly or indirectly in the direction of the mounting side of the carrier substrate.

A flat reflector element is provided on the pixel element. This is based on the idea that a more uniform spatial distribution of the light over the surface of the pixel element can be achieved by reflection. For this purpose, the reflector element is spatially arranged on the assembly side relative to the at least one μ-LED and configured with regard to its shape and composition in such a way that light emitted by the at least one μ-LED is reflected in the direction of the carrier substrate.

In other words, the reflector element is placed in an area around the at least one μ-LED through which the emitted light of the μ-LED passes. This reflector element can, according to an example, be a separate prefabricated microelement that is separately applied. Typical dimensions of such a reflector element can range from 10 μm to 300 μm in diameter, depending on the design variant also in particular between 10 μm and 100 μm. According to an aspect, the reflector element is configured as a reflective coating or layer of at least one μ-LED. According to an example, the at least one μ-LED can have a transparent or partially transparent coating such as IGZO on its surface, to which a reflective layer is then applied.

The reflective layer can, for example, be metallic or contain a metal in a mixture of substances. The aim here is that as much of the light emitted by the at least one μ-LED as possible is reflected in order to achieve a high yield. The carrier substrate is configured to be at least partially transparent so that light reflected by the reflector element strikes the surface of the mounting side of the carrier substrate and propagates through the carrier substrate. This light emerges at least partially on the opposite display side of the carrier substrate and can thus be perceived as a pixel by the viewer.

In other words, the emitted light is decoupled at the back or rear of the opposite display side of the carrier substrate. The reflection effects, refraction effects and, if necessary, damping effects can thus be used to achieve advantageous more uniform illumination and a more homogeneous distribution of luminous intensity. According to an example, the reflector element is arranged and configured in such a way that a Lambertian radiation characteristic is achieved.

In one aspect, the reflector element has a diffuser layer on its side facing the at least one μ-LED. This is intended in particular to scatter the light reflected by the at least one μ-LED. Alternatively or additionally, a reflector material comprises diffuser particles. By diffusion is meant here that a further scattering or distribution of the light in a surrounding spatial area should be achieved. This can also have a beneficial effect on the scattering or distribution of light and thus achieve a more uniform or homogeneous distribution of the light intensity, especially on the display side of the carrier substrate.

A diffuser layer can be understood as an additional layer on the reflector element, which can be either uniform throughout, but also interrupted or only partially applied. In one aspect, the diffuser layer and/or the diffuser particles have $Al_2O_2$ and/or $TiO_2$. These materials can support a diffusion of the emitted light due to their structural properties. While a diffuser layer can only be applied to the surface of the reflector, diffuser particles can, for example, be part of a mixture of materials of the entire reflector and thus be easier to manufacture.

According to an aspect, the reflector element surrounds roundly, polygon-like or parabolically the at least one μ-LED. The underlying consideration can be seen in the fact that in many cases the at least one μ-LED has a spatially wide radiation pattern. This means that light is emitted in a wide angular range starting from a small area. It is desirable that as much of this emitted light as possible is captured by the reflector element and deflected or reflected towards the display side of the carrier substrate. In this context, it may also be provided, for example, that the at least one μ-LED comprises a first and a second μ-LED provided for redundancy. This can take over the function of the first μ-LED in the event of production-related failure of the first μ-LED. Control and manufacturing techniques are disclosed in this notification. The reflector element, which surrounds both μ-LEDs thus ensures uniform radiation regardless of which of the two μ-LEDs is activated during operation. In another aspect, the reflector element surrounds at least three individual μ-LEDs, which emit different colors during operation. This means that a reflector element can be provided for each pixel of a μ-display.

Depending on the radiation pattern of the at least one μ-LED, according to an example, arc-shaped, round, dome-like, cap-like or similar shapes of the reflector element are conceivable. The reflector element can, also according to an example, be made in one or more parts or be provided with recesses or interruptions. According to another example, the reflector element has different reflection properties depending on the wavelength of the light. This can be achieved, for example, by microstructures on the reflector element or its structural composition.

According to an example, the reflector element is configured as a flat surface which is arranged perpendicular to the carrier substrate plane above the at least one μ-LED. According to an aspect, the reflector element forms an electrical contact of the at least one μ-LED. The consideration here is that due to the metallic design of the reflector element, for example, a simultaneous use as a connecting contact for the μ-LED can be considered. For this purpose, an electrical contact with one of the μ-LED connections must be provided according to an example.

According to an aspect, the reflector element is configured and shaped in such a way that at least 90% of the light emitted by at least one μ-LED impinges on the assembly side of the carrier substrate at an angle of 45°-90° relative to the carrier substrate plane. According to an example, this proportion is at least 95%, according to another example at least 80%. The underlying idea is the need for the highest possible yield. This means that as much of the light emitted by at least one μ-LED as possible should be emitted on the display side of the carrier substrate.

One effect that can occur with flat transparent or partially transparent substrates is total reflection. This means that light hitting the surface of the placement side at an acute angle is refracted when entering the denser medium of the carrier substrate. As a result, the light is reflected multiple times within the carrier substrate between the placement side and the display side and does not exit the carrier substrate because of the too acute angles to the interfaces. These proportions are usually to be considered as losses. In order to avoid these losses, it may be desirable for the light to strike the surface of the placement side of the carrier substrate at the greatest possible angle, ideally perpendicularly. Accordingly, the reflector element is configured to create these angular relationships and in particular to reduce crosstalk between the pixel elements. In one aspect, the carrier substrate comprises polyimide or glass. Polyimide is a material that can be used especially for flexible displays. Glass can serve as a mechanically very stable base material for rigid displays.

According to an aspect, a passivation layer is additionally provided to attenuate or eliminate reflections at mesa edges of the at least one μ-LED. A mesa edge is defined as a wall or contour that generally slopes steeply to form the boundary of the at least one μ-LED. This is arranged with its surface transverse to the carrier substrate plane. To avoid crosstalk, it is desirable that no light passes over in the direction of the respective adjacent pixel element. For this purpose, light components that emerge in this direction should be eliminated or at least attenuated by an appropriate damping layer or passivation layer. The advantage here can be better contrast and reduction of optical crosstalk.

According to an aspect, a light-absorbing coating is provided on the assembly side and/or the display side of the carrier substrate outside the reflector element. It can be considered desirable that the non-active areas between the μ-LEDs, especially between different pixels, are opaque or attenuate light in order to improve contrast and darker impression. The light-absorbing coating is therefore placed outside the reflector element. According to an aspect, the display side of the carrier substrate has a roughened or uneven and/or roughened structure. This structure is such that it causes scattering or diffusion effects for the wavelength of the relevant light spectrum. This can have the advantage, for example, that a higher proportion of the light transmitted through the carrier substrate can be coupled out at the display side. Due to the rough structure, more favorable microstructural angular relationships are created, which can allow more effective decoupling.

According to an aspect, a color filter element is arranged on the display side of the carrier substrate opposite the reflector element. This color filter element allows a primary color spectrum of the least one μ-LED to pass and attenuates other color spectra. An advantage can be a better color rendering and better contrasts by eliminating light portions of adjacent pixel elements with different colors.

Furthermore, a process for the production of an optical pixel element is proposed. In a first step, at least one μ-LED is attached to a mounting side of a flat carrier substrate. Then a reflector element is produced, for example as a reflective layer of the at least one μ-LED. According to an example, before attaching the at least one μ-LED to the carrier substrate, a display side of the carrier substrate is processed for micro-structuring and/or roughening. An advantage can be seen in the fact that the respective surfaces can be finished before the more sensitive electronic and optical components are applied to the assembly side.

A substantial aspect of light extraction is the ability to suppress unwanted light components. In some applications, a highly directional light is also desired. The µ-LED or pixel should therefore not have a Lambertian characteristic but a high directionality. In some cases, on the other hand, an unconverted portion of the converted light should be blocked or at least deflected in such a way that it does not reduce the visual impression.

Some of these properties can be achieved by providing a photonic structure or photonic crystal on the exit side of the light. In the following, some aspects are described, which illustrate different measures to collimate generated light to reduce the emission angle or otherwise shape it. Besides micro lenses or other measures, these include photonic structures. These change the emission behaviour by creating a "prohibited" area where light emission is not allowed. Accordingly, light emission in one or more directions can be suppressed or promoted.

In some aspects, an optoelectronic device may have a stack of layers with an active region for generating electromagnetic radiation. The device comprises at least one further layer having a photonic crystal structure. At least some of the layers of the layer stack are semiconductor layers. The stack of layers may include a p-doped layer and an n-doped layer, as well as a p-doped and an n-doped Gallium Nitride (GaN) layer forming the active region between the two layers. It should be noted that the layer stack forms a µ-LED, which may have one or more features of this disclosure in terms of geometry, material system, structure or processing.

At least one layer on the stack of layers can have a photonic crystal structure, especially a 2-dimensional structure. The photonic crystal structure can be arranged at least in a portion of the layer and can be formed for example by wire-like or cylindrical structures having a longitudinal direction which is at least substantially parallel to the growth direction of the layer. The structure forming the photonic crystal, such as the wires or cylinders, may comprise a first material, for example the material of the layer, while the space between the structure may be made of or filled with a second material having a different refractive index than the first material. The second material can be air or another substance, for example a conversion material.

The photonic crystal structure can be used to manipulate light generated in the active region as the light passes through the photonic crystal structure. In particular, the photonic crystal structure can be arranged so that light passing along the direction of growth can pass through the photonic crystal structure, while light passing at an angle close to or at 90 degrees with respect to the direction of growth cannot pass through the photonic crystal structure. This is particularly the case for light having wavelengths, which are within a photonic band gap formed by the photonic crystal structure.

In some aspects, the periodicity is at about half of a specific wavelength. This is the wavelength corresponding to the wavelength of electromagnetic radiation that must be diffracted by the photonic crystal structure. Thus, a periodicity in the range of 350 nm to 650 nm is appropriate for operation in the visible region of the spectrum—or even less, depending on the average refractive index. The repeating ranges of different dielectric constants in the photonic crystal structure can therefore be produced in this order of magnitude. In some aspects, an integer multiple of the corresponding wavelength can also be used.

In some embodiments, the layer with the photonic crystal structure is a dielectric layer, which contains or consists of silicon dioxide, $SiO_2$, for example. This can be an additional layer, which is added to the usual layers of a µ-LED. The same fabrication technology can therefore be used for GaN and GaP systems. The different manufacturing variants and possibilities can also be transferred to a converter layer. Thus, a greater bundling or collimation can be achieved compared to standard LEDs without such a structure. Also, the extraction efficiency with a photonic crystal structure applied in one layer is improved compared to a conventional LED without a photonic crystal structure.

In some aspects, the optoelectronic device may comprise one or more mirror layers arranged on top of the layer with the photonic crystal structure. The mirror layer or layers may be arranged to form an angle-selective mirror, for example as a cover layer. The concentration of the emitted light can be further improved. With beam-shaping structures, as given by using a layer with a photonic crystal structure, up to 50% more light can be emitted into a 30 cone or less on the chip plane compared to a standard chip having a roughened surface. Such beam shaping allows high efficiency and low cost in projection applications. For µ-LED or monolithic display applications it may even be a requirement.

The different photonic decoupling structures create a certain roughness and surface structures on the surface, depending on their design. In addition, light emitting diodes often have a structured surface in the past to improve light outcoupling. In contrast, the stamping technology currently used to place µ-LEDs on electrical contacts is only possible for µ-LEDs with planar or flat surfaces.

Therefore a method of making photonic structures on a µ-LED, in which an optical outcoupling structure is created in a surface region of a semiconductor body providing the µ-LED. The surface area with the outcoupling structure is then further processed and planarized. In this way, a planar surface is obtained, but light shaping and outcoupling is still improved by means of the outcoupling structure.

Accordingly, a µ-LED thus contains a decoupling structure, which is arranged in a planar surface area. The output structure can also have light-shaping features, such as the photonic structures revealed here. This allows light to be emitted from a surface perpendicular to it.

In one aspect, the surface region of the semiconductor body is structured by generating a random topology at the surface region. A random topology involves directly roughening the surface of the surface region. Alternatively, a transparent second material, especially $Nb_2O_5$ with a high refractive index can be applied and then roughened.

In another aspect, the surface area is structured by an ordered topology and then planarized according to the explanations revealed here. For this purpose, photonic crystals or non-periodic photonic structures, especially quasi-periodic or deterministic aperiodic photonic structures, are introduced into a second transparent material. Interstitial spaces are filled and then planarized. Filling is done with a transparent third material with a low refractive index, especially smaller than 1.5, especially $SiO_2$.

The planarization is done by mechanical or chemical-mechanical polishing (CMP). This creates a planarized surface with a roughness in the range of less than 20 nanometers, in particular less than 1 nanometer, as the mean roughness value.

As already mentioned, a photonic crystal or other structure can be applied to the µ-LED or µ-LED array to form the beam of an LED or µ-LED. However, in some applications it is common to use non µ-LEDs that emit light of different wavelengths in one operation. Instead, one type of µ-LED is used and its emitted light is then converted. For this purpose, a converter material is applied to the surface of the µ-LED in the main radiation direction. The photonic crystal as light-shaping structure is arranged above the converter material as already revealed in some examples.

In the following, further aspects are explained, which are based on the idea of unification of light shaping and converting structure so that a particularly space-saving arrangement of the individual elements and thus a particularly small design of an optoelectronic component is possible. This achieves that the radiation emitted by the component is specifically radiated into a certain area of space, while radiation into other areas is reliably prevented in a comparatively simple way. In addition, all solutions with photonic structures presented here are characterized by high energy efficiency and thus by a comparatively good light yield compared to the known technical solutions.

In this context, some aspects first concern a converter element for a µ-LED. The converter element comprises at least one layer with a converter material which, when excited by an incident excitation radiation, emits a converted radiation into an emission area. The converter element is characterized in that the layer has a photonic structure at least in some areas, on which the converter material is arranged at least in sections. The photonic structure is designed in such a way that the radiation is emitted as a directed beam of rays into the emission area. Thus, a layer is provided which is structured in a suitable manner, wherein a converter material is applied in or on the structure, which emits converted radiation when excited by an excitation or pump radiation.

By combining the components converter material on the one hand and structured layer for targeted beam guidance and/or shaping on the other hand, an element is created in a particularly space-saving manner which enables a targeted emission of radiation into the radiation source's radiation area, limited to a desired spatial area. In this context, it is conceivable that both the converted radiation emitted by the converter element and the excitation radiation are directed in a suitable manner so that radiation is only emitted in a certain direction, while the emission of such radiation in other directions and/or areas is excluded or at least significantly reduced.

In general, it is conceivable that the photonic structure is coated with a suitable converter material at least in some areas and/or at least individual areas, for example depressions in the structure, are filled with the suitable converter material. The structure is configured in such a way that the emitted converted radiation is emitted as a beam of rays in a desired direction of the radiation area. Thus, light is both converted and shaped by the photonic structure. In this context, it is conceivable to adapt the photonic structure in a suitable way so that different areas are present into which a beam of radiation is emitted. In this way, converter elements can be provided which adjust the radiation characteristics of an optoelectronic component or a µ-LED in which they are used as required. In particular, it is possible to provide a converter element by which the emission profile of an optoelectronic component for which the converter element is used can be changed in such a way that the radiation no longer follows Lambert's law, but instead a beam or bundle of rays is generated which is directed in a specific direction.

The converter material may include the materials disclosed in this application and may be doped with various rare earth elements. As host material the already mentioned YAG or LuAG can be used. It is also possible to use the already mentioned quantum dots as converter material. The photonic structure normally does not change the spectral properties of a quantum dot. Besides the adaptation of the photonic structure to the emission spectrum of the quantum dots, they can also be located in the area of the structure itself, e.g. in formed trenches The regular photonic structure or a regular photonic crystal offers the advantage that the optical properties of the converter element can be adjusted particularly reliably, safely and reproducibly with an appropriate structured layer. The structure is configured in such a way that radiation of a certain wavelength or a certain wavelength range can penetrate the layer in a specifically defined direction, while this radiation cannot penetrate the layer in other directions. Alternatively or additionally, the structured layer can be configured in such a way that it is transparent or non-transparent for radiation of a specific wavelength over at least a large range.

Furthermore, it is useful if the photonic structure has at least one recess in which the converter material is located. Preferably, in this context it is intended that the photonic structure has a plurality of elevations and depressions, the depressions being at least partially filled with the suitable converter material. In this way, a converter element can be realized comparatively easily, in which the structure provided according to the invention is combined with the converter material in such a way that the converted radiation is emitted only in a specifically limited radiation range and thus in a particularly targeted manner. In principle, it is conceivable in this regard that the converter element is configured in such a way that the excitation radiation is directed by the photonic structure in a targeted manner onto areas of the converter material provided for this purpose and/or that the converted radiation impinges on the structure and is thus emitted as a targeted beam of radiation into the desired radiation emission range.

In some aspects, the layer with the photonic structure is configured such that the layer comprises at least one optical band gap. In this context, a band gap is understood to be the energetic range of the layer that lies between the valence band and the conduction band. Due to the band gap, the solid used for the layer and thus the converter element provided with the layer are transparent to radiation in a certain frequency range. The optical properties of the converter element can be specifically adjusted by adjusting the band gap and/or selecting a solid state material. In particular, it is possible to adapt the layer in such a way that only a part of the incident radiation passes through the layer and is emitted into the emission range. In some aspects, it is useful if the photonic structure of the layer has an average thickness of at least 500 nm, so that an optical band gap is created.

In some embodiments, it is provided that the layer with the photonic structure is configured in such a way that the directed beam of rays is emitted perpendicular to a plane in which the layer is arranged. In contrast, radiation components that are emitted into other spatial areas are reliably suppressed.

Further aspects concern optical filter elements and other measures. In one aspect, an optical filter element can be arranged at least on one side of the layer. In some aspects, such a filter element is designed as a filter layer, which is applied flat on the structured layer with the converter material. With the aid of such a filter element or such a filter layer, it is possible that only a certain part of a radiation impinges on the layer with the converter material or that only a certain part of the converted radiation emitted by the structured layer with the converter material is emitted into the desired spatial region. The filter element, in particular the filter layer, is thus adapted in some aspects in such a way that only that part of a radiation can pass through the filter element or the filter layer which is required as excitation radiation or which is to be emitted specifically into the emission range.

Furthermore, some aspects concern a radiation source with a μ-LED, which radiates an excitation radiation into a converter element, which is configured according to at least one of the previously described embodiments of a converter element. The converter element in turn has at least one layer with a converter material which, when excited by the excitation radiation emitted by the μ-LED, is excited to emit a converted radiation into a radiation emission area. In this context it is conceivable that a μ-LED is combined with a converter element in such a way that the entire excitation radiation emitted by the LED is converted into converted radiation or that only a part of the excitation radiation emitted by the LED is converted into converted radiation. Again, it is substantial that the radiation emitted into the radiation source's beam area is only directed into a desired spatial region. The radiation source thus generates a directed beam of light or a directed beam of radiation that is emitted in a specifically selected direction or in a specifically selected radiation range.

According to another aspect, the structured layer with the converter material is part of a semiconductor substrate of the μ-LED. The photonic structure can be formed accordingly in a semiconductor substrate of the μ-LED. In this context, it is also conceivable that the structure is produced by targeted etching of the LED semiconductor substrate and the structure is then at least partially coated with converter material and/or the converter material is filled into etched-out depressions in the structure.

Furthermore, in some aspects it is planned that the structure with the converter material is configured in such a way that the converted radiation is emitted perpendicular to a plane in which the semiconductor substrate is located, into the emission area. The structure is configured in such a way that converted radiation is only emitted perpendicular to the surface of the μ-LED chip into the emission area due to a bandgap effect. Due to this technical solution, a high directionality of the converted radiation emitted by the converter element is achieved. In this context, it is also possible that the photonic structure, for example in the form of a photonic crystal, is arranged only in the uppermost layer of the semiconductor material of the μ-LED or also at least partially in the active zone. It is again advantageous if the photonic structure has a layer thickness of at least 500 nm in order to generate reliably an optical band gap.

In one embodiment at least one filter layer is provided, which is arranged on one side of the structured layer. By means of a filter layer, the excitation radiation generated by the μ-LED is suppressed in certain wavelength ranges. In this way, especially etendue-limited systems based on full conversion of the excitation radiation can be made significantly more efficient than known technical solutions by means of directed radiation generation in the structured layer of the converter element.

The radiation source may be configured to emit visible white light or visible converted light with the colors characteristic of the RGB color space, namely red, green and blue. According to one embodiment, the radiation source can be a pixelated array, in which, for example, individual pixels of a larger component can be switched on and off individually.

The use of a photonic structure, as described herein, in combination with the above-mentioned μ-LEDs makes it possible to do without lenses or similar collimating elements. Furthermore, a photonic structure can improve the contrast between adjacent pixels due to the provided directionality.

In addition, some aspects also concern a process for manufacturing a radiation source that has at least one of the special properties described above. The process is characterized by the fact that the structure is formed by at least one etching step in a semiconductor substrate of the LED. It is advantageous here if the structure, in particular specifically selected recesses in the structure, are at least partially filled with the converter material.

Some further aspects deal with a μ-display with a photonic structure for the emission of directed light. Especially in displays that feature μ-LEDs, the dimensions of individual μ-LEDs can be very small, so that when a photonic structure is formed, only a few periods have space on the surface of a single μ-LED. It is therefore proposed to form a photonic structure over a large area on an array of several μ-LEDs. Such arrays can be pixelated arrays of μ-LEDs, for example, where one pixel forms a light source. Monolithic pixel arrays also fall under this category as do assembled LED modules with a smooth surface, for example the cover electrode disclosed in this application. Another example is an arrangement of single μ-LEDs or smaller modules of μ-LEDs, which can also be provided in the form of an array. Such μ-LED modules are also disclosed in this application.

μ-LEDs are normally Lambertian emitters and therefore emit light in a large solid angle. For pixelated arrays, and especially for μ-displays, however, as already explained, a directed emission perpendicular to the light emission surface is important or desirable for a variety of applications.

Thus, an optoelectronic device comprises an assembly having a plurality of light sources for generating light emerging from a light exit surface from the optoelectronic device, and at least one photonic structure disposed between the light exit surface and the plurality of light sources. By means of the at least one photonic structure, which may be in particular a photonic crystal or pillar structures, also referred to herein as columnar structures, beam shaping of the emitted light is effected before the light leaves the device through the light exit surface.

The photonic structure may be configured in particular for beam shaping of the light generated by the light sources. The photonic structure can in particular be configured in such a way that the light emerges at least substantially perpendicularly from the light exit surface. The directionality of the emitted light is thus considerably improved.

According to one embodiment, the arrangement is an array comprising a plurality of light sources, in particular μ-LEDs, arranged in rows and columns. The μ-LEDs are organized in pixels or subpixels and can be controlled separately. In some aspects, the arrangement is realized as a monolithic array, in other aspects, the arrangement is equipped with μ-LED modules or separate μ-LEDs. The array comprises one containing or contacting the μ-LEDs or light sources at least partially and one photonic crystal. This is arranged or formed in the layer. The photonic crystal can thus be arranged directly in the layer in which the pixels of the array are arranged. Alternatively, the photonic crystal is arranged in the layer above the light sources, so that the photonic crystal is still located between the light sources and the light exit surface.

The layer may comprise a semiconductor material and the photonic crystal may be structured in the semiconductor material. Examples of semiconductor materials are GaN or AlInGaP material systems. Examples of other possible material systems are AlN, GaP and InGaAs.

The photonic crystal can be realised by forming a periodic variation of the optical refractive index in the semiconductor material, using a material with a high refractive index, such as $Nb_2O_5$ (niobium (V) oxide), and introducing it into the semiconductor material accordingly to form a periodic or deterministically aperiodic structure. The photonic structures can be filled with a material of low refractive index, such as $SiO_2$.

Thus, a refractive index variation between a high and a low index occurs. The photonic crystal is preferably formed as a two-dimensional photonic crystal, which exhibits a periodic variation of the optical refractive index in a plane parallel to the light exit direction in two mutually perpendicular spatial directions.

The photonic crystal can be realized by means of holes or recesses, which are inserted into a material with a high refractive index, for example $Nb_2O_5$. The photonic crystal can thus be formed or be formed by forming the corresponding structuring in the material with high refractive index. In contrast, the material surrounding the holes or recesses has a different refractive index.

In a further aspect, the arrangement comprises a plurality of µ-LEDs as light sources, the µ-LEDs being arranged in a first layer and a photonic crystal being arranged or formed in a further, second layer. The second layer is located between the first layer and the light emitting surface. In combination with a particularly array-like arrangement of µ-LEDs, a photonic crystal can be provided in an additional, second layer above the first layer comprising the µ-LEDs. This is preferably designed as a two-dimensional photonic crystal and is realized in the form of a periodic variation of the optical refractive index in two spatial directions running parallel to the light exit surface and perpendicular to one another. As an example of a material with a high refractive index of the second layer, $Nb_2O_5$ can again be mentioned here, and the photonic crystal can be structured by means of holes or recesses in the material with the high refractive index. The photonic structures can be filled with a material with a lower refractive index, for example $SiO_2$. Thus, the second layer has a structure of a material with two different refractive indices.

µ-LEDs can be differentiated between horizontal and vertical µ-LEDs. With horizontal LEDs, the electrical connections are located on the back of the LED facing away from the light emission surface. In contrast, in the case of a vertical LED, one electrical connection is located on the front and one on the back of the LED. The front side faces the light emission surface.

In pixelated arrays, where the electrical contacts of both polarities are on the backside, the whole array surface can be structured, e.g. in form of a photonic crystal, especially without leaving mesa trenches or contact areas. A similar arrangement results for arrangements of horizontal µ-LEDs under a carrier substrate. According to an embodiment, in an array or an arrangement of horizontal µ-LEDs for the electrical contacting of the light sources, both poles can be electrically connected in each case by means of a contacting layer reflecting the generated light, the contacting layer lying under the photonic structure and the light sources, viewed from an upper light exit surface. The contacting layer can thereby have at least two electrically separated areas in order to avoid a short circuit between the poles.

According to another configuration, in the case of an arrangement of vertical light emitting diodes for the electrical contacting of the light sources, a first connecting contact facing away from the light-emitting surface, in particular a positive one, can be electrically connected to a contacting layer reflecting the generated light, the contacting layer lying below the photonic structure and the light sources as seen from an upper light-emitting surface. On the other hand, the respective other, in particular negative, second connecting contact, which faces the light exit surface, can be electrically connected by means of a layer of an electrically conductive and optically transparent material, in particular ITO. A filling material can be arranged between the layer and the reflective contacting layer. In some aspects, this electrically conductive layer may itself be structured to produce photonic properties. In other aspects, the photonic structure is created over the electrically conductive layer.

According to an embodiment, each of the light sources or the µ-LEDs can have a recombination zone and the photonic crystal can be located so close to the recombination zones that the photonic structure changes an optical state density present in the region of the recombination zones, in particular in such a way that a band gap is generated for at least one optical mode with a direction of propagation parallel and/or at a small angle to the light exit surface.

To effect the optical band gap in the recombination zone, it is useful if the photonic crystal is very close to the recombination zone. In addition, to form the band gap, it is useful if the height of the photonic crystal is large when viewed in a direction perpendicular to the light-emitting surface, in particular equal to or above 300 nm. By means of the photonic structure, directionality can thus be achieved for the emitted light already in the light generation region, since the emission of light with a direction of propagation parallel and/or at a small angle to the light exit surface can be suppressed. Light can then only be generated in a limited emission cone perpendicular to the light exit surface. The aperture angle of the emission cone depends on the photonic crystal and can be a small value, for example, maximum 20°, maximum 15°, maximum 10° or maximum 5°.

The photonic crystal can be arranged in relation to a plane parallel to the light-emitting surface independently of the positioning of the light points.

The photonic structure may comprise a plurality of pillar structures extending at least partially between the light-emitting surface and the plurality of light sources, one pillar being associated with each light source and aligned with the light-emitting surface when viewed in a direction perpendicular to the light-emitting surface. The pillars or columns have a longitudinal axis, which preferably extends perpendicular to the light-emitting surface. When a pillar and an associated light source are aligned, the extended longitudinal axis of the pillar intersects the centre of the light source.

Viewed transversely to the longitudinal axis, the pillars can have a circular, square or polygonal cross-section. Pillars preferably have an aspect ratio height to diameter of at least 3:1, with the height measured in the direction of the longitudinal axis of the pillars. In particular, pillars are made of a material with a high refractive index, such as $Nb_2O_5$. Due to the higher refractive index compared to the surrounding material, the light emission in a direction parallel to the longitudinal axis of the pillars can be increased compared to other spatial directions. The pillars act as wave guides. Light is more efficiently coupled out along the longitudinal axis of the pillars than along other propagation directions. Directionality in the direction of the longitudinal axis of light can thus be improved. Since the longitudinal axis of the light is preferably perpendicular to the light exit surface, improved light extraction perpendicular to the light exit surface can also be achieved.

The arrangement may be an array comprising as light sources a plurality of µ-LEDs arranged in pixels arranged in a first layer and the pillars may be arranged in a further, second layer, the second layer being positioned between the first layer and the light emitting surface. Thus, the pillars can be arranged on the surface of the pixelated array. The pillar or column structures can be free-standing and made of a material with a high refractive index. In addition, the free space between the pillars can be filled with a filling material, e.g. $SiO_2$, with a low refractive index.

In another aspect, the arrangement can be an array that has as light sources a plurality of pixels arranged in a first layer, and the pillars can also be arranged in the first layer. In particular, the pillars may be arranged in the first layer such that at least a respective part of a pillar is closer to the light emitting surface than the light source associated with the pillar. The pillar can thus act as an optical waveguide between the light source and the light-emitting surface. The pillars can be formed from a semiconductor material of the array provided in the first layer, the semiconductor material having a high refractive index. In particular, semiconductor material in the first layer can be removed by etching in such a way that the pillars remain stationary. The free spaces between the pillars can in turn be filled with a low refractive material.

In a further aspect, the arrangement can be an array that has as light sources a plurality of μ-LEDs arranged in pixels, with the pixels being formed in the pillars. An array can thus be created in such a way that the individual pixels have the form of pillars. Each pillar is preferably a μ-LED and functions as a single pixel. Seen in relation to the longitudinal axis of a pillar, the length of the pillar can correspond to half a wavelength of the emitted light, and the recombination zone of the μ-LED formed by a pillar is preferably located in the centre of the pillar. Thus, the recombination zone lies in a local maximum of the photonic state density. The light emission parallel to the longitudinal direction of the pillars can thus be significantly increased. Due to the waveguide effect, the light with propagation direction parallel to the longitudinal axis is additionally coupled out more effectively than light of other propagation directions.

The aspect ratio of height to diameter of a pillar is preferably 3:1, and at common emission wavelengths, the pillars have a height of about 100 nm and a diameter of 30 nm. Also up-scaled, larger heights and diameters, respectively are possible, which are easier to manufacture. In such a case, it is useful if the aspect ratio remains the same, for example the 3:1 mentioned above, but in a fixed ratio to the wavelength of the light to be influenced. The space between the pillars containing the light sources can be filled with material, for example $SiO_2$, which has a lower refractive index than the semiconductor material for the pillars.

In the case of a pillar with a light source, a p-contact can be made on the underside of the pillar facing away from the light-emitting surface. For example, an n-contact can be made at half the height of the pillars on the top of the pillar. The n-contact can be produced by a transparent conductive material, especially as an intermediate layer in the filling material or as the top layer above the pillars. A possible material for an n-contact layer is for example ITO (indium tin oxide). An inverse arrangement of n- and p-contact is also possible.

In particular, in the case of an arrangement of light emitting diodes, in particular vertical light emitting diodes in the form of pillars or columns for electrical contacting, a respective first pole, in particular a positive pole, may be electrically connected to a reflective contacting layer which may be formed on and/or along first longitudinal ends of the light emitting diodes. The respective other, in particular negative, second pole can be electrically connected to a further layer of an electrically conductive and optically transparent material, in particular ITO. This layer can be arranged as an intermediate layer in the middle of the pillars or columns or at and/or along second longitudinal ends of the pillars, the second longitudinal ends being opposite the first longitudinal ends.

According to another aspect, an optoelectronic device is proposed for generating an emission of light directed perpendicularly to an emitting surface from an, in particular planar, pixel array or from an array of μ-LEDs, whereby optically acting structures, in particular nanostructures such as a photonic crystal or a pillar structure, are structured along the entire emitting surface to the perpendicularly directed emission of the light. According to a further aspect, a method is proposed for the manufacture of an optoelectronic device for generating an emission of light directed perpendicularly to an emitting surface from an, in particular planar, pixelated array or from an array of μ-LEDs, wherein optically acting structures are structured along the entire emitting surface to the perpendicularly directed emission of the light.

Planar array means in particular plane array. A surface of an array or field is also preferably smooth. A pixelated array is especially a monolithic, pixelated array.

All mentioned materials, especially the materials in a photonic crystal, a pillar, or the filling materials preferably have a low absorption coefficient. The absorption coefficient is here in particular a measure of the reduction in the intensity of electromagnetic radiation when passing through a given material.

The photonic crystal can be produced using a lithography technique known per se. Possible technologies known per se are, for example, nanoimprint lithography or immersion EUV stepper, where EUV stands for extreme ultraviolet radiation.

Another possible application of photonic crystals is based on the property of polarizing electromagnetic radiation, especially visible light, with respect to the direction of oscillation. With the help of photonic structures for polarization of electromagnetic radiation, it is especially possible to take special pictures and show them on suitable displays. To create images, which give the impression of a three-dimensional image to a user, usually several complementary polarization, directions are combined in a suitable way.

It is therefore regularly a problem that the lighting units, which can provide polarized light on demand, comprise a number of additional optical components in addition to the emitter used to generate light. This makes the construction of corresponding lighting units comparatively complex and increases the costs of production. Furthermore, the different components require a not inconsiderable amount of installation space, so that efforts to miniaturize the lighting units required for augmented reality applications or in the field of consumer electronics, often reach their limits. More recent requirements in the automotive sector also point to the desire to create images that create a three-dimensional effect on the user.

To solve this and other problems, an arrangement or an optoelectronic component is proposed with at least one emitter unit, in particular a μ-LED, which emits radiation via a light exit surface. The component also comprises a polarization element, which is connected at least in sections to the light-emitting surface and changes a polarization and/or an intensity of the radiation emitted by the emitter unit when the radiation passes through the polarization element. The arrangement is characterized in that the polarizing element comprises a three-dimensional photonic structure.

The device or optoelectronic component can be a pixel element of a μ-display or a μ-display module. The emitter unit can be formed by a μ-LED. One or more such modules, in which several pixels are arranged in rows and columns, can thus generate one or more images, which may give the user the impression of a three-dimensional image.

The formulation that the polarizing element changes a polarization also includes the generation of polarized radiation from non-polarized radiation. The polarizing element can also only change the intensity of the radiation, possibly depending on the wavelength, without producing or changing a polarization. The term "polarizing element" is therefore not to be interpreted narrowly in the sense that a change or generation of polarization must be provided for in all configurations.

The proposed solution provides an optoelectronic component in which the radiation generated by the emitter, for example a μ-LED, passes directly into the polarizing element, so that a particularly compact unit for providing demand-polarized radiation is realized, which in turn can be combined with further such components and/or a polarizing element, preferably with at least one polarizing element that has complementary properties.

The substantial advantage of using a three-dimensional photonic structure, in particular a photonic crystal, for polarizing electromagnetic radiation, whereby preferably visible light is polarized, is that a particularly compact, space-saving solution is provided by the arrangement of the photonic structure in the area of the light exit surface of the emitter. With the aid of the specially configured polarizing element adjacent to the light-emitting surface, it is possible to polarize electromagnetic radiation in a targeted manner and still minimize the losses of radiation whose polarization does not correspond to the polarization direction of the polarizing element. In general, it is conceivable that the photonic structure is arranged on the light-emitting surface, or that a photonic structure is formed in a suitable manner in a semiconductor layer on which the light-emitting surface is located or to which the light-emitting surface is adjacent in the direction of the beam.

Here it is of particular advantage that the three-dimensional structures used as polarization elements can be used to change the radiation characteristics of an illumination unit with regard to its polarization properties in a particularly effective way, thus enabling discrimination of different wavelengths by different polarization properties or radiation directions.

According to an aspect, the emitter unit has at least one μ-LED. In this context, it is conceivable that the μ-LED emits preferably white, red, green or blue light, which is irradiated into the polarizing element and by means of the polarizing element the radiation is polarized in an oscillation direction. In this context, the μ-LED may also comprise a converter material so that the light emitted by the μ-LED is converted by the converter material into a desired wavelength and thus color.

Furthermore, according to another aspect, the emitter unit, in particular a μ-LED, as well as the polarization element are to be formed from different layers, which are arranged in a layer stack one above the other. Again, it is substantial that the radiation generated in at least one layer of the emitter reaches the likewise layer-shaped polarizing element before the radiation from the layer stack is emitted into the environment. In this context, it is advantageous that the three-dimensional structure used as a polarization element is located on or in the same semiconductor chip as the emitter unit.

When using an emitter unit with a μ-LED, it is also conceivable that the photonic structure is applied to the μ-LED chip or at least is part of the μ-LED chip. Various designs of such a μ-LED are disclosed in this application. The μ-LED may be monolithically manufactured and may be part of a larger array of μ-LEDs arranged in rows and columns. These can be processed and manufactured together. The μ-LEDs for individual colors can be combined into a pixel and surrounded with a structure to improve light guidance, especially to the main beam direction.

Such an embodiment provides a particularly space-saving and energy-efficient optoelectronic component with which polarized radiation is already generated directly at chip level without the need for additional optical elements in the downstream beam path.

In other aspects, the polarization element has spiral and/or rod-shaped structural elements. In this case, the three-dimensional photonic structure is adapted in such a way that light emitted by the emitter unit or the μ-LED only leaves the photonic structure with a certain polarization. A corresponding three-dimensional photonic structure with spiral and/or rod-shaped structural elements in the area of the light exit surface is only irradiated by radiation with a specific polarization direction. The design and dimensioning of the structure is preferably adapted to the radiation emitted by the emitter unit. A spiral structure achieves a circular polarization, while a rod-shaped structure causes a linear polarization of the radiation passing through the structure.

According to further aspects, it is also conceivable that when using a converter material, the three-dimensional photonic structure is located in the beam path between the μ-LED and the converter element or behind the converter element, by which the excitation radiation and/or the converted radiation is polarized in a suitable way. The combination of converter element and three-dimensional photonic structure in the same layer can also be realized. Thus, directly polarized, converted light can be generated.

For example, converter material can be filled into the three-dimensional photonic structure. The converter material can be doped with $Ce^{3+}$ (Ce for cerium), $Eu^{2+}$ (Eu for europium), $Mn^{4+}$ (Mn for manganese) or neodymium ions. As host material, for example YAG or LuAG can be used. YAG stands for Yttrium-Aluminium-Garnet. LuAG stands for lutetium aluminum garnet.

Quantum dots can also be filled into the three-dimensional photonic structure as converter material. Quantum dots can be very small, for example in the range of 10 nm. They are therefore particularly suitable for filling the three-dimensional photonic structure. In general, it is conceivable that the structure is produced by etching material out of the layer, in which the structure is to be formed. The recesses thus formed can then be filled with converter material containing, for example, quantum dots. The quantum dots can, for example, be introduced into a liquid material with which the recesses are filled. The liquid material can be at least partially vaporized so that the quantum dots remain in the recesses. In the process, part of the liquid material can solidify. The quantum dots can therefore be embedded in a matrix.

The photonic structure normally does not change the spectral properties of a quantum dot. However, a quantum dot has a narrow-band emission spectrum. The photonic structure can be adapted to this narrowband emission spectrum, which can improve the directional selectivity caused by the photonic structure.

By means of a photonic structure, the radiation characteristics of quantum dots can thus be influenced very efficiently as converters.

In other aspects, the polarizing element has at least one three-dimensional photonic crystal. It is also conceivable that the polarizing element comprises at least two two-dimensional photonic crystals, which are arranged one behind the other along a beam path of the radiation penetrating the polarizing element.

It is useful to use one three-dimensional photonic crystal or at least two two-dimensional photonic crystals arranged one behind the other in the optical path so that the structure on which the radiation impinges is transparent to radiation of a specific wavelength or several specific wavelengths and/or only transmits it in a specific direction. In this way, the desired polarization of the radiation impinging on the polarizing element can also be adjusted. In this context, it is conceivable to produce the structure directly in the converter material or to insert it into an additional layer of another material. The property of the three-dimensional photonic structure is preferably designed such that the transmission conditions are different for different wavelengths. In this way it is possible, for example, that converted radiation can pass the polarizing element unhindered while the excitation radiation is deflected. It is also conceivable that at least one of the radiations, namely excitation radiation on the one hand and converted radiation on the other hand, only passes through the polarizing element with a certain polarization.

In some embodiments, it may also be provided that the polarizing element has at least two different transmittances depending on a wavelength of the radiation passing through the polarizing element. In this context, a further embodiment provides that the emitter unit comprises a μ-LED and a converter element with a converter material which, excited by excitation radiation emitted by the μ-LED, emits converted radiation, and that excitation radiation incident on the polarizing element is polarized and/or absorbed differently when passing through the polarizing element compared to the converted radiation passing through.

The properties of the three-dimensional photonic structure are thus such that the transmission conditions are different for different wavelengths. In this case, it is conceivable, for example, that converted light can pass unhindered through the three-dimensional photonic structure while the excitation radiation is deflected. It is also conceivable that converted radiation only leaves the three-dimensional photonic structure with a certain polarization.

Furthermore, for some aspects it is conceivable that one of the two radiations, which have different wavelengths, is discriminated against by the different properties of the polarizing element in terms of polarization and direction of propagation. It is therefore preferable that in a combination of a μ-LED and a converter element, by which a full conversion is realized, a part of the excitation radiation is filtered out except for a comparatively small radiation portion with a special wavelength, which leads to the fact that a thinner layer of the converter material can be used.

The structure described herein can be produced in a particularly small way. In some aspects, for example, an emitter unit with a μ-LED is provided, and the three-dimensional structure of the polarization element is applied directly on the μ-LED chip, preferably on the semiconductor layer of the μ-LED, through which the generated radiation reaches the light emission surface. According to such embodiment, the three-dimensional photonic structure is located directly on or in the μ-LED chip.

With such a technical solution, the polarized radiation emission can be used to improve the resolution for the generation of images, and components for beam generation can be made comparatively small. This can be achieved, for example, by imaging the radiation emitted by several components or by several illumination units with complementary properties via common optics. Optics that are suitable for this purpose are disclosed in this application. Illumination units adapted in this way are thus particularly suitable for augmented reality applications and/or in the field of consumer electronics.

Another aspect relates to a method of manufacturing an optoelectronic component having at least one emitter unit which emits radiation via a light-emitting surface, and having a polarizing element, which adjoins the light-emitting surface at least in sections and changes a polarization and/or an intensity of a radiation emanating from the emitter unit when the radiation passes through the polarizing element.

This method can be further developed by using a μ-LED, or an array of μ-LEDs, as emitter unit, on whose light-emitting surface a three-dimensional photonic structure is applied as polarization element, for example by two-photon lithography or glancing angle deposition, and/or the photonic structure is introduced into a semiconductor layer of the μ-LED adjacent to the light-emitting surface. The three-dimensional structure can be dimensioned depending on the wavelength of the radiation emitted by the μ-LED.

Thus, an optoelectronic device based on the principles and structures or objects disclosed in this application may be used in a device for the production of three-dimensional images, in particular for presentation on a display, monitor or screen. In some aspects, the three-dimensional impression in a user is based on the fact that light of different polarity is directed to the two eyes, the respective light, or the generated image or represented objects, being displayed at slightly different positions.

In particular, based on the techniques presented here, three-dimensional images can be generated computer-aided for augmented reality applications or in the automotive sector. It is an advantage here that the optoelectronic components disclosed in this application with a three-dimensional photonic structure as polarization element change the radiation characteristic of μ-LEDs with respect to the polarization properties and thus a discrimination of different wavelengths due to different, wavelength-specific polarization properties or radiation directions can be achieved.

The polarized radiation can be generated directly on the substrate with the emitter unit, in particular at the level of a μ-LED chip, or the selectivity can be improved with full conversion. This eliminates the need for separate elements, which could lead to positioning errors or deviations. Due to the emission of specifically polarized radiation, the resolution of three-dimensional representations can be improved and at the same time, the components or illumination units required for image generation can be reduced in size. This can be achieved, for example, by imaging the light of several components with complementary properties via common optics on a display, a screen or even directly on the retina of a user. Particularly for augmented reality applications and in the field of consumer electronics, three-dimensional images can be created by combining complementary polarization elements.

In some other aspects, a photonic structure or a photonic crystal can be used to far-field characteristics of an optoelectronic component can be specifically altered. Therefore, among other things, an arrangement is proposed which comprises at least one optoelectronic emitter unit, which emits electromagnetic radiation via a light exit surface. In addition, a photonic structure is provided for beam shaping of the electromagnetic radiation before it exits via the light exit surface, wherein the photonic structure shapes the electromagnetic radiation in such a way that the electromagnetic radiation has a certain and defined far field.

The optoelectronic emitter unit is adapted as a µ-LED. The optoelectronic emitter unit can also have an array with several µ-LEDs. This provides a photonic structure over a plurality of such µ-LEDs.

Due to the photonic structure, the radiation characteristic of the optoelectronic emitter unit of the arrangement changes from a Lambertian radiator to a defined radiation characteristic in the far field. The formulation that the electromagnetic radiation has a certain far field thus means in particular that the radiation characteristic is defined in the far field and differs from the radiation characteristic of a Lambert emitter. The far field refers to a region, which, depending on the application, is at least a few centimetres or even a few metres away from the lighting unit so that the magnetic and electronic fields are perpendicular to each other.

The photonic structure may be located, especially in a layer, below the light-emitting surface and/or between the optoelectronic emitter unit and the light-emitting surface. Thus, the light must pass through it before finally leaving the component. The photonic structure can thus be integrated into the arrangement, making it compact. The photonic structure can also be integrated into the light-emitting surface, or an end face of the photonic structure can form the light-emitting surface.

In some aspects, the photonic structure is a one-dimensional photonic structure, especially a one-dimensional photonic crystal. For example, the photonic structure may be configured such that the electromagnetic radiation is at least approximately collimated with respect to a first spatial direction. Thus, a collimated beam can be generated at least with respect to the first direction in space.

A collimating optical system can be arranged downstream of the light exit surface, viewed in the direction of emission, the optical system being designed to collimate the electromagnetic radiation in a further, second spatial direction which is orthogonal to the first spatial direction. The first direction and the second direction can be mutually orthogonal directions, which are parallel to the plane light-emitting surface. Thus, a beam collimated in both directions can be produced, which is directed along the main radiation direction away from the light-emitting surface and orthogonal to both the first and second directions.

According to an embodiment of the invention, the photonic structure, in particular formed as a one-dimensional photonic crystal, can be configured in such a way that a main radiation direction of the electromagnetic radiation runs at an angle to the normal of the light-emitting surface, the angle being not equal to zero degrees. The main radiation direction can thus be inclined to the normal of the light-emitting surface. A beam collimated in at least one direction can thus, for example, emerge from the light-emitting surface at an angle.

The photonic structure formed as a one-dimensional photonic crystal can be arranged in a layer below the light-emitting surface, in particular directly below. The one-dimensional photonic crystal can thereby have a periodically repeating sequence of two materials with different optical refractive indexes extending in one direction. The materials can each have a rectangular or parallelogram-shaped cross-section. The abutting interfaces of the materials can be inclined to the light-emitting surface.

Such a structure can be formed, for example, by etching trenches running parallel to each other at an angle to the light-emitting surface into the substrate having the light-emitting surface. The trenches can be filled with a material having a different optical refractive index than the substrate material etched away. The angle may depend on the inclination of the trenches to the light-emitting surface, and the width of the trenches or the width of the substrate material remaining between the trenches influences the wavelengths at which the photonic structure is effective. Typically, the width of the trenches and the width of the substrate material remaining between the trenches are adapted to the wavelength of the electromagnetic radiation.

In some aspects, the photonic structure can also be a two-dimensional photonic structure, in particular a two-dimensional photonic crystal. One end face of the two-dimensional photonic structure may form the light-emitting surface of the illumination unit, or the two-dimensional photonic structure may be arranged in a layer below the light-emitting surface.

The two-dimensional structure, in particular a two-dimensional photonic crystal, can be designed in such a way that it influences the electromagnetic radiation in such a way that the electromagnetic radiation in the far field forms a defined, in particular a discrete, pattern. The illumination unit can thus be used in surface topography systems, for example for face recognition.

As mentioned above, the photonic structure may be located in a layer below the light-emitting surface, or an end face of the photonic structure may form the light-emitting surface so that the photonic structure is located directly below the light-emitting surface and encloses it.

The photonic structure can also be formed in a semiconductor layer of the optoelectronic emitter unit.

The optoelectronic emitter unit may comprise a layer of converter material and the photonic structure may be formed in the layer of converter material or in a layer between the layer of converter material and the light-emitting surface.

The optoelectronic emitter unit can have at least one optoelectronic laser, such as a VCSEL (vertical-cavity surface-emitting laser). A field of several lasers is also conceivable.

BRIEF DESCRIPTION OF THE DRAWINGS

In the following section, some of the above-mentioned and summarized aspects are explained in more detail using various explanations and examples.

FIGS. 3B-1 and 3B-2 illustrate a table of preferred applications for μ-LED arrays;

DETAILED DESCRIPTION

Figure 1A:
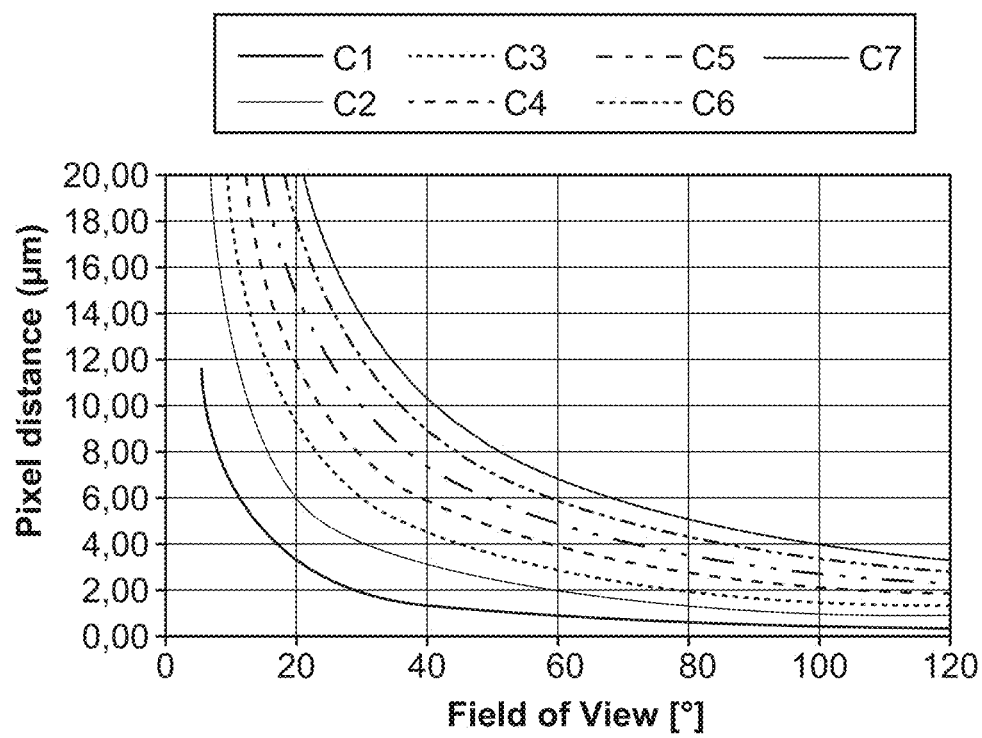
FIG. 1A shows a diagram illustrating some requirements for so-called µ-displays or micro-displays of different sizes with respect to the field of view and pixel pitch of the µ-display.

Augmented reality is usually generated by a dedicated display whose image is superimposed on reality. Such device can be positioned directly in the user's line of sight, i.e. directly in front of it. Alternatively, optical beam guidance elements can be used to guide the light from a display to the user's eye. In both cases, the display may be implemented and be part of the glasses or other visually enhancing devices worn by the user. Googles™ Glasses is an example of such a visually augmenting device that allows the user to overlay certain information about real world objects. For the Google™ glasses, the information was displayed on a small screen placed in front of one of the lenses. In this respect, the appearance of such an additional device is a key characteristic of eyeglasses, combining technical functionality with a design aspect when wearing glasses. In the meantime, users require glasses without such bulky or easily damaged devices to provide advanced reality functionality. One idea, therefore, is that the glasses themselves become a display or at least a screen on or into which the information is projected.

In such cases, the field of vision for the user is limited to the dimension of the glasses. Accordingly, the area onto which extended reality functionality can be projected is approximately the size of a pair of spectacles. Here, the same, but also different information can be projected on, into or onto the two lenses of a pair of spectacles.

In addition, the image that the user experiences when wearing glasses with augmented reality functionality should have a resolution that creates a seamless impression to the user, so that the user does not perceive the augmented reality as a pixelated object or as a low-resolution element. Straight bevelled edges, arrows or similar elements show a staircase shape that is disturbing for the user at low resolutions.

In order to achieve the desired impression, two display parameters are considered important, which have an influence on the visual impression for a given or known human sight. One is the pixel size itself, i.e. the geometric shape and dimension of a single pixel or the area of 3 subpixels representing the pixel. The second parameter is the pixel pitch, i.e. the distance between two adjacent pixels or, if necessary, subpixels. Sometimes the pixel pitch is also called pixel gap. A larger pixel pitch can be detected by a user and is perceived as a gap between the pixels and in some cases causes the so-called fly screen effect. The gap should therefore not exceed a certain limit.

The maximum angular resolution of the human eye is typically between 0.02 and 0.03 angular degrees, which roughly corresponds to 1.2 to 1.8 arc minutes per line pair. This results in a pixel gap of 0.6-0.9 arc minutes. Some current mobile phone displays have about 400 pixels/inch, resulting in a viewing angle of approximately 2.9° at a distance of 25 cm from a user's eye or approximately 70 pixels/° viewing angle and cm. The distance between two pixels in such displays is therefore in the range of the maximum angular resolution. Furthermore, the pixel size itself is about 56 μm.

FIG. 1A illustrates the pixel pitch, i.e. the distance between two adjacent pixels as a function of the field of view in angular degrees. In this respect, the field of view is the extension of the observable world seen at a given moment. This is because human vision is defined as the number of degrees of the angle of view during stable fixation of the eye.

In particular, humans have a forward horizontal arc of their field of vision for both eyes of slightly more than 210°, while the vertical arc of their field of vision for humans is around 135°. However, the range of visual abilities is not uniform across the field of vision and can vary from person to person.

The binocular vision of humans covers approximately 114° horizontally (peripheral vision), and about 90° vertically. The remaining degrees on both sides have no binocular area but can be considered part of the field of vision.

Furthermore, color vision and the ability to perceive shapes and movement can further limit the horizontal and vertical field of vision. The rods and cones responsible for color vision are not evenly distributed.

Figure 1B:
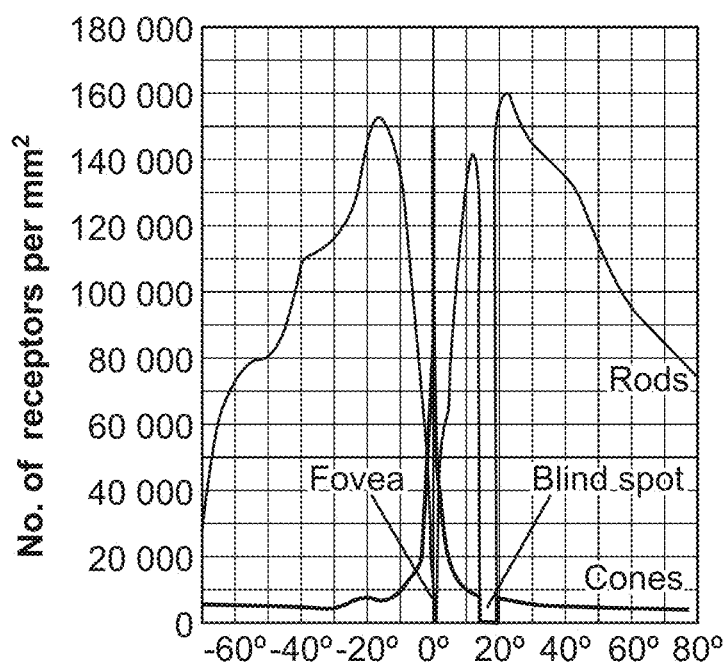
FIG. 1B shows a diagram of the spatial distribution of rods and cones in the human eye.
Figure 1C:
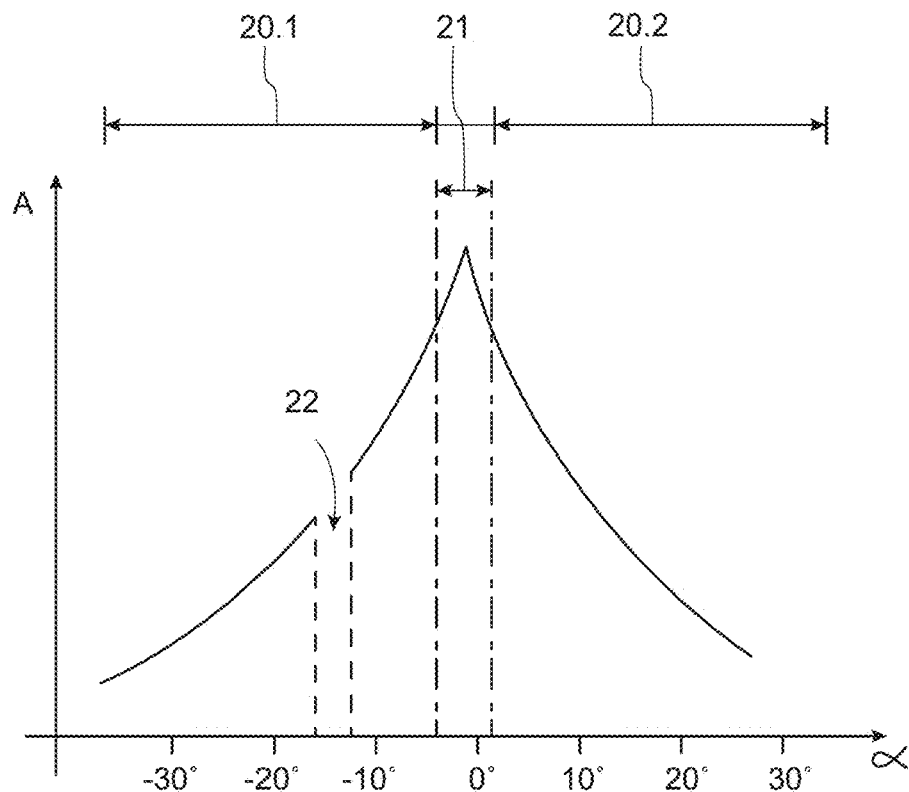
FIG. 1C shows a diagram of the perceptual capacity of the human eye with assigned projection areas.
Figure 1D:
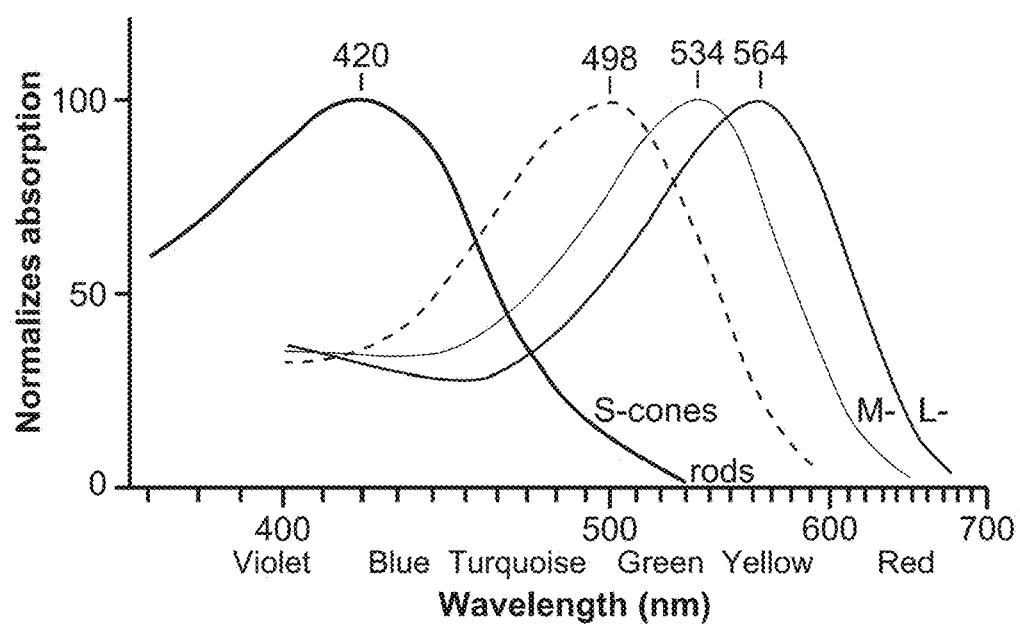
FIG. 1D is a figure showing the sensitivity of the rods and cones over the wavelength.

This point of view is shown in more detail in FIGS. 1B to 1D. In the area of central vision, i.e. directly in front of the eye, as required for Augmented Reality applications and partly also in the automotive sector, the sensitivity of the eye is very high both in terms of spatial resolution and in terms of color perception.

FIG. 1B shows the spatial density of rods and cones per $mm^2$ as a function of the fovea angle. FIG. 1C describes the color sensitivity of cones and rods as a function of wavelength. In the central area of the fovea, the increased density of cones (L, S and M) means that better color vision predominates. At a distance of about 25° around the fovea, the sensitivity begins to decrease and the density of the visual cells decreases. Towards the edge, the sensitivity of color vision decreases, but at the same time contrast vision by means of the rods remains over a larger angular range. Overall, the eye develops a radially symmetrical visual pattern rather than a Cartesian visual pattern. A high resolution for all primary colors is therefore required, especially in the center. At the edge it may be sufficient to work with an emitter adapted to the spectral sensitivity of the rods (max. sensitivity at 498 nm, see FIG. 1D and the sensitivity of the eye).

FIG. 1C shows the different perceptual capacity of the human eye by means of a graph of the angular resolution A relative to the angular deviation a from the optical axis of the eye. It can be seen that the highest angular resolution A is in an interval of the angular deviation a of +/−2.5°, in which the fovea centralis 7 with a diameter of 1.5 mm is located on the retina 19. In addition, the position of the blind spot 22 on the retina 19 is sketched, which is located in the area of the optic nerve papilla 23, which has a position with an angular deviation a of about 15°.

The eye compensates this non-constant density and also the so-called blind spot by small movements of the eye. Such changes in the direction of vision or focus can be counteracted by suitable optics and tracking of the eye.

Furthermore, even with glasses, the field of vision is further restricted and, for example, can be approximately in the range of 80° for each lens.

The pixel pitch in FIG. 1A on the Y-axis is given in μm and defines the distance between two adjacent pixels. The various curves C1 to C7 define the diagonal dimension of a corresponding display from 5 mm to approximately 35 mm. For example, curve C1 corresponds to a display with the diagonal size of 5 mm, i.e. a side length of approximately 2.25 mm. For a field of view of approximately 80°, the pixel pitch of a display with a diagonal size of 5 mm is in the range of 1 μm. For larger displays like curve C7 and 35 mm diagonal size, the same field of view can be implemented with a pixel pitch of approximately 5 μm.

Nevertheless, the curves in FIG. 1A illustrate that for larger fields of view, which are preferred for extended reality applications, very high pixel densities with small pixel pitch are required if the well-known fly screen effect is to be avoided. One can now calculate the size of the pixel for a given number of pixels, a given field of view and a given diagonal size of a μ-display.

Equation 1 shows the relationship between dimension D of a pixel, pixel pitch pp, number N of pixels and the edge length d of the display. The distance r between two adjacent pixels calculated from their respective centers is given by $$r = d/2 + pp + d/2.$$

$$D = d/N - pp$$

$$N = d/(D + pp) \quad (1)$$

Assuming that the display (e.g. glasses) is at a distance of 2.54 cm (1 inch) from the eye, the distance r between two adjacent pixels for an angular resolution of 1 arcminute as roughly estimated above is given by $$r = \tan(1/60°) * 30 \text{ mm}$$

$$r = 8.7 \text{ μm}$$

The size of a pixel is therefore smaller than 10 μm, especially if some space is required between two different pixels. With a distance, r between two pixels and a display with the size of 15 mm×10 mm, 1720×1150 pixels can be arranged on the surface.

Figure 2A:
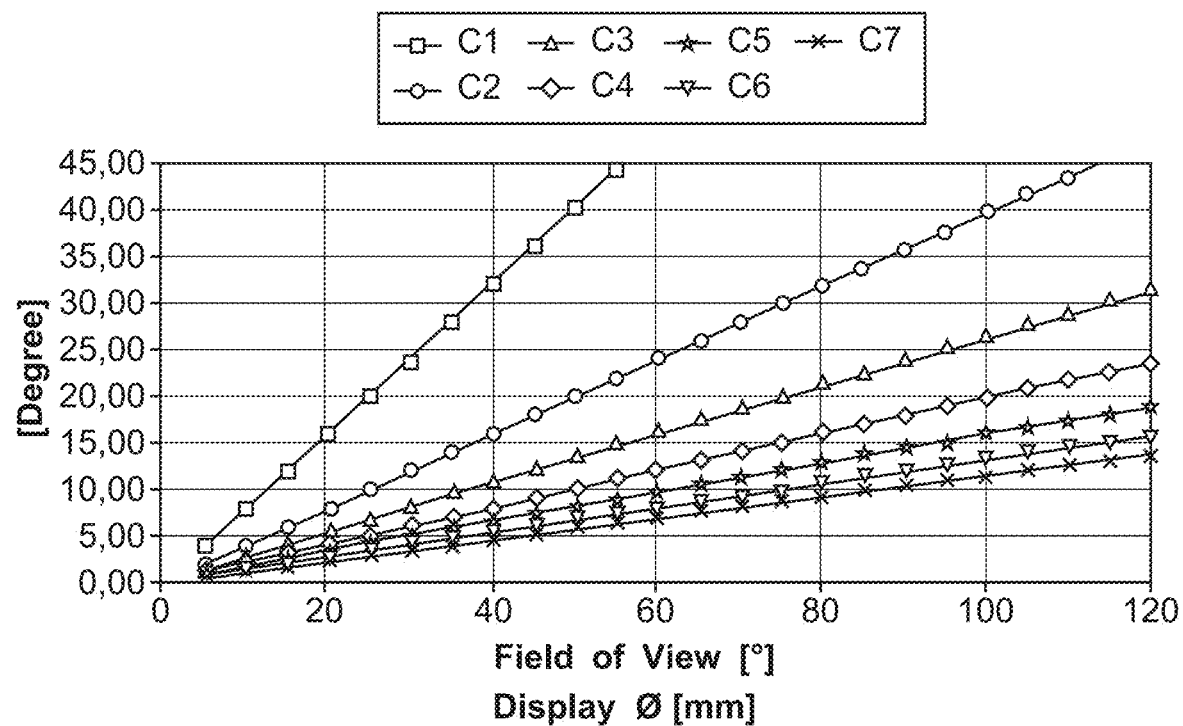
FIG. 2A is a diagram illustrating some requirements for micro-displays of different sizes in terms of the field of view and the angle of collimation of a pixel of the µ-display.
Figure 2B:
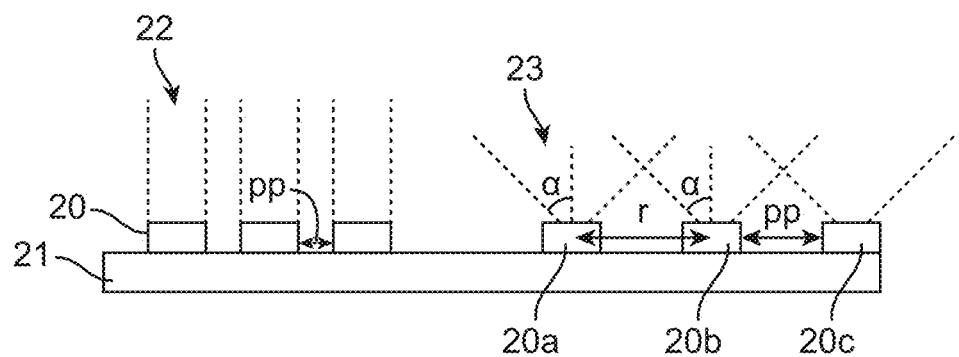
FIG. 2B illustrates an exemplary execution of a pixel arrangement to illustrate the parameters used in FIGS. 1A and 2A.

FIG. 2B shows an arrangement, which has a carrier 21 on which a large number of pixels, 20 and 20a to 20c are arranged. Pixels 20 arranged side by side have the pixel pitch pp, while pixels 20a to 20c are placed on carrier 21 with a larger pixel pitch pp. The distance between two pixels is given by the sum of the pixel pitch and half the size for each adjacent pixel. Each of the pixels 20 is configured so that its illumination characteristic or its emission vector 22 is substantially perpendicular to the emission surface of the corresponding LED.

The angle between the perpendicular axes to the emission surface of the LED and the beam vector is defined as the collimation angle. In the example of emission vector 22, the collimation angle of LEDs 20 is approximately zero. LED 20 emits light that is collinear and does not widen significantly.

In contrast, the collimation angle of the emission vector 23 of the LED pixels 20a to 20c is quite large and in the range of approximately 45°. As a result, part of the light emitted by LED 20a overlaps with the emission of an adjacent LED 20b.

The emission of the LEDs 20a to 20c is partially overlapping, so that its superposition of the corresponding light emission occurs. In case the LEDs emit light of different colors, the result will be a color mixture or a combined color. A similar effect occurs between areas of high contrast, i.e. when LED 20a is dark while LED 20b emits a certain light. Because of the overlap, the contrast is reduced and information about each individual position corresponding to a pixel position is reduced.

In displays where the distance to the user's eye is only small, as in the applications mentioned above, a larger collimation angle is rather annoying due to the effects mentioned above and other disadvantages. A user is able to see a wide collimation angle and may perceive displayed objects in slightly different colors blurred or with reduced contrast.

FIG. 2A illustrates in this respect the requirement for the collimation angle in degrees against the field of view in degrees, independent of specific display sizes. For smaller display sizes such as the one in curve C1 (approx. 5 mm diagonal), the collimation angle increases significantly depending on the field of view.

As the size of the display increases, the collimation angle requirements change drastically, so that even for large display geometries such as those illustrated in curve C7, the collimation angle reaches about 10° for a field of view of 100°. In other words, the collimation angle requirements for larger displays and larger fields of view are increasing. In such displays, light emitted by a pixel must be highly collimated to avoid or reduce the effects mentioned above. Consequently, strong collimation is required when displays with a large field of view are to be made available to a user, even if the display geometry is relatively large.

As a result of the above diagrams and equations, one can deduce that the requirements regarding pixel pitch and collimation angle become increasingly challenging as the display geometry and field of view grow. As already indicated by equation 1, the dimension of the display increases strongly with a larger number of pixels. Conversely, a large number of pixels is required for large fields of view if sufficient resolution is to be achieved and fly screens or other disturbing effects are to be avoided.

Figure 3A:
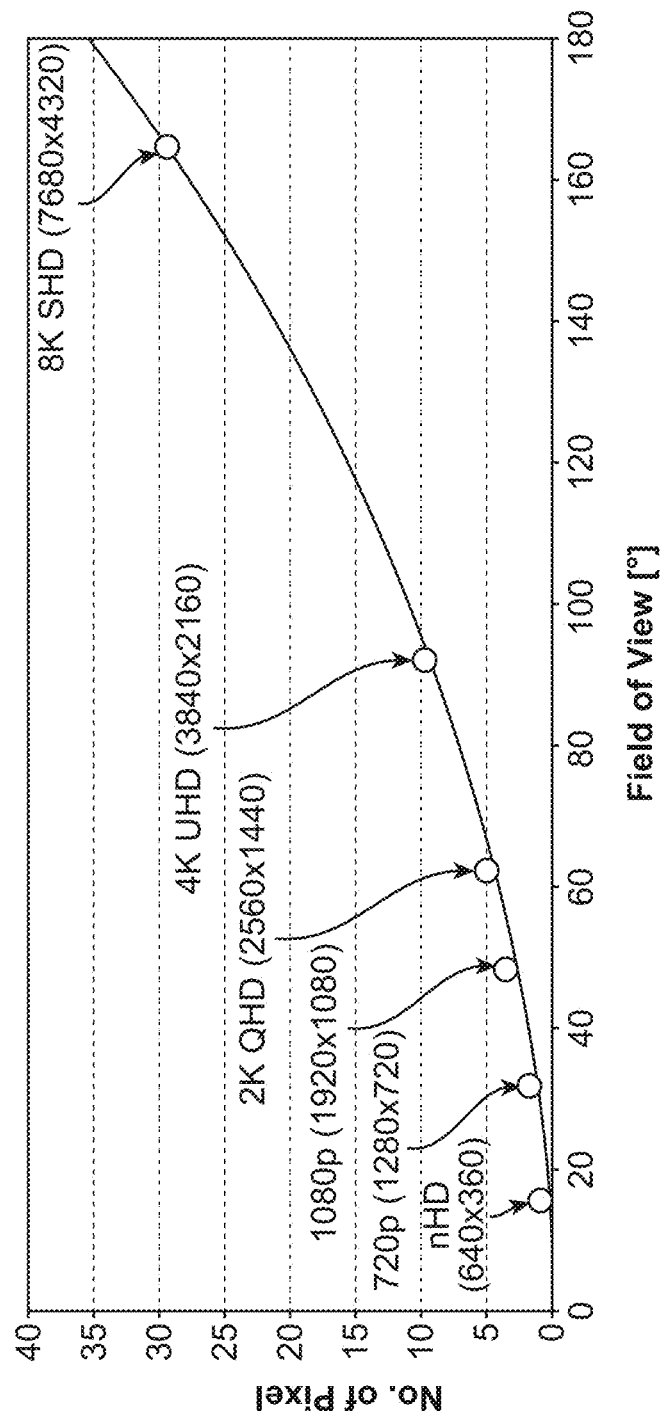
FIG. 3A shows a diagram illustrating the number of pixels required depending on the field of view for a specific resolution.

FIG. 3A shows a diagram of the number of pixels required to achieve an angular resolution of 1.3 arc minutes. For a field of view of approximately 80°, the number of pixels exceeds 5 million. It is easy to estimate that the size of the pixels for a QHD resolution is well below 10 μm, even if the display is 15 mm×10 mm. In summary, advanced reality displays with resolutions in the HD range, i.e. 1080p, require a total of 2.0736 million pixels. This allows a field of view of approximately 50° to be covered. Such a quantity of pixels arranged on a display size of 10×10 mm with a distance between the pixels of 1 μm results in a pixel size of about 4 μm.

In contrast, the table in FIGS. 3B-1 and 3B-2 shows several application areas in which μ-LED arrays can be used. The table shows applications (use case) of μ-LED arrays in vehicles (Auto) or for multimedia (MM), such as automotive displays and exemplary values regarding the minimum and maximum display size (min. and max. size X Y [cm]), the pixel density (PPI) and the pixel pitch (PP [μm]) as well as the resolution (Res.-Type) and the distance of the viewer (Viewing Distance [cm]) to the lighting device or display. In this context, the abbreviations "very low res", "low res", "mid res" and "high res" have the following meaning:
very low res pixel pitch approx. 0.8-3 mm
low res Pixel pitch approx. 0.5-0.8 mm
mid res Pixel pitch approx. 0.1-0.5 mm
high res Pixel pitch less than 0.1 mm The upper part of the table, entitled "Direct Emitter Displays", shows inventive applications of μ-LED arrays in displays and lighting devices in vehicles and for the multimedia sector. The lower part of the table, titled "Transparent Direct Emitter Displays", names various applications of μ-LED arrays in transparent displays and transparent lighting devices. Some of the applications of μ-displays listed in the table are explained in more detail below in the form of embodiments.

The above considerations make it clear that challenges are considerable in terms of resolution, collimation and field of view suitable for extended reality applications. Accordingly, very high demands are placed on the technical implementation of such displays.

Conventional techniques are configured for the production of displays that have LEDs with edge lengths in the range of 100 µm or even more. However, they cannot be automatically scaled to the sizes of 70 µm and below required here. Pixel sizes of a few µm as well as distances of a few µm or even less come closer to the order of magnitude of the wavelength of the generated light and make novel technologies in processing necessary.

In addition, new challenges in light collimation and light direction are emerging. Optical lenses, for example, which can be easily structured for larger LEDs and can also be calculated using classical optics, cannot be reduced to such a small size without the Maxwell equations. Apart from this, the production of such small lenses is hardly possible without large errors or deviations. In some variants, quantum effects can influence the behaviour of pixels of the above-mentioned size and have to be considered. Tolerances in manufacturing or transfer techniques from pixels to sub mounts or matrix structures are becoming increasingly demanding. Likewise, the pixels must be contacted and individually controllable. Conventional circuits have a space requirement, which in some cases exceeds the pixel area, resulting in an arrangement and space problem.

Accordingly, new concepts for the control and accessibility of pixels of this size can be quite different from conventional technologies. Finally, a focus is on the power consumption of such displays and controllers. Especially for mobile applications, a low power consumption is desirable.

In summary, for many concepts that work for larger pixel sizes, extensive changes must be made before a reduction can be successful. While concepts that can be easily up scaled to LEDs at 2000 µm for the production of LEDs in the 200 µm range, downscaling to 20 µm is much more difficult. Many documents and literature that disclose such concepts have not taken into account the various effects and increased demands on the very small dimensions and are therefore not directly suitable or limited to pixel sizes well above 70 µm.

In the following, various aspects of the structure and design of µ-LED semiconductors, aspects of processing, light extraction and light guidance, display and control are presented. These are suitable and designed to realize displays with pixel sizes in the range of 70 µm and below. Some concepts are specifically designed for the production, light extraction and control of µ-LEDs with an edge length of less than 20 µm and especially less than 10 µm. It goes without saying, and is even desired, that the concepts presented here can and should be combined with each other for the different aspects. This concerns for example a concept for the production of a µ-LED with a concept for light extraction. In concrete terms, a µ-LED implemented by means of methods to avoid defects at edges or methods for current conduction or current constriction can be provided with light extraction structures based on photonic crystal structures. Likewise, a special drive can also be realized for displays whose pixel size is variable. Light guidance with piezoelectric mirrors can be realized for µ-LEDs displays based on the slot antenna aspect or on conventional monolithic pixel matrices.

In some of the following embodiments and described aspects, additional examples of a combination of the different embodiments or individual aspects thereof are suggested. These are intended to illustrate that the various aspects, embodiments or parts thereof can be combined with each other by the skilled person. Some applications require specially adapted concepts; in other applications, the requirements for the technology are somewhat lower. Automotive applications and displays, for example, may have a longer pixel edge length due to the generally somewhat greater distance to a user. Especially there, besides applications of extended reality, classical pixel applications or virtual reality applications exist. This is in the context of this disclosure for the realization of µ-LED displays, whose pixel edge length is in the range of 70 µm and below, also explicitly desired.

Figure 4A:
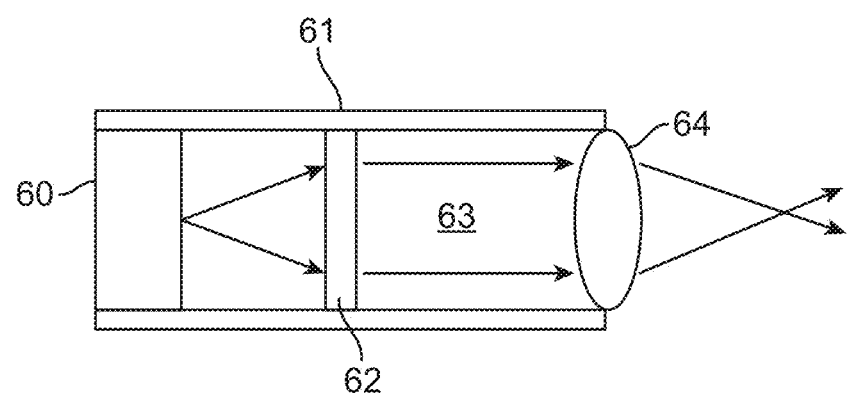
FIG. 4A shows a principle representation of a μ-LED display with essential elements for light generation and light guidance.
Figure 4B:
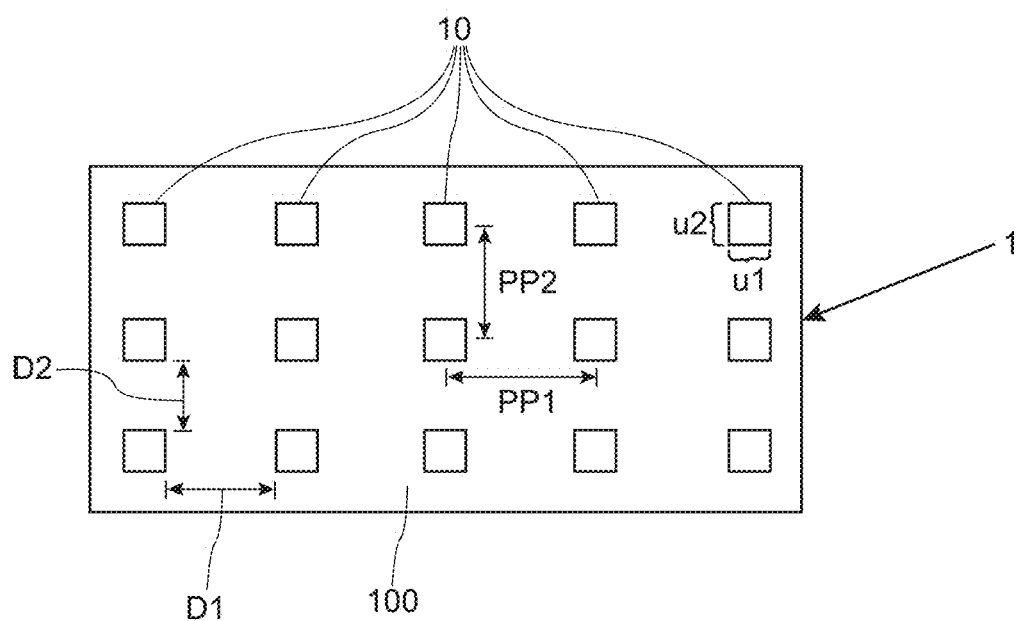
FIG. 4B shows a schematic representation of a μ-LED array with similar μ-LEDs.
Figure 4C:
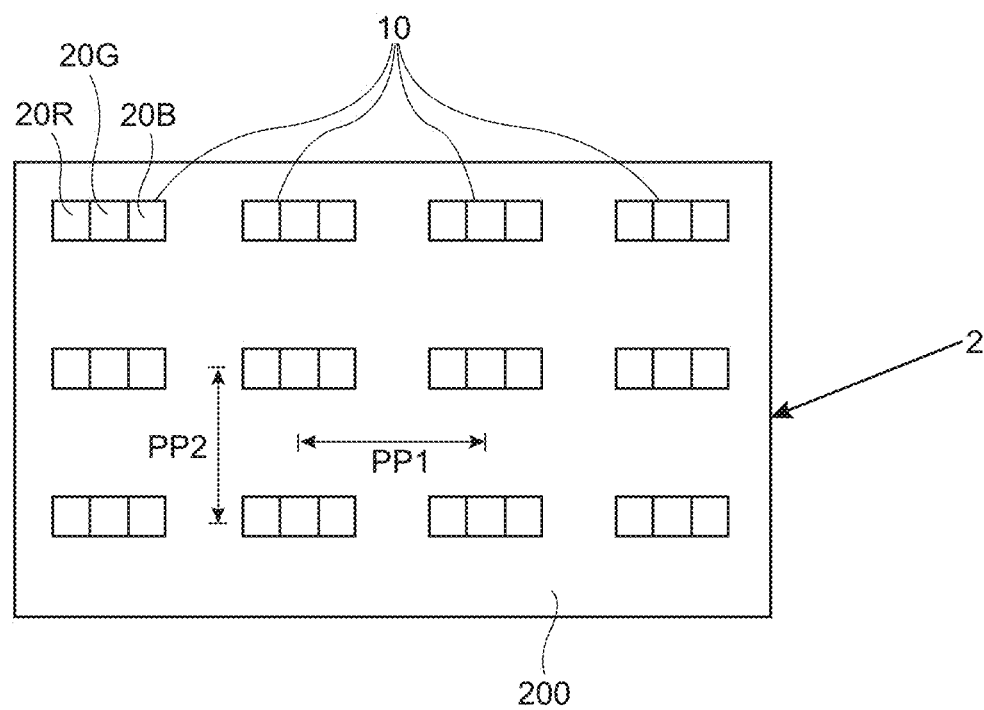
FIG. 4C is a schematic representation of a μ-LED array with μ-LEDs of different light colors.

A general illustration of the main components of a pixel in a µ-display is shown schematically in FIG. 4A. It shows an element 60 as a light generating and light emitting device. Various aspects of this are described in more detail below in the section on light generation and processing. Element 60 also includes basic circuits, interconnects, and such to control the illumination, intensity, and, when applicable, color of the pixel. Aspects of this are described in more detail in the section on light control. Apart from light generation, the emitted light must be collimated. For this purpose, many pixels in microdisplays have such collimation functionality in element 60. The parallel light in element 63 is then fed for light guidance into some optics 64, for further shaping and the like. Light collimation and optics suitable for implementing pixels for microdisplays are described in the section on light extraction and light guidance.

The pixel device of FIG. 4A illustrates the different components and aspects as separate elements. An expert will recognize that many components can be integrated into a single device. In practice, the height of a µ-display is also limited, resulting in a desired flat arrangement.

After light has been generated, it must be collimated and directionally coupled out as far as possible. Therefore the following explanations concern different aspects of light extraction.

Figure 5A:
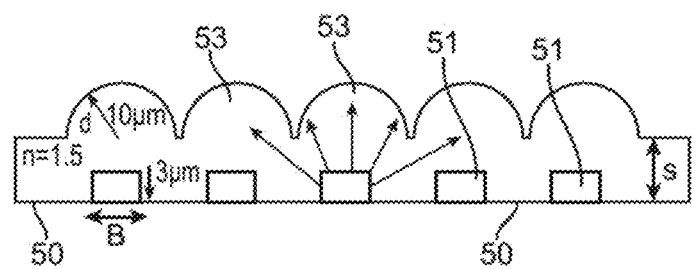
FIG. 5A and FIG. 5B show two examples of a structure or beamline and collimation.
Figure 5B:
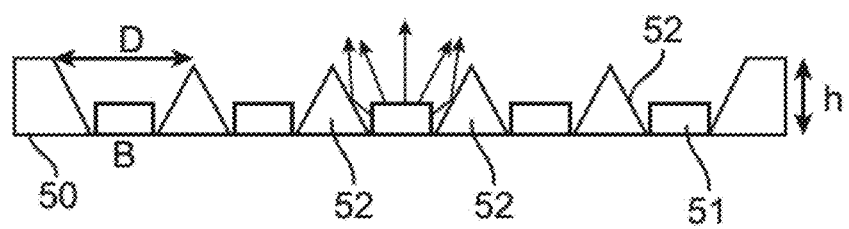

FIGS. 5A and 5B disclose some principles regarding the collimation and direction of light emitted by individual pixels. FIG. 5A shows a carrier 50, which also acts as a mirror by reflecting all light emitted by the LED 51 arranged on the carrier. Two adjacent LEDs are about 6 µm apart and about 3 µm high. Their diameter is in the range of 6 µm. Each individual pixel emits light similar to a Lambert spotlight. Consequently, they are completely covered with a transparent material with a refractive index of about n=1.5.

A hemisphere 53 of the same material with a radius of approximately 10 µm is arranged on each micropixel. Each hemisphere 53 covers the area of the underlying pixel 51 and extends to about half the distance to the next pixel. Because of the refractive index and geometry, the hemispheres are configured to collimate the light emitted by the individual pixels.

FIG. 5B shows an alternative concept for collimating the light emitted by the pixels. Similar to the above, the micropixels are arranged at equal distances from each other. Between each pixel, a pyramid 52 is placed on the support 50. The pyramids 52 are formed of highly refractive material and have distance D between their tips. The height of the apex of each pyramid is chosen so that light emitted at an angle less than 45° from the light-emitting surface is reflected on the sidewalls of the pyramid as indicated. By using the elements shown in FIG. 5B, light emitted by micropixels 51 can be parallelized to a certain extent, which improves its collimation. However, as the size decreases, it becomes increasingly difficult to shape elements 52 and 53 and to place them directly above the micropixels.

Figure 6:
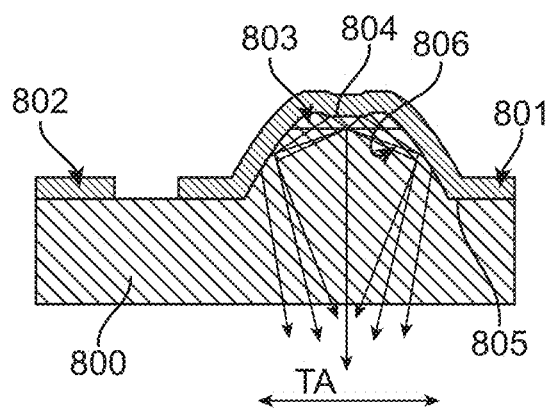
FIG. 6 shows a μ-LED pixel where the light emission is already directed by a specially formed reflector material.

FIG. 6 illustrates an example of a pixel for which, in one aspect, a rear decoupling is provided by shaping the pixel as a hemisphere and surrounding it with reflective material to shape the emitted light. The pixel is shaped as a half-dome within an n-doped first semiconductor material 800. A first contact 801 on a first side of material 800 serves as the n-contact for the corresponding pixel. A second contact 802 can be used for a variety of pixels.

Thus, it is possible to arrange the plurality of pixels next to each other to form a µ-display. Within the half-dome area of the pixel, an active layer 803 is arranged. The active layer is located in the upper third of the half-dome forming the pixel and is formed by a p-doped layer 804 deposited on the n-doped material in the half-dome. Other active layers such as quantum wells or structures mentioned in this disclosure are possible. In order to form the smallest possible region where recombination occurs, a current confinement process can be used. This keeps charge carriers away from the edge and the recombination area becomes smaller.

A reflective layer 805 is applied to the sidewalls and also to the upper surface of the material 800. The p-contact 801 is applied to the reflective layer 805. The reflective layer 805 also includes an insulating layer (not shown) to prevent a short circuit between the p-contact and the material 800. P-contact material 801 is in direct contact with the p-doped layer 804 through a gap in the reflective layer on the half-dome forming the pixel. As a result, the insulating layer on the reflective layer and the gap in the reflective layer causes carrier injection only at the tip of the half-dome. A current broadening layer can also be applied within the p-doped layer 804.

Recombination of charge carriers occurs in the active region 803 Light emitted from the active region towards the side is reflected at the reflective layer towards the output surface TA. The shape of the half-dome is parabolic in some examples. The shape should be chosen to support collinearity for light generated within the active region. In some applications, other elements for guiding light, such as photonic crystal structures or similar are then arranged on the exit surface.

The following aspects deal with a different point of view in contrast to a direct improvement of the directionality of the emitted light. The following examples are intended for the creation of a Lambert radiator. However, it is known by the expert that other shapes on reflector elements influence the beam-shaping. Special designs thus create a µ-LED with rear output, which can be directed at the same time.

Figure 7:
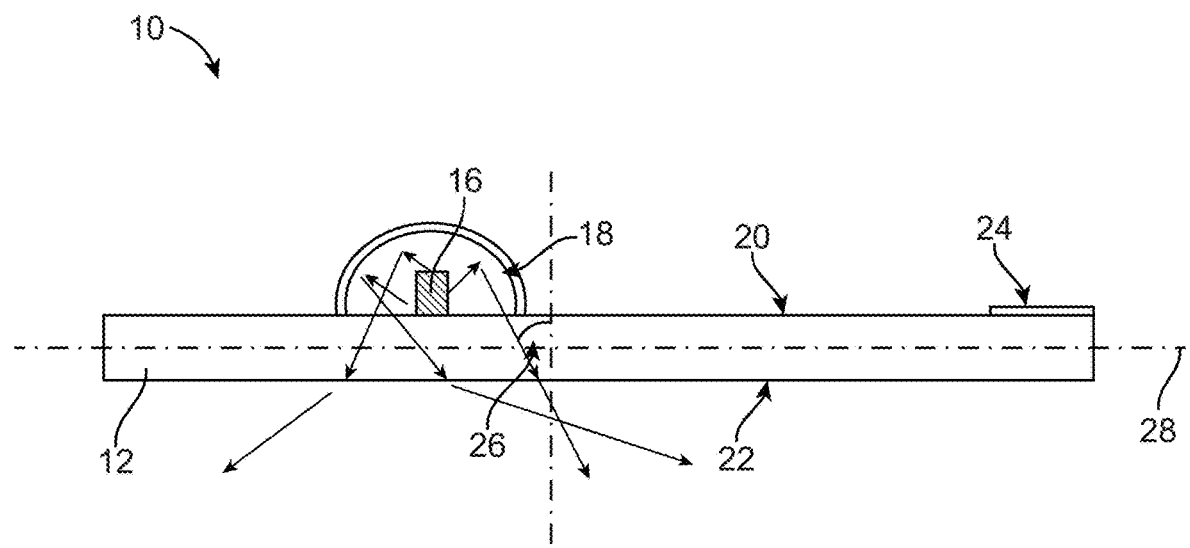
FIG. 7 shows an optical pixel element with a spherical reflector element and control electronics according to some aspects of the proposed concept.

FIG. 7 shows an embodiment of a pixel element 10 with a reflector element 18 according to the invention. First of all, a carrier substrate 12 is also provided here, which often has a large number of µ-LEDs 16 arranged next to each other on an assembly side 20 of the carrier substrate 12. The carrier substrate 12 is usually provided with an electronic control unit 24, which is used to control the individual µ-LEDs 16. For this purpose, electrically conductive connections (not shown) may be provided between the control electronics 24 and the individual µ-LEDs 16. In other cases, as shown below, the carrier substrate can also be transparent or have other structures for reshaping the light.

The reflector element 18 here is designed like a dome and surrounds the µ-LED 16 at least on the side where the µ-LED 16 emits light 14. For example, if the µ-LED 16 emits light 14 in a direction away from the carrier substrate 12, this light hits a surface of the reflector element 18 directed towards the µ-LED 16, is reflected there and returned towards the assembly side 20 of the carrier substrate 12. If necessary, the light propagates with refraction at the interface of the assembly side 20 over a cross section of the carrier substrate 12 in the direction of a display side 22 of the carrier substrate 12 and is coupled out there, if necessary with repeated refraction or diffraction.

The reflector element 18 should have the advantageous shape and properties that light 14 is incident at an angle of incidence 26 as perpendicular as possible relative to a carrier substrate plane 28 on the placement side 20 of the carrier substrate 12. Among other things, this should serve to minimize losses due to total reflection within the carrier substrate 12 as well as unfavourable angles when decoupling from display side 22 of carrier substrate 12. This angle of incidence 26 should be as small as possible, also to minimize crosstalk between adjacent pixel elements 10.

Figure 8:
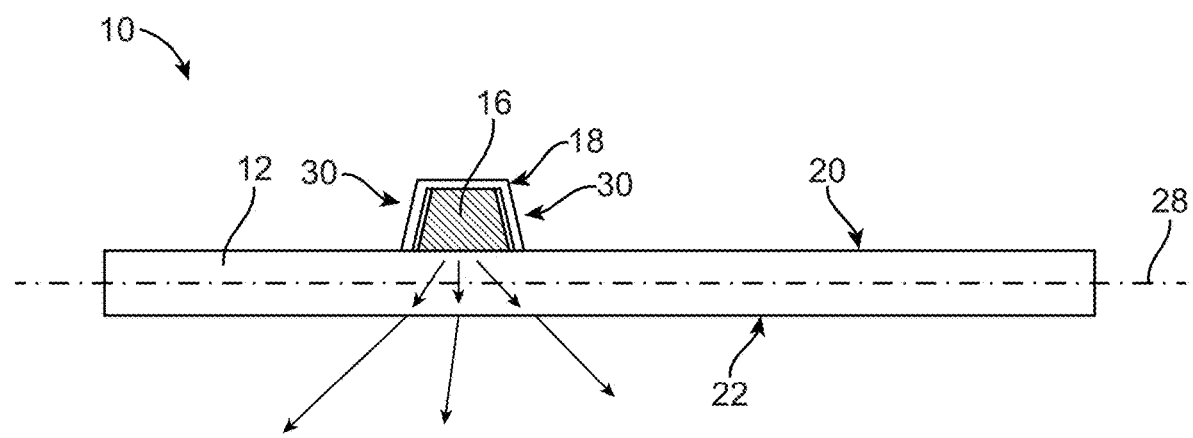
FIG. 8 shows a second embodiment of a pixel element with a reflector element designed as a layer and a passivation layer according to some aspects of the proposed concept.

FIG. 8 shows another example of a pixel element 10 according to the invention with a reflector element 18 configured as a layer on or around a µ-LED 16. This embodiment variant can be useful in that the reflector element 18 can be processed directly onto a surface of the µ-LED 16, for example as a metallic layer. Various materials can be used for the reflector element 18, such as metallic materials, metal alloys or oxides or other suitable compounds that can be applied using the available manufacturing processes. FIG. 6 shows a similar embodiment, in which the µ-LED is made directly from the same material as the carrier substrate. In addition, the reflector element has a specific shape and design. However, the various aspects of FIG. 6 can also be combined with the embodiments shown in FIGS. 7 to 8, among others, and disclosed here.

In addition, a passivation layer 32 is provided at the mesa edges 30 between the µ-LED 16 and the layer of the reflector element 18. This passivation layer 32 has light-absorbing or at least light-blocking properties so that light 14 emitted by the µ-LED in the direction of the carrier substrate plane 28 or in the direction of the mesa edges 30 is attenuated or absorbed. This is to prevent light 14 from passing over in the direction of an adjacent pixel element 10 and causing crosstalk. In addition, the passivation layers 32 can be configured to cause beam-shaping of the emitted light 14.

Figure 9:
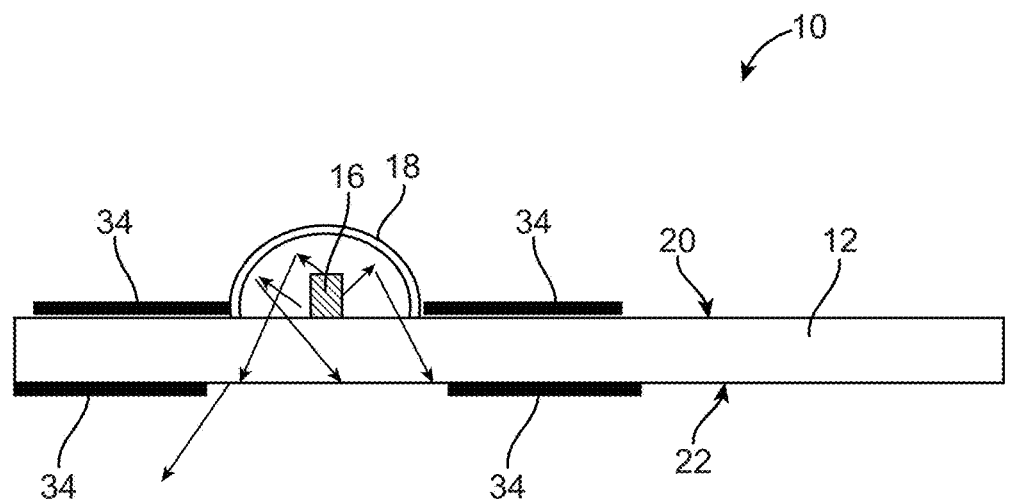
FIG. 9 shows a third embodiment of a pixel element with light-absorbing coatings on a display side and an assembly side of the carrier substrate according to some aspects of the proposed concept.

FIG. 9 shows a pixel element according to the invention with light-absorbing coatings 34 on a display side 20 and an assembly side 22 of the carrier substrate 12. This embodiment features a spherical reflector element 18 surrounding a µ-LED 16, which is arranged on the placement side 20 of the carrier substrate 12. According to this aspect, the carrier substrate 12 is adapted to be transparent or at least partially transparent so that light 14 can propagate within the carrier substrate 12.

In order to improve the dark impression and contrast of a display, light-absorbing layers 34 are provided according to this embodiment, which are applied here outside the reflector element 18 on the carrier substrate 12 on the assembly side 20 and/or on the display side 22. On the one hand, this can prevent light 14 from being coupled out outside a desired active area of the pixel element. On the other hand, an advantageous effect can be that light 14, which propagates inside the carrier substrate 12, is not coupled out outside the desired area on display side 22, but is absorbed or attenuated. For an observer, the light-absorbing layers 34 can be recognized as clearly inactive or black or dark, and due to the better optical demarcation compared to the active luminous areas, improved contrast properties of a display can be achieved.

Figure 10:
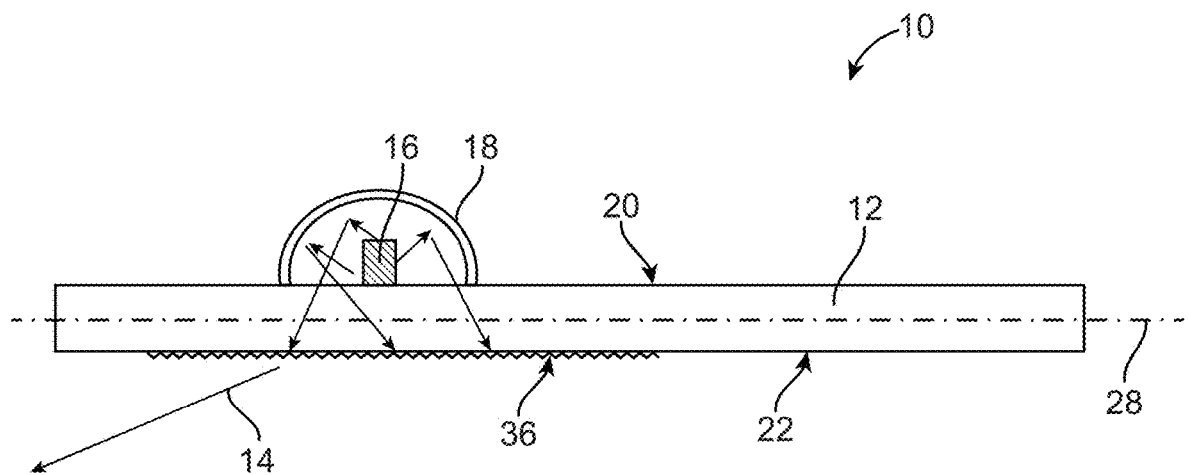
FIG. 10 forms a pixel element with a roughened display side of the carrier substrate.

FIG. 10 illustrates in a simplified way a further version of a pixel element 10 according to the invention. In its basic structure, pixel element 10 corresponds to the examples already shown in FIGS. 7 to 9. Here, a µ-LED 16 is provided on a carrier substrate 12, which is surrounded by a reflector element 18. By reflecting the light 14 at the reflector element 18, light 14 propagates through the carrier substrate 12 and reaches a display page 22 of the carrier substrate 12.

Here it is desirable that as much of the light 14 that has passed through carrier substrate 12 is coupled out of carrier substrate 12 via display screen 22. Here, a roughened surface 36 can cause an improved out-coupling of light 14. More generally speaking, the surface of the display side 22 comprises a structuring, which has additional microstructures at an angle to each other which deviate in their angle from the alignment parallel to a carrier substrate plane 28 and can thus cause additional out-coupling.

Figure 11A:
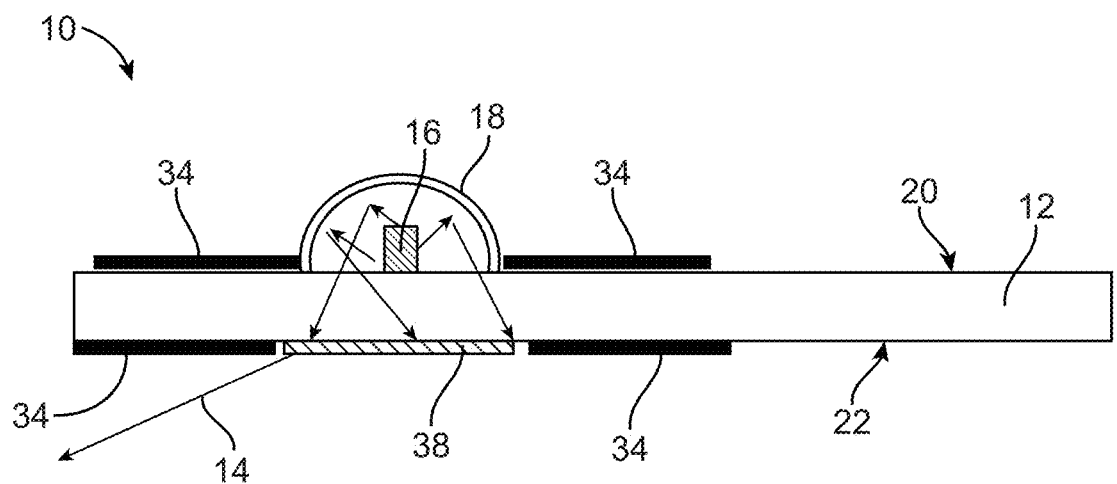
FIGS. 11A and 11B are embodiments based on some of the aspects revealed here, with light absorbing layers to minimize crosstalk and a color filter element on the display side of the carrier substrate.

FIG. 11A shows a pixel element 10, according to the invention, with a color filter element 38 on the display side of the carrier substrate 12 and light-absorbing coatings 34. While the basic structure of the pixel element 10 corresponds to a large extent to that of the previous figures, light-absorbing coatings 34 are also provided here, which are provided both on an assembly side 20 and on a display side 22 of the carrier substrate 12 outside an area of the reflector element 18. In addition, a color filter element 38 is provided here, which is arranged on the display side 22 of the carrier substrate 12 opposite the reflector element 18. For example, a red μ-LED can be provided with a corresponding red color filter element 38. The same applies analogueously to green color filter elements 38 together with green μ-LEDs and, for example, to blue color filter elements 38 together with blue μ-LEDs and the respective emitter chips 16. The advantages here are lower reflectivity and an improved black impression. Here, too, the light-absorbing layers 34 absorb unwanted light components 14 that propagate within the carrier substrate 12.

In an alternative embodiment, again with reference to FIG. 11A, element 38 may also be a color conversion element to convert light of a first wavelength to a second wavelength. The light emitted by the μ-LED 16 and reflected by the reflector element 18 strikes the converter element and is converted there. The basic colors can be produced in this way by using different converter dyes.

Figure 11B:
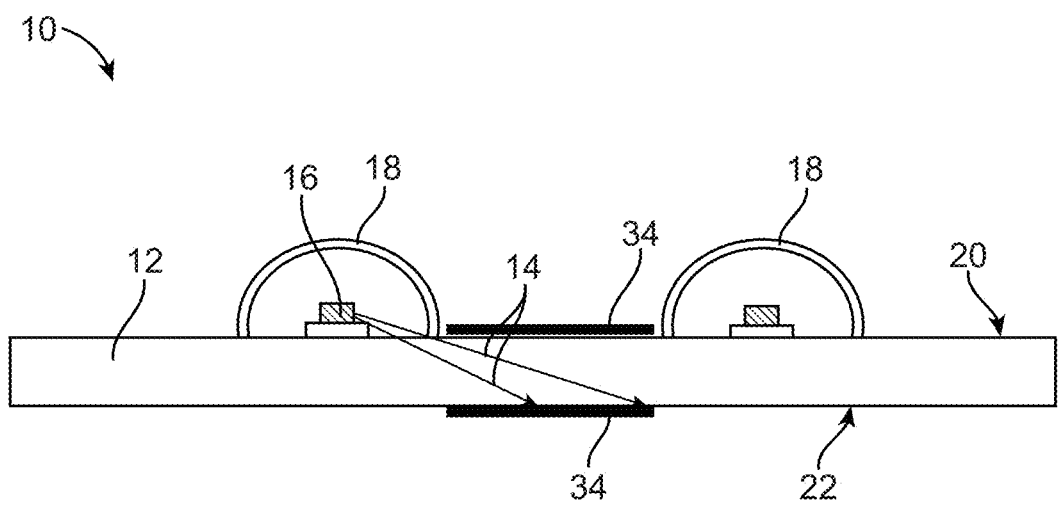

FIG. 11B shows another example of a pixel element 10, where two adjacent pixel elements 10 are arranged on the carrier substrate. Between these two pixel elements, light absorbing layers 34 are provided on the different surfaces of the carrier substrate. This can be used in particular to minimize crosstalk. Depending on the arrangement and design of the μ-LED 16, there is a gap between the μ-LED 16 and the surrounding reflector element 18, which can act as an aperture or aperture edge. This can mean that light 14 emerges through this aperture at a small angle relative to the carrier substrate plane 28 and can pass through the carrier substrate 12 at an angle in the direction of the adjacent pixel element 10.

To prevent this crosstalk, light-absorbing layers 34 are provided between the two pixel elements 10 and between the two adjacent reflector elements 18, respectively. These can be arranged on an assembly side 20 of the carrier substrate 12, but also on a display side 22 of the carrier substrate 12. The light-absorbing layers 34 attenuate or eliminate the then unwanted light components 14 and can thus improve the contrast of a display.

Figure 12A:
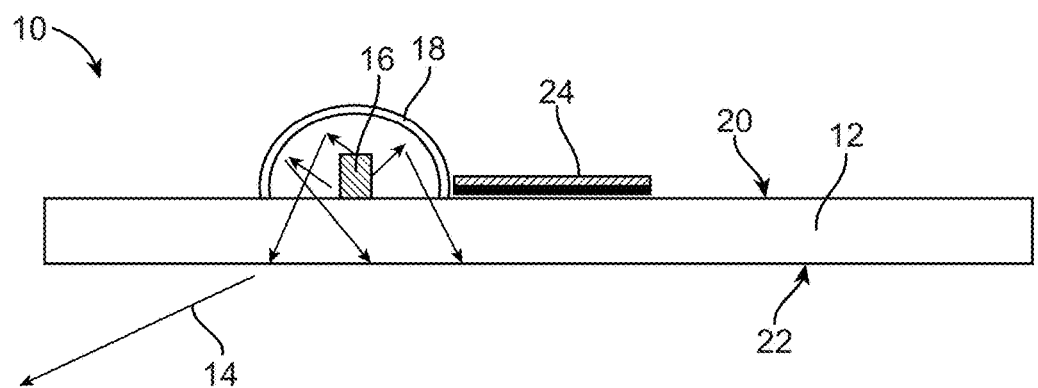
FIGS. 12A and 12B show embodiments of a pixel element with IGZO- or LIPS-based drive electronics on the assembly side of the carrier substrate and optional diffuser layer according to some aspects of the proposed concept.

In FIG. 12A, reference is made to the aspect of the control electronics 24 of a pixel element 10 according to the invention. These may be adapted as part of the carrier substrate 12, with transistor structures, for example, being provided as part of the substrate 12. For the material of the carrier substrate 12, various materials can be considered, such as amorphous silicon, but also IGZO or LIPS. IGZO stands for indium gallium zinc oxide and has partially transparent properties for light and is comparatively inexpensive to manufacture.

If an electronic control unit 24 is designed on the basis of IGZO, it is also conceivable according to an example that the electronic control unit 24 can be arranged within an inner area of a reflector element 18 (not shown here). This possibility is based in particular on the at least partial light transmission of the IGZO material. According to another example, 24 LIPS is used as the basis for the control electronics 24 and LIPS as the material for the carrier substrate 12. LIPS stands for Low Temperature Poly Silicon and can have better electrical properties than IGZO, but with more light absorbing properties.

LIPS can be used for both p-transistors and n-transistors, whereas IGZO is only suitable for p-transistors. An arrangement of the control electronics 24, based on LIPS, must therefore be provided here outside a reflector element 18. A further alternative can be seen in the use of so-called μICs. These are often used together with silicon-based substrates and usually have light-absorbing properties.

A challenge here may lie in miniaturizing these ICs, whereby the electrical performance of the μICs is often higher than that of other variants. Here, too, an arrangement would, according to an example, be made outside an area of a reflector element 18 on the assembly side 20 of the carrier substrate 12. Contacting of the emitter chip 16 can be achieved, for example, via a metallic contact pad on the carrier substrate 12 or via transparent ITO (indium tin oxide).

Figure 12B:
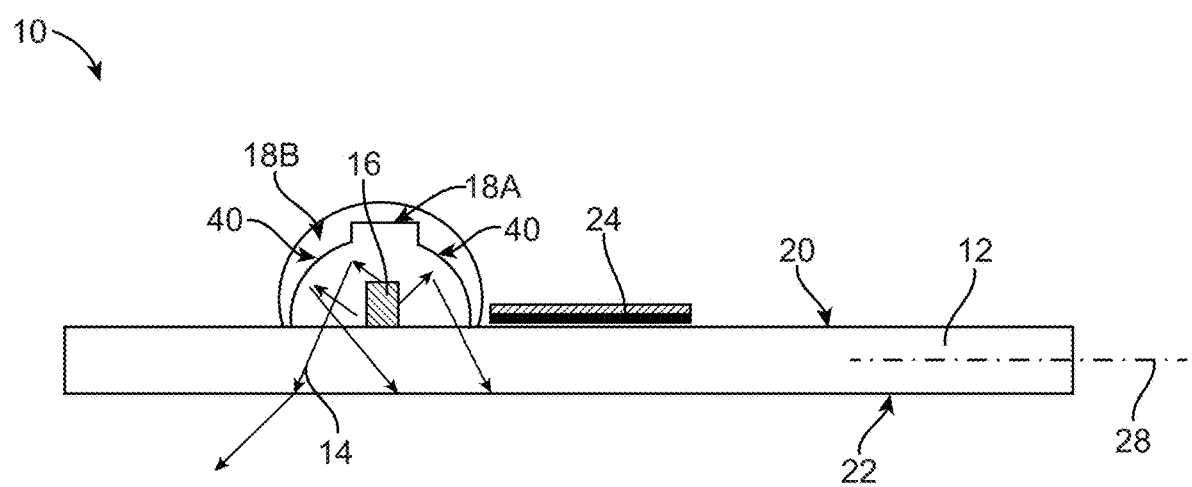

FIG. 12B shows a pixel element 10 according to the invention with a partial coating of a diffuser layer 40 on the reflector element 18. The special feature of the pixel element 10 shown in this embodiment can be seen in a special embodiment of the reflector element 18. Here, a diffuser layer 40 is provided on the lateral inner surfaces of the reflector element 18 (here especially the area 18B). This diffuser layer 40 is intended to cause an increased deflection of the emitted light 14 and a more advantageous deflection of the light 14 in the direction of the carrier substrate 12. It can be advantageous here to provide a thinner or completely missing diffuser layer 40 in an area 18A of the reflector located vertically directly above the emitter chip.

In particular, this diffuser layer 40 can be made flat or even in this area 18A in order to focus the most direct possible back reflection of light emitted transversely to the carrier substrate plane 28 approximately vertically in the direction of the placement side 20 of the carrier substrate 12. A relatively thin diffuser layer 40 can be sufficient for this purpose, since μ-LEDs, due to their properties and construction, come closer to a Lambertian radiation pattern than previous LED technologies. Materials that can be used for this purpose include $Al_2O_3$ or $TiO_2$.

Figure 13:
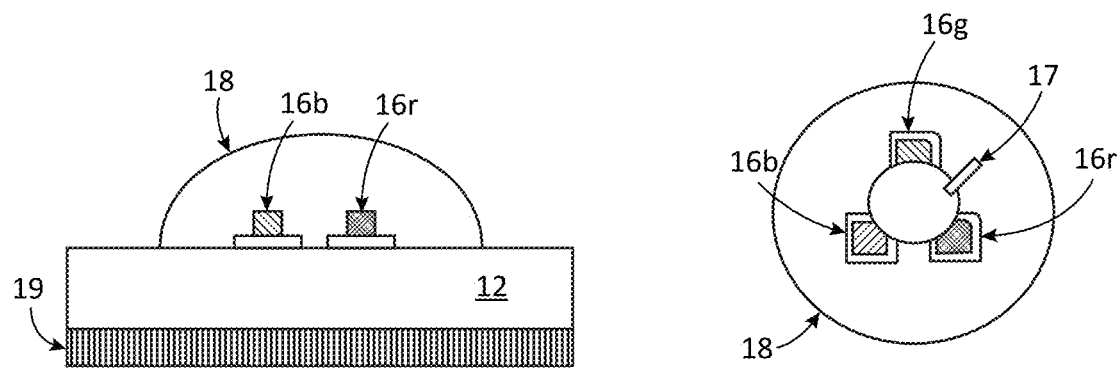
FIG. 13 shows a cross-section and top view of a pixel cell with three μ-LEDs of different colors and a reflector element.

FIG. 13 shows another pixel cell in cross-section and top view. The pixel cell comprises three individual μ-LEDs 16r, 16g and 16b. These are designed to emit the respective basic colors red, green and blue during operation. In this embodiment, the three μ-LEDs are arranged in the corners of a right-angled triangle. However, other arrangements are also possible, for example in a row. Each μ-LED is adapted as a vertical μ-LED, i.e. a common contact is located on the side of the μ-LEDs facing away from the carrier substrate. The μ-LEDs can be individually controlled and can be manufactured, for example, in some versions as shown in FIGS. 49 to 54. Other designs are also conceivable, for example as individual μ-LED modules with or without redundancy. In the illustration on the right, a common transparent cover contact 17 is provided for this purpose, which either completely or at least partially covers the μ-LEDs and thus makes electrical contact. The sidewalls of the μ-LED are insulated and are not connected to the cover electrode 17. In addition, a reflector element 18 is provided which surrounds each of the three μ-LEDs and thus forms a complete pixel.

Light, which is thus emitted in the direction of the reflector element, is reflected by the carrier substrate where it hits a photonic structure 19, which is partly incorporated in the carrier substrate. The photonic structure 19 is designed to redirect the emitted light and emit it as a collimated light beam. Various embodiments of such photonic structures are disclosed in this application, for example in FIG. 17 to 20, 31 to 39 or even 15A to 15C.

The photonic structure can also be omitted depending on the application. For automotive applications, a Lampertian radiation pattern may be more desirable, in which case it is omitted. In the field of Augmented Reality a strong directionality may be desired, which is achieved by the additional photonic structure. In addition to the photonic structure, a converter material can also be provided in addition to the structure or alternatively. In the automotive sector, such directional light applications with white or other colored light are possible.

Figure 14:
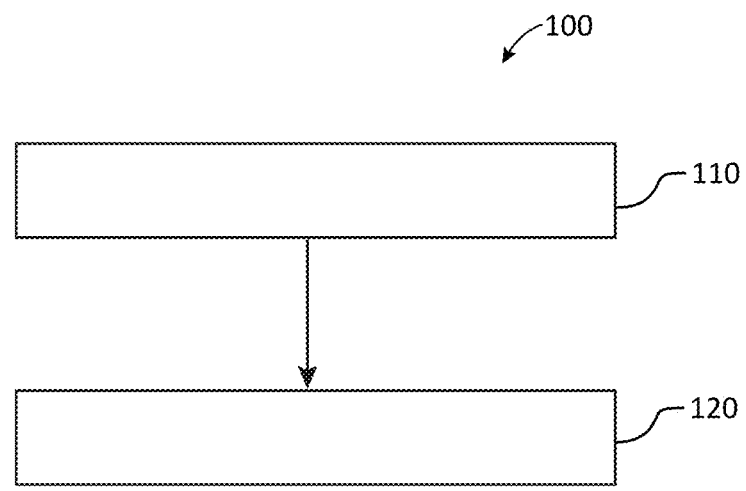
FIG. 14 shows a method for manufacturing an optical pixel element as described above.

Finally, FIG. 14 shows a process 100 for the production of a pixel element 10. First, one or more μ-LEDs are attached to one side of a flat carrier substrate. The attachment is preceded by a corresponding transfer. Details are disclosed in this application.

This is followed in step 120 by creating a reflector element, for example as a reflective layer of the μ-LED. According to an example, before step 110, a display side 22 of the carrier substrate 12 is processed to produce a roughening 36 or rough microstructuring of the surface of the display side 22.

Figure 15A:
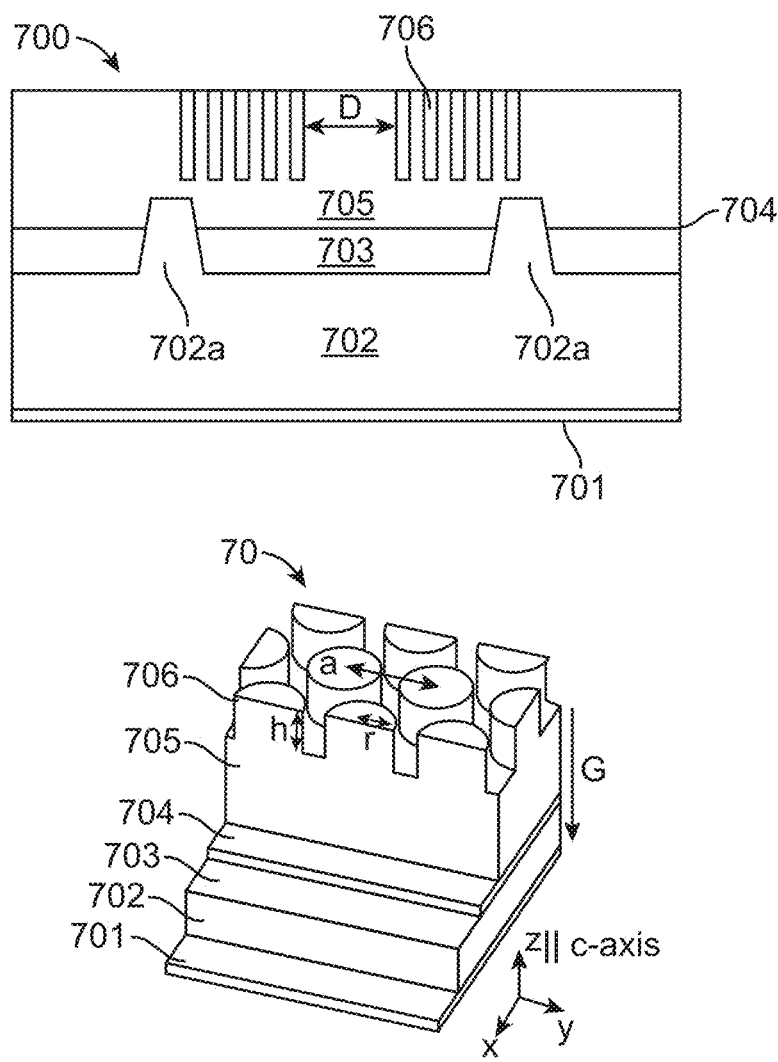
FIG. 15A shows on the left side a cross-sectional view of an exemplary μ-LED and on the right side a perspective view of the optoelectronic device with a photonic structure.
Figure 15B:
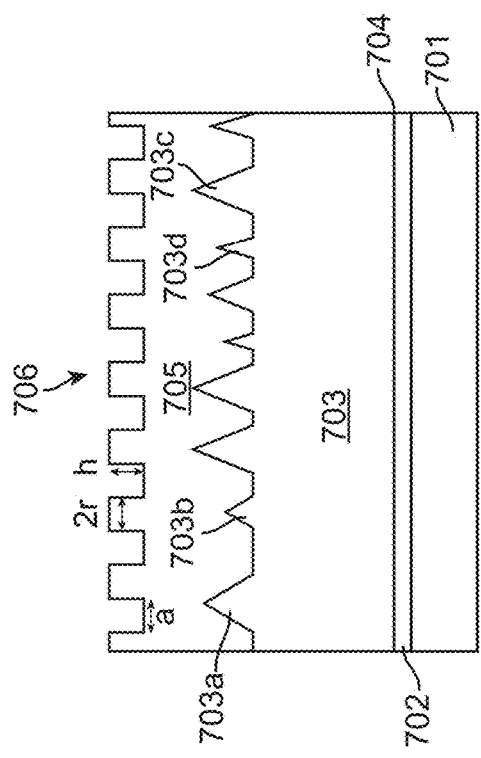
FIG. 15B shows a cross-sectional view of another μ-LED with photonic structure according to some suggested aspects.
Figure 15C:
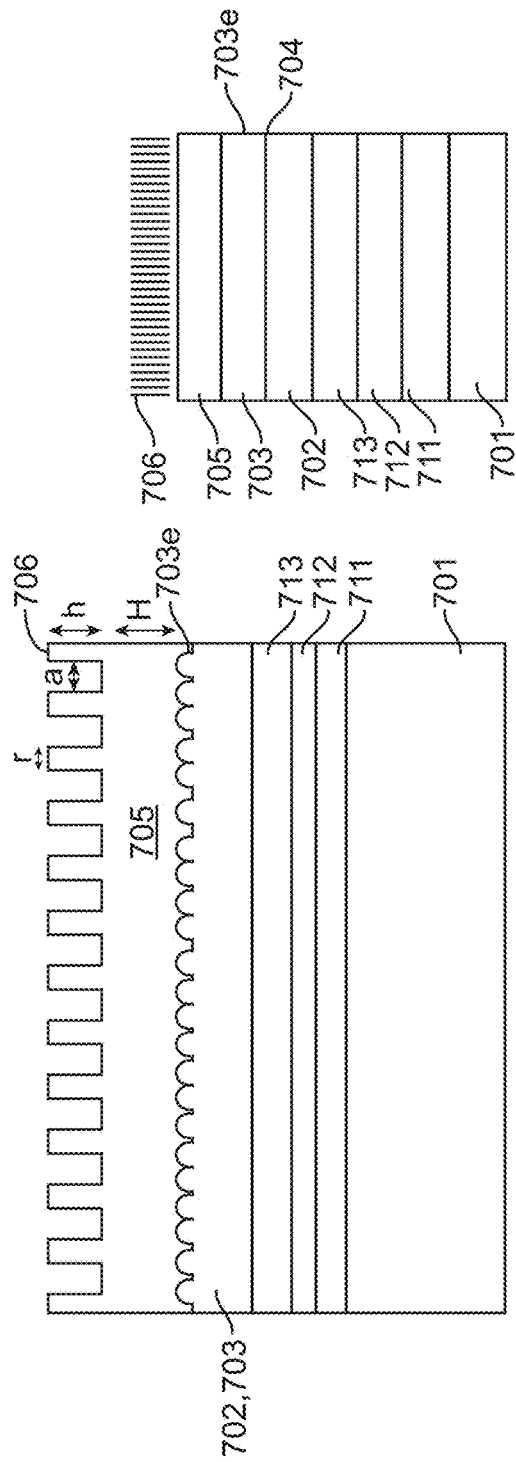
FIG. 15C shows on the left side a more detailed cross-sectional view of another optoelectronic device and on the right side a more schematic cross-sectional view of the optoelectronic device.

One way to reduce the emission angle of μ-LEDs is to indicate structures on the emission surface that reduce the propagation of light parallel to the emission surface. This can be achieved by photonic structures. The photonic crystal structure is basically not limited to a certain material system. The following examples and embodiments will give different ones, which are not limited to a specific design, but are suitable for all embodiments and designs disclosed herein. Furthermore, different semiconductor material systems can be used for the μ-LEDs, especially on GaN, AlInGaP, AlN or InGaAs basis. FIGS. 15A to 15C illustrate different aspects related to the principle of collimation of light by using a photonic crystal.

The exemplary optoelectronic device 700 of FIG. 15A comprises a stack of layers 702, 703 including an active zone 704 for generating electromagnetic radiation, and at least one layer 705 on the main radiation direction, which comprises a photonic crystal structure 706.

For example, layer 702 is a p-doped GaN layer and layer 703 is an n-doped GaN layer. The layer on the underside 701 can be a metallic mirror layer and/or a carrier layer. The growth direction G goes from the top side to the bottom side, or vice versa, and orthogonal to the connecting surface of the layers.

The photonic crystal structure 706 is formed by nanowires with radius r and height h. The wires form a triangular lattice with lattice constant a. However, other lattice geometries such as square lattice are possible. The periodicity and thus the lattice constant a of the photonic crystal structure are such that they are about half the wavelength of the light wavelength to be diffracted. The space between the wires may contain a material, which has a different refractive index than the material of the layer 705. For example, layer 705 may be formed of n-doped GaN. Other materials and $SiO_2$ are also possible.

The layer 702 can be supplied with an extension 702a, which extends through the layer 703 and reaches into the layer 705 but not into the photonic crystal structure 706 as shown in the lower view of FIG. 15A.

The photonic crystal structure 706 can have the effect of improving the concentration of light passing through it. In particular, the photonic crystal structure 706 can provide a virtual bandgap for a region of wavelengths that are perpendicular to the direction of growth. The photonic crystal structure 706 can block this light. In contrast, light that runs along the direction of growth is basically not disturbed by the photonic crystal structure 706. As shown in the upper view of FIG. 15A, the photonic crystal structure 706 in layer 705 can be generated twice or even more. The structures 706 are separated from each other by the distance D.

Alternatively, a single photonic crystal structure 706 can be fabricated to cover the complete layer 705. In this case, more unit cells of the lattice can be arranged in layer 705, which has a positive effect on the properties of the photonic crystal structure, which depend on the periodicity.

In the exemplary device shown in FIG. 15B, layer 702 is not supplied with an extension. However, layer 703, which is adjacent to layer 705 with crystal structure 706, is provided with a roughened surface, as indicated by projections 703a, 703b, 703c and 703d. The roughened surface can be filled with $SiO_2$, for example, to fabricate layer 705 with photonic crystal structure 706.

In the exemplary device shown in FIG. 15C, the layer 703 is formed with a wigwam surface roughening 703e. The layer 705 with the photonic crystal structure 706 may contain $SiO_2$. The photonic crystal structure 706 may be etched into the $SiO_2$ layer. Air or other material may be in the space between the photonic crystal structure.

The photonic crystal structure 706 covers the complete layer 703 and is placed at a distance H from the wigwam surface roughening 703e of the underlying layer 703.

Layer 701 is a carrier layer, layer 711 can be a compound layer, layer 712 is a mirror layer, especially a silver mirror layer, and layer 713 can be a dielectric layer. A mesa dry etch can be performed during device production and after patterning the photonic crystal structure 706.

Figure 15D:
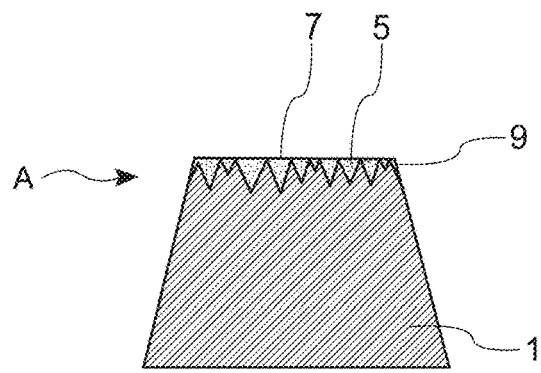
FIG. 15D is a cross-sectional view of a μ-LED with planar surface and photonic structure.
Figure 15E:
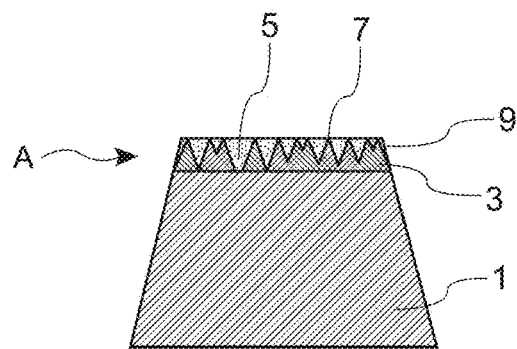
FIG. 15E shows another embodiment of a μ-LED with photonic structure in cross-sectional view.
Figure 15F:
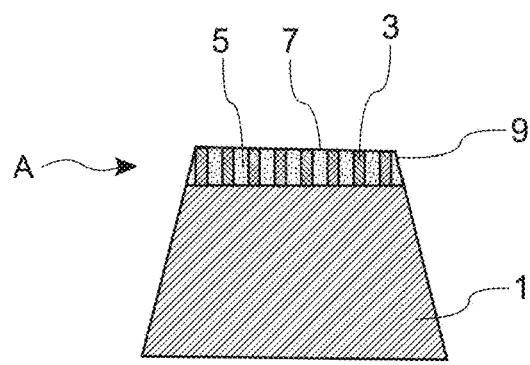
FIG. 15F illustrates another embodiment of a μ-LED with photonic structure in cross-sectional view according to some aspects of the proposed concept.

The different photonic decoupling structures create a certain roughness and surface structures on the surface, depending on their design. Therefore, the surface should be planarized to facilitate a possibly necessary later transfer. FIGS. 15D to 15F show different aspects of surface planarization according to one of several methods of making photonic structures on a μ-LED.

Generally, a large number of μ-LEDs are first formed in or on a wafer, then their surface is structured and then, if necessary, separated. Modules of μ-LEDs and other designs are part of this application. It is clear from this that the μ-LEDs come in different designs. The following surface treatment is thus independent of the later processing and is suitable for (later isolated) μ-LEDs, μ-LED modules and also pixelated optochips with a plurality of μ-LEDs.

According to FIG. 15D, a μ-LED is epitaxially formed with an active layer in a semiconductor body. The active layer is not shown here. The μ-LED comprises in its surface area, which is covered by the likewise not shown carrier, a non-ordered, i.e. random out-coupling structure A, which is formed from the same semiconductor material as the semiconductor (or parts thereof). The structured surface region therefore adjoins the doped layers. The resulting roughness is smoothed again by applying another transparent material of SiO$_2$ by means of TEOS (tetraethylorthosilicate) and subsequently planarizing it. The decoupling structure improves the decoupling. It is particularly suitable for the extraction of the light emitted by the active layer. This also reduces optical crosstalk of an adjacent µ-LED with a different wavelength.

The other transparent material shows a low refractive index, especially less than 1.5, which improves the decoupling from the structured area (higher refractive index). Afterwards the other material is removed by CMP process to form the smooth surface 7 of the structured surface area 9. As shown, the removal is either carried out up to the highest areas of the structured area or a surface of the material 5 is generally left over. In this respect, a gradual transition from a high refractive index via the lower refractive index of the material 5 to air results.

In addition to SiO$_2$ material 5, crown glass with a refractive index of e.g. 1.46, PMMA with a refractive index of e.g. 1.49 and quartz glass with a refractive index of e.g. 1.46 can be used. These refractive indices result at the wavelength 589 nm of the sodium D-line. A refractive index of silicon dioxide, for example, is 1.458.

FIG. 15E shows a second example of a µ-LED with an output structure. To improve light out-coupling, a transparent second material 3 with a high refractive index is applied to the planar or structured surface of the µ-LED and structured in a suitable way.

For example, a suitable second material 3 with a high refractive index greater than 2 is Nb$_2$O$_5$ with a refractive index of 2.3. Other usable materials with a high refractive index are for example zinc sulphide with a refractive index of for example 2.37, diamond with a refractive index of for example 2.42, titanium dioxide with a refractive index of for example 2.52, silicon carbide with a refractive index of for example 2.65 and titanium dioxide with a refractive index of for example 3.10. These refractive indices result in particular at the wavelength 589 nm of the sodium D-line. Other materials can also be used.

The structuring of surface area 9 is done, as in FIG. 15D, by creating a random topology on surface area 9. While according to FIG. 15D the random topology is created by directly roughening the surface 7 of the surface region 9 of the semiconductor body comprising a first material 1, according to FIG. 15E the random topology is formed by first depositing the transparent second material 3 and then roughening it.

After the topology has been created, the rough surface is smoothed by applying the transparent material 5 described above to the rough surface and then planarizing it.

FIG. 15F shows a third example of a µ-LED, but this time with an ordered topology. This is explained in detail as in the examples in this application by depositing the transparent second material on the surface. A periodic photonic crystal structure is then introduced into the second transparent material. Alternatively, photonic properties can be achieved by non-periodic structures, especially quasi-periodic or deterministic aperiodic structures.

Alternatively, periodic photonic crystals or non-periodic photonic structures, in particular quasiperiodic or deterministic aperiodic photonic structures, can in principle be directly incorporated into the first material 1 of the semiconductor body without a second material 3.

After the photonic structure has been formed, the interstitial spaces are filled with a transparent material with a lower refractive index. The transparent third material 5, in particular SiO$_2$, is planarized, resulting in a smooth and even surface. As shown in FIG. 15F, both the surface of material 3 and the interstitial material 5 are flat. However, in an alternative embodiment, the transparent third material 5 extends beyond the structure of material 3, so that the surface is completely formed from material 5. In this way, an out-coupling efficiency can be improved compared to an unmachined surface. A transfer process using stamp technology remains possible because of the smooth and even surface.

Figure 16:
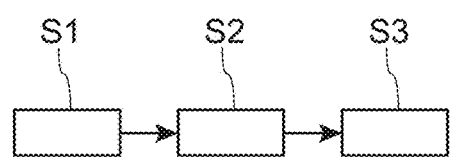
FIG. 16 shows an embodiment of a method for producing one of the structures shown in FIGS. 15D to 15E.

FIG. 16 shows an example of a proposed method. In a first step S1 an output structure A is formed on a surface of a µ-LED. This is done by structuring the surface. It is possible to structure the semiconductor material directly or to provide such a structuring after the deposition of a further material. For this purpose, the surface is covered with a photomask, which is then exposed to light, thus defining the structures. The surface is structured by various other processes including various etching steps. In step S2, another transparent material is deposited in the spaces created after etching. The transparent material covers the previously created structure. Subsequently, in step S3 the surface is planarized by CMP or other suitable processes and removed to approximately the height of the structures. The structured µ-LED thus produced can be further processed, separated and transferred.

Figure 17:
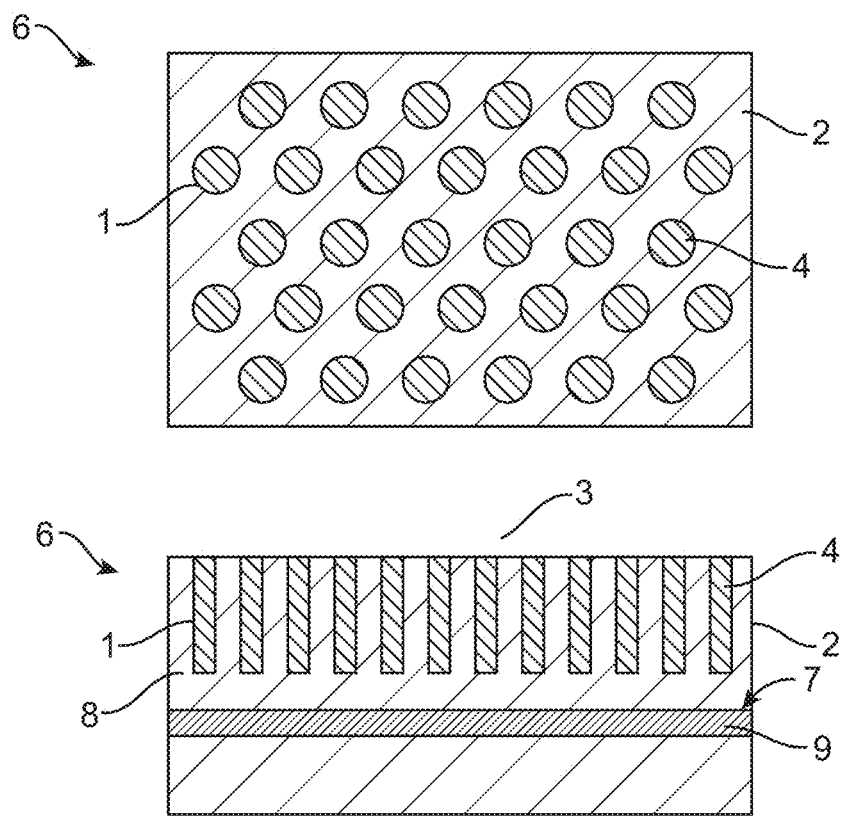
FIG. 17 illustrates a top view and sectional view of an optoelectronic device with a μ-LED and converter element according to some aspects of simultaneous light shaping and light conversion.

FIG. 17 shows in a top view and a sectional view a radiation source 6 in the form of a µ-LED and with a layer 2 arranged in a semiconductor substrate 8 of the µ-LED 7, which comprises a photonic structure 4 with a suitable converter material. This is based on the idea of creating a unification of light-shaping and converting structure so that a particularly space-saving arrangement of the individual elements and thus a particularly small design of an optoelectronic component is possible. The structured layer 2 with the converter material forms a converter element 1, whereby the converter material emits converted radiation into a radiation emission area 3 of the radiation source 6 when excited by the excitation radiation emitted by the LED 7.

The structure 4 provided in layer 2 with the converter material is designed in such a way that the converted radiation is emitted exclusively as a directed beam in a specific radiation area 3. According to the embodiment shown in FIG. 17, the converted radiation is emitted perpendicular to a plane in which the µ-LED chip with its semiconductor substrates is located.

The structured layer 2 shown in FIG. 17 is a two-dimensional photonic crystal etched into the LED semiconductor substrate above the active layer of the µ-LED. The individual, here rod-shaped and periodically arranged recesses of structure 4 have been filled with the converter material. The layer thickness of structure 4 is at least 500 nm, so that a band gap is created in the crystalline solid-state material, which causes a directionality of the converted radiation emitted by converter element 1. In this example, the recesses are round and arranged in a hexagonal pattern in the center of which a recess is also arranged. However, the recess itself can also take other shapes, for example hexagonal or square. Round recesses have the advantage that they are easier to produce. The recesses show the same distance and have the same size. This circumstance is also due to the application.

For example, the recesses can be of different sizes or have different spacing. This results in a different periodicity, so that a different optical band gap is formed. In a similar embodiment, the recesses can have a first periodicity in a first direction (i.e. first distance from each other and size) and a second periodicity in another, e.g. orthogonal direction. This result in a different band gap in the two spatial directions and a wavelength-dependent selection can be made. With a suitable setting, a full conversion of the incident light is possible, so that the µ-LED emits converted light substantially parallel to the recesses.

Such a photonic structure can significantly increase directionality and thus efficiency, especially of etendue-limited systems. Due to the provision of a layer 2 with a corresponding structure 4 and suitable converter material directly on the surface of the µ-LED 7, the otherwise additionally provided optical elements can be dispensed and thus a comparatively small radiation source can be realized by exploiting the invention. In addition, a particularly efficient radiation source is made available, since on the one hand, no light is emitted in an unneeded direction that is not perpendicular to the LED chip surface, and on the other hand, all the converted light can be used. Furthermore, modes of the excitation radiation emitted by the µ-LED 7, which are guided in the active zone 9 and have a low extraction efficiency from the µ-LED 7, can be efficiently converted.

Figure 18:
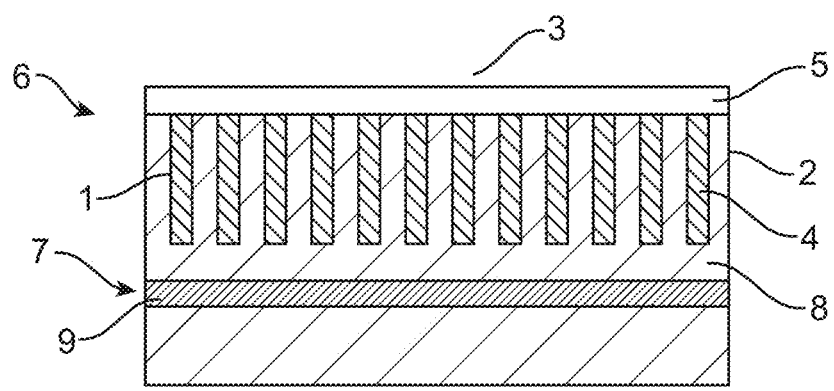
FIG. 18 shows a cross-section through an optoelectronic component in a further version according to some aspects of the proposed concept.

In addition, FIG. 18 shows the sectional view of a radiation source 6, which is configured as explained in connection with FIG. 17, but additionally has a filter element 5 applied to the top layer of the radiation source 6 in the form of a filter layer 5, which is opaque to radiation of selected wavelength ranges. The filter layer 5 has the function of a color filter.

Such a technical design is particularly suitable for radiation sources 6, in which a µ-LED 7 and a converter element 1 are combined in such a way that the light emitted by the µ-LED 7 is fully converted. With the aid of a suitably designed filter layer 5, the radiation emitted in the emission range 3 can thus be limited to radiation with a desired wavelength. Such a filter layer 5 also ensures that the excitation radiation emitted by LED 7, which is not converted into converted radiation by converter element 1, is prevented from escaping into emission range 3 by means of filter layer 5 if necessary.

In an alternative embodiment, layer 3 of FIG. 18 assumes an out-coupling function in order to appropriately couple out the light formed by the photonic structure. However, a combination of these two functionalities is also possible. In this context, layer 3 can also be structured, for example roughened, in order to better couple out the light.

FIG. 19 again shows a radiation source 6, which has a µ-LED 7 and a converter element 1 applied to a semiconductor substrate 8 of the µ-LED 7. Converter element 1 comprises a layer 2 with converter material and a structure 4, which is applied to a semiconductor substrate 8 of LED 7. The structured layer 2 is preferably a photonic crystal, a quasi-periodic or deterministically aperiodic photonic structure. The structure 4 of layer 2 is filled with suitable converter material.

In contrast to the embodiment explained in FIG. 17, however, the structured layer 2 is not only arranged in a semiconductor substrate in the upper area of the radiation source 6, but extends into the active zone 9 of the µ-LED 7. Again, a structured layer 2 with a layer thickness greater than 500 nm is provided, thus creating an optical band gap. Also in this case, modes of the excitation radiation emitted by the µ-LED 7, which are guided in the active zone 9 and have a low extraction efficiency from the LED, can be efficiently converted.

Figure 19:
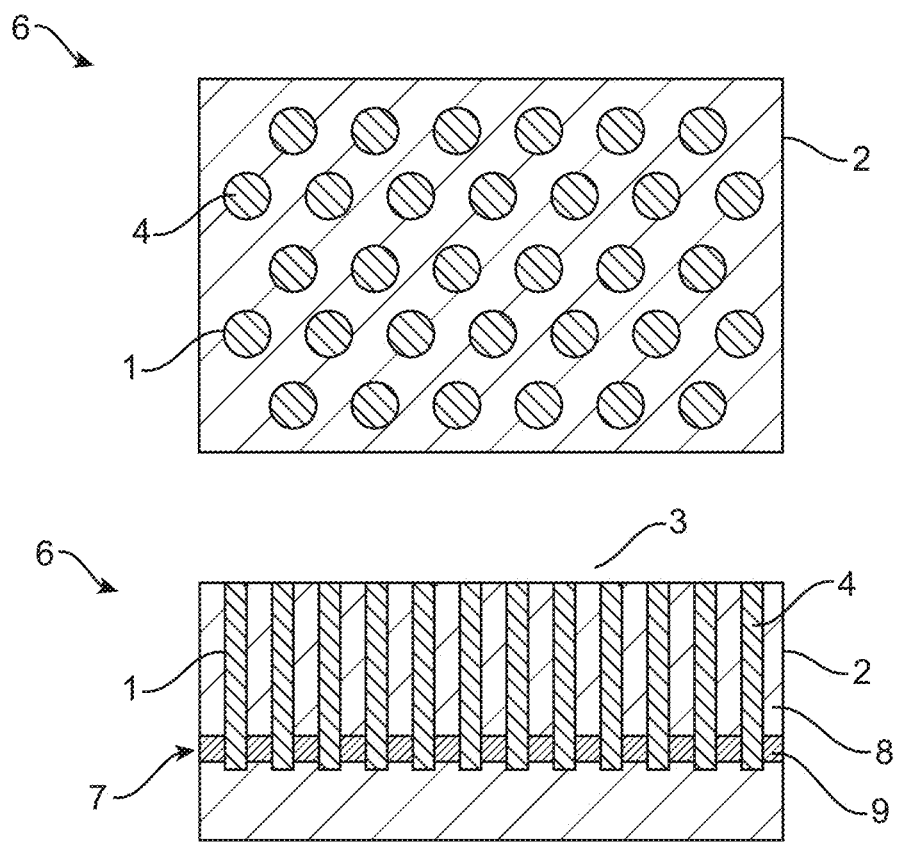
FIG. 19 is a top view and sectional view of another component.
Figure 20:
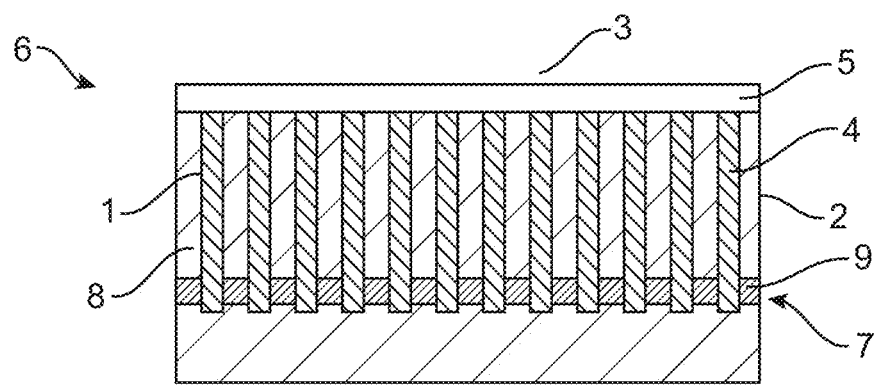
FIG. 20 shows a cross-section through a component with a μ-LED and a converter element according to some aspects of light shaping and light conversion.

In addition, FIG. 20 shows a configuration of a radiation source 6, which is configured as shown in FIG. 19 and additionally has a filter element 5 applied to the top layer of the radiation source 6, which is designed in the form of a filter layer serving as a color filter. Such color filters offer the possibility to limit the emission of the converted radiation into the emission range in case of a full conversion of the excitation radiation emitted by the µ-LED 7 or to selectively suppress the emission of unconverted excitation radiation in case of a not complete conversion.

Figure 21A:
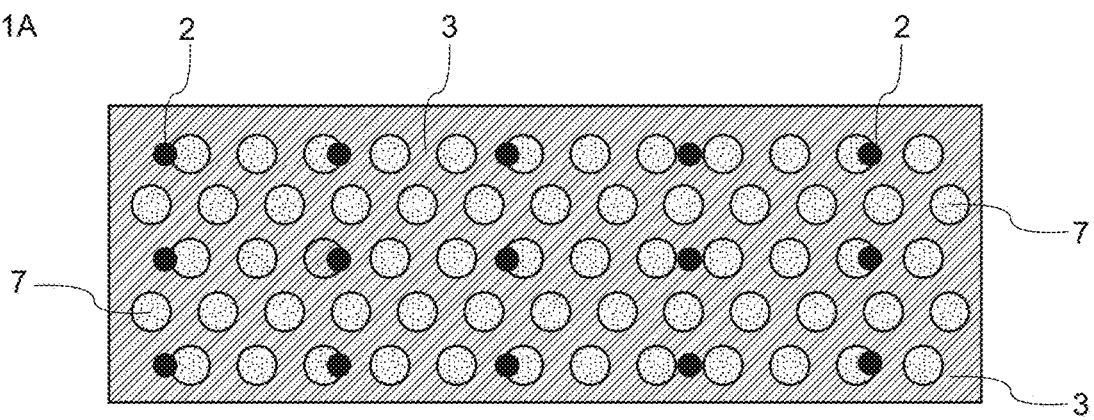
FIGS. 21A and 21B show a μ-display with several light-emitting units and a photonic structure in a top view and cross section according to some aspects of the concept presented.
Figure 21B:
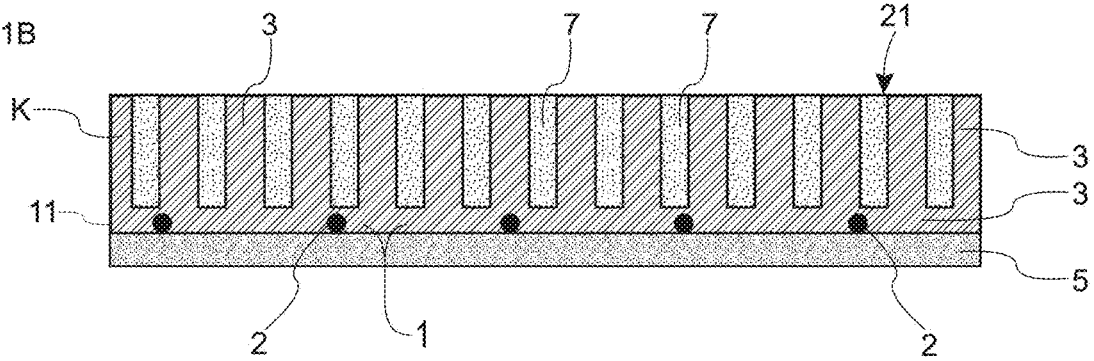

FIGS. 21A and 21B show a µ-display with a photonic structure for the emission of light that preferably emerges vertically from a light emission surface 21. The device comprises an array 11 having pixels, wherein optically acting nanostructures in the form of a photonic crystal K are formed over the entire emitting surface of the light exit surface 21. The array 11 also comprises an array-like arrangement of light sources, each of which comprises a recombination zone 2, which lies in a recombination plane 1.

The recombination zones 2 are formed in a first layer of optically active semiconductor material 3 of array 11. The zones 2 can comprise quantum dots, one or more quantum wells or even a simple pn junction. In order to obtain more localized recombination regions, it may be intended to limit recombination to predefined areas by current confinement or other structural measures.

In the layer with the semiconductor material 3, the photonic crystal or photonic crystal structures K are structured, namely in the form of a two-dimensional photonic crystal. The photonic crystal K is located between the recombination zones 2 and the light-emitting surface 21. The photonic crystal structures K can be arranged independently of the positioning of individual pixels, whereby in the example shown one pixel corresponds to one or three light sources with a recombination zone 2. Three light sources, therefore, so that any color can be produced by suitable color mixing.

The optically active photonic crystal structures K are filled free-standing in air or, as shown, with a first filling material 7, in particular electrically insulating and optically transparent, in particular $SiO_2$, with a refractive index which is lower than the refractive index of the semiconductor material 3. The filling material 7 preferably also comprises a low absorption coefficient.

In the array 11, both electrical poles of each light source are electrically connected by means of an optically reflective contact layer 5 for the electrical contacting of the light sources. The contacting layer 5 is located on a side of the optically active semiconductor material 3 facing away from the optically active photonic crystal structures K and is arranged below as shown in FIG. 21B. This type of contacting enables very strongly localised recombination zones 2. For this purpose, the contacting layer 5 comprises at least two electrically insulated areas in order to be able to connect the poles electrically separately.

The photonic crystal K can be structured over the entire emitting surface 21 in such a way that at least approximately only light with a propagation direction perpendicular to the surface 21 can leave the component. If the photonic crystal K is close to the recombination plane 1 and the layer thickness of the photonic crystal K is large in comparison to the distance to the recombination zone 2, the optical density of states in the area of light generation is additionally changed.

This makes it possible to generate a complete bandgap for optical modes with propagation direction parallel and at a small angle to the surface of the, in particular, planar, i.e. in particular flat and/or smooth, pixel-containing array 11. The emission of light with propagation direction parallel to the emitting surface is then completely suppressed.

In particular, light can only be generated in a limited emission cone, which is defined by the photonic crystal K. In this case, directionality is already ensured at the level of light generation, which effectively increases efficiency compared to an angle-selective optical element, since such an element only influences light extraction.

The alignment of the photonic crystal K is independent of the positioning of the individual pixels, especially in such a way that an alignment of the pixel structure to the photonic structure K is not necessary and processing of an entire wafer surface is possible. It is a reasonable embodiment if the device is homogeneous in its optical properties over the entire surface of the array 11 or varies only slightly so as not to disturb the optical environment of the photonic crystal K.

Figure 22A:
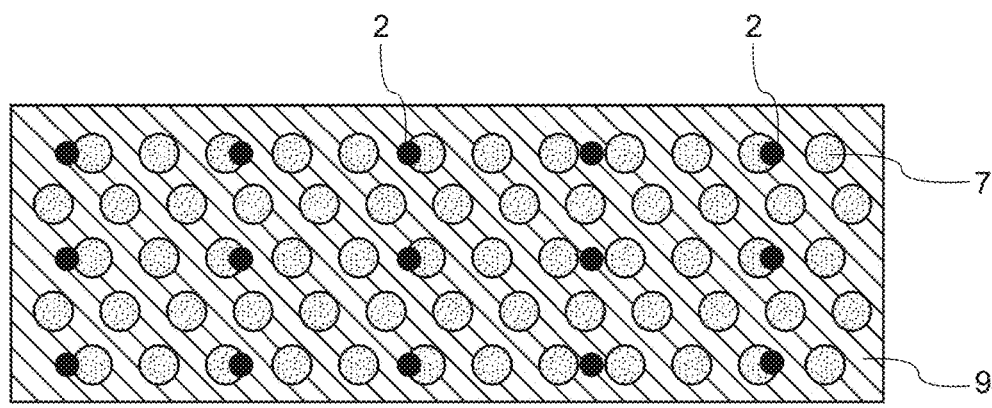
FIGS. 22A and 22B represent a second embodiment of a μ-display with a photonic structure in a top view and cross-section according to some aspects of the presented concept.
Figure 22B:
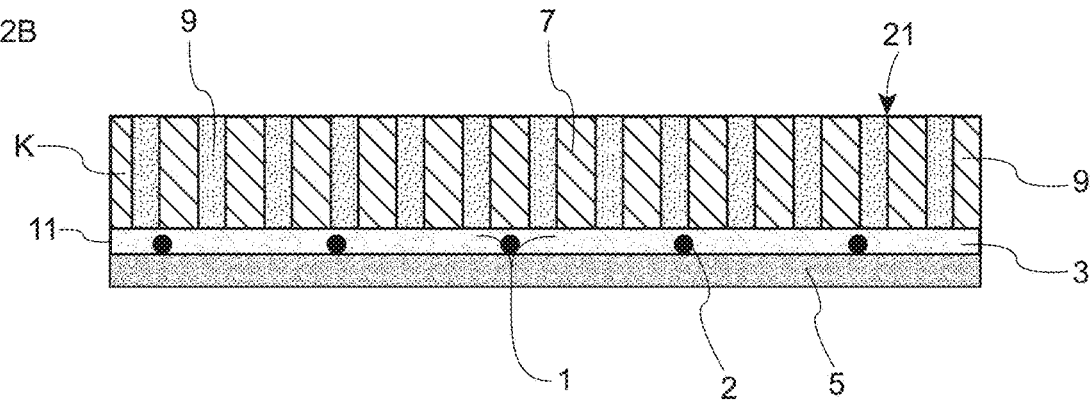

FIGS. 22A and 22B show a second proposed optoelectronic device in a plan view and in cross-section respectively. In the pixelated array 11, the photonic crystal K is arranged in a second layer of a material 9, in particular $Nb_2O_5$, above a first layer of the optically active semiconductor material 3, as an alternative to the embodiment shown in FIGS. 21A and 21B. The material 9 thereby has a large optical refractive index and it is arranged on the flat and/or smooth surface of the semiconductor material 3. Preferably, the material 9 also comprises a low absorption and is therefore very transparent. The contacting is similar to that shown in FIGS. 21A and 21B and allows very localized recombination zones 2.

Alternatively, some embodiments may provide that the material is also electrically conductive. This is especially useful if the different pixels are designed with vertical µ-LED packages and are to be connected to a common contact.

As shown in FIGS. 21A and 21B, columns are formed from the material 9 and the photonic crystal K is in turn formed as a free-standing two-dimensional photonic crystal. The space between the columns is filled with a different material with a lower refractive index than in FIGS. 21A and 21B. A possible filling material is for example $SiO_2$.

Figure 23A:
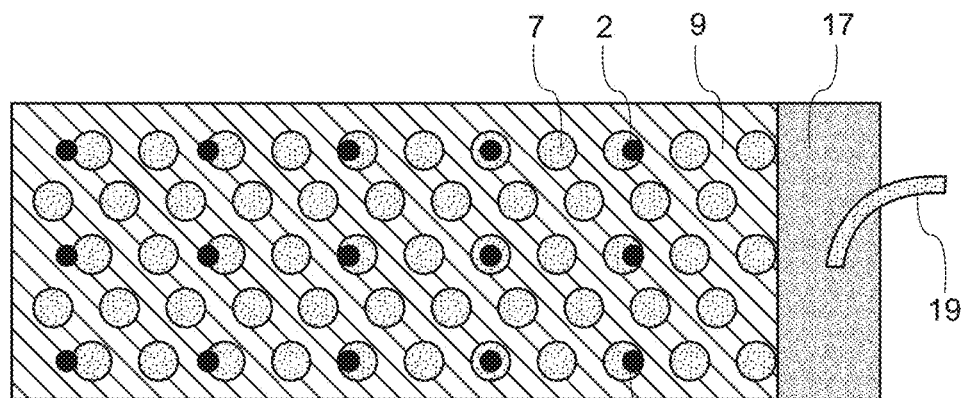
FIGS. 23A and 23B show a third embodiment of a μ-display with several μ-LEDs of a photonic structure in a top view and as a cross-section according to some aspects of the presented concept.
Figure 23B:
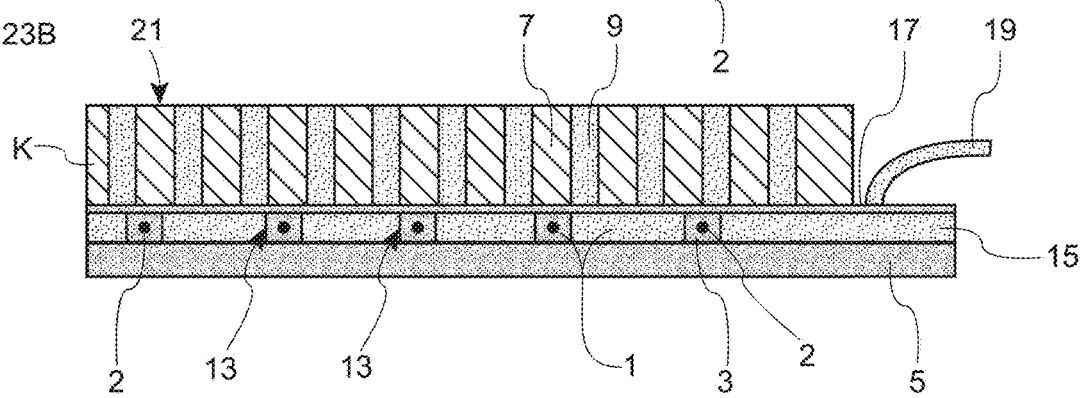

FIGS. 23A and 23B show a third proposed optoelectronic device in a top view and in a cross-section, respectively. The device shown comprises as light sources an array of vertical µ-LEDs 13 and a two-dimensional photonic crystal structure K arranged in an overlying layer, which extends over the entire emitting surface 21 and is formed from a material 9 with a high refractive index. The free space of the structure K is in turn filled with filler material 7 with a lower optical refractive index.

The vertical light-emitting diodes 13 have an upper and a lower electrical contact along a vertically oriented longitudinal axis, which is perpendicular to the light-emitting surface 21. The light-emitting diodes thus comprise an electrical contact on the front side and an electrical contact on their rear side. The rear side is the side of the µ-LEDs 13 facing away from the light emission surface 21, while the front side faces the light emission surface 21.

The device comprises an electrically conductive and the generated light reflecting contacting layer 5 for the electrical contacting of the contacts on the back of the LEDs 13 The contacting layer 5 is designed in such a way that the individual µ-LEDs can be controlled separately. For the electrical contacting of the contacts on the front of the LEDs 13, a third layer is provided, which comprises an electrically conductive and optically transparent material 17, for example ITO. An electrical connection to the corresponding pole of a power source can be established via a bonding wire 19.

In and along the recombination level 1, a further, in particular electrically insulating, filling material 15 can be arranged between the third layer and the optically reflective contacting layer 5. This electrically separates the µ-LED from each other. In addition to this structure shown here, other pixelated components disclosed in this application may also be provided with the structure K. These include, for example, the disclosed antenna structures, the µ-LED in bar form or the µ-LED modules. Likewise, in all the embodiments shown here, reflective structures may be provided in layer 5 which deflect the light in the direction of the exit surface. These include the structures surrounding the actual µ-LED, which are disclosed in this application.

Figure 24A:
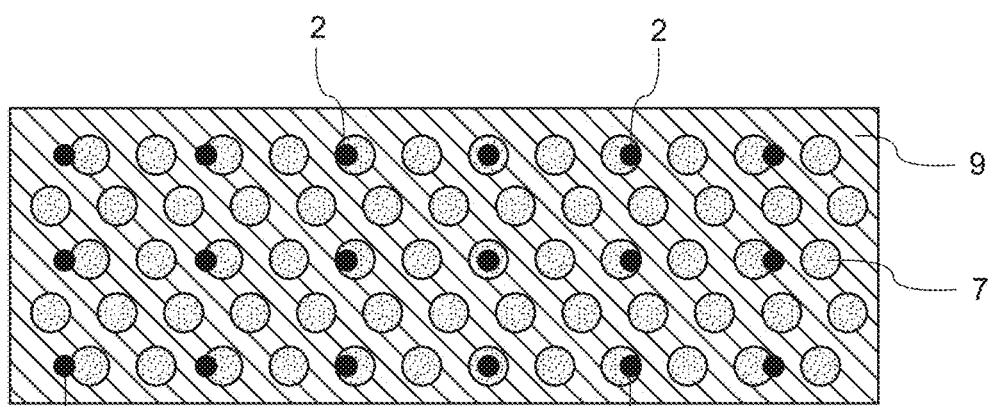
FIGS. 24A and 24B are part of a fourth embodiment of a μ-display with a photonic structure in a top view and as a cross-section according to some aspects of the concept presented.
Figure 24B:
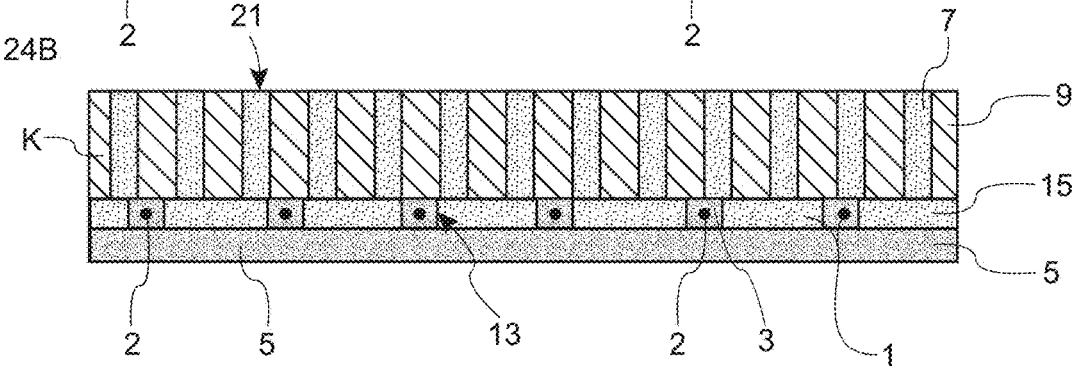

FIGS. 24A and 24B show a fourth version of a µ-display in a top view and cross-section. The µ-display or module device comprises an array of horizontal µ-LEDs 13 with respective recombination zones 2 and an optically effective two-dimensional photonic crystal structure K below the total emitting surface 21. The photonic crystal structure K is located in a layer of a material 9 with a high refractive index, for example $Nb_2O_5$. Free spaces are in turn filled with filling material 7, for example silicon dioxide, with a lower optical refractive index.

In the case of the horizontal LEDs 13, both electrical contacts are located on the rear of the LEDs 13. Both poles of the LEDs 13 are electrically connected by means of electrically separated areas of the optically reflective contact layer 5. In the area of the recombination level 1, a filling material 15, in particular an electrically insulating one is arranged between the material layer 9 and the contacting layer 5.

The efficiency with respect to light generation is relatively high in the embodiments according to FIGS. 21A to 24B, since in these embodiments directionality or directionality of the light is already achieved during light generation, especially if a higher photonic state density can be achieved in the area of the recombination zones 2 for the emission of light in the direction perpendicular to the light exit surface by means of the band structure of the photonic crystal K. A further advantage is that the structuring of the photonic crystal K can be carried out homogeneously over an entire wafer. A certain positioning or orientation of the photonic crystal to the individual pixels or micro light emitting diodes is not necessary. This will significantly reduce manufacturing complexity, especially compared to alternative approaches where structures are placed individually over each pixel.

Figure 25A:
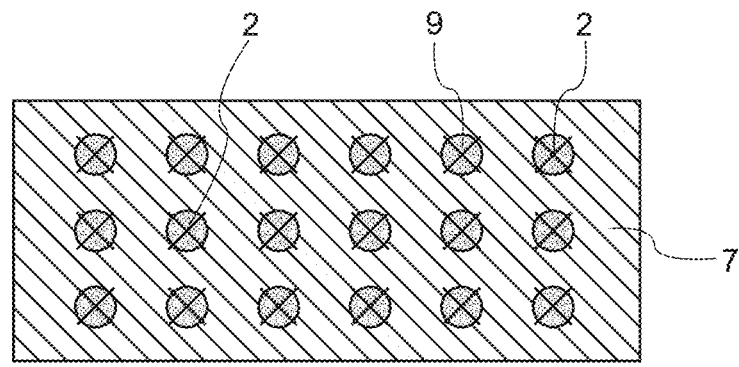
FIGS. 25A and 25B show a fifth embodiment of a μ-display with a photonic structure in a top view and as a cross-section according to some aspects of the presented concept.
Figure 25B:
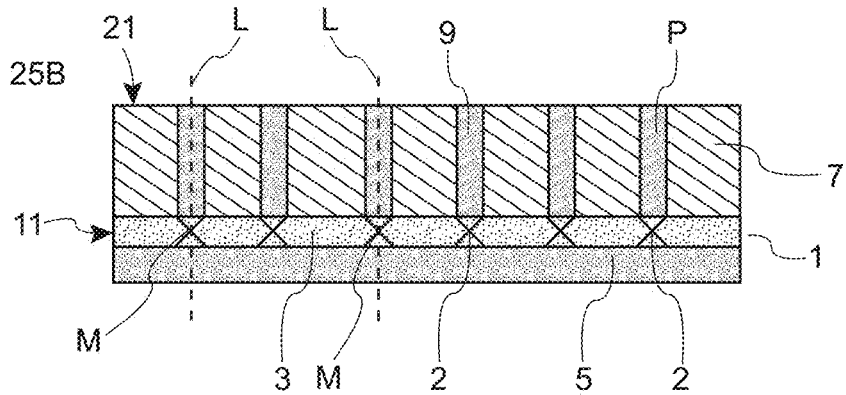

FIGS. 25A and 25B show a fifth proposed optoelectronic device in a top view and cross-section. The device comprises a pixelated array 11 and optically acting columnar or pillar structures P, in particular with pillars or columns structured over the entire emitting surface 21. The array 11 is smooth and flat on its surface.

The pixelized array 11 in this configuration comprises a large number of subpixels, each with a light source that includes a respective recombination zone 2. The recombination zones 2 of the pixels are located in a recombination plane 1 and they are arranged in a first layer with optically active semiconductor material 3.

Above this first layer the pillar structures P are formed. One pillar P is assigned to a light source, so that each Pillar P is located directly above the recombination zone 2 of the assigned light source. A longitudinal axis L of each pillar P runs in particular through the center M of the recombination zone 2 of the assigned light source 2. The pillars P consist of a material 9 with a high refractive index, for example $Nb_2O_5$. A filler material 7 with a lower refractive index, such as silicon dioxide, can be arranged in the spaces between the pillars P.

The pillars P can be arranged above the layer with the light sources, in particular by additionally applying the pillars P above array 11. Alternatively, the pillars can be etched into the semiconductor material 3. For this purpose, the semiconductor material layer must be appropriately high. Since the semiconductor material normally comprises a high refractive index, material can be etched away in such a way that the pillars 9 remain standing. The areas freed up by etching can be filled with material of low refractive index.

The pillars P act like waveguides which guide light upwards in the direction of the longitudinal axis L, so that the pillars P can cause an improved emission of light in a direction perpendicular to the light emission surface 21. In addition to the design shown here, the periodicity of the pillar structures can also be different, for example, the pillars can be located alternately above one μ-LED and between two adjacent μ-LEDs. This results in a double density of columns. The periodicity determines the optical band structure and thus the properties with regard to light extraction.

In the array 11, both electrical poles of a light source are electrically connected to the recombination zones 2 by means of a reflective contact layer 5. The contacting layer 5 is formed on a side of the semiconductor material 3 that is turned away from the optically active pillar structures P. The contacting layer 5 can have two separate areas in order to be able to contact electrically the two poles separately. This type of contacting allows very localized recombination zones 2.

Figure 26A:
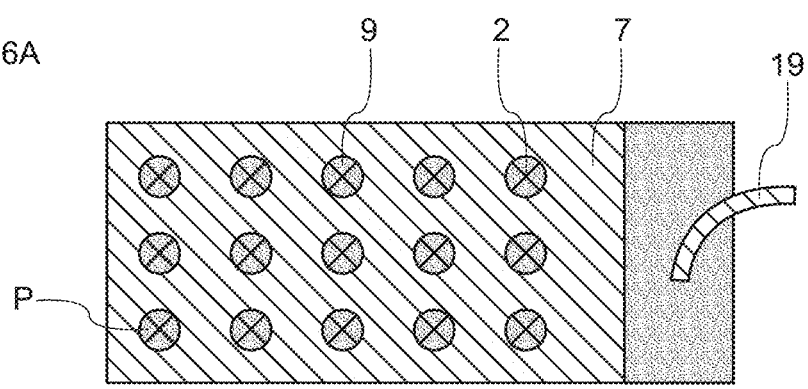
FIGS. 26A and 26B illustrate a sixth embodiment of a μ-display with a photonic structure in a top view and as a cross-section according to some aspects of the concept presented.
Figure 26B:
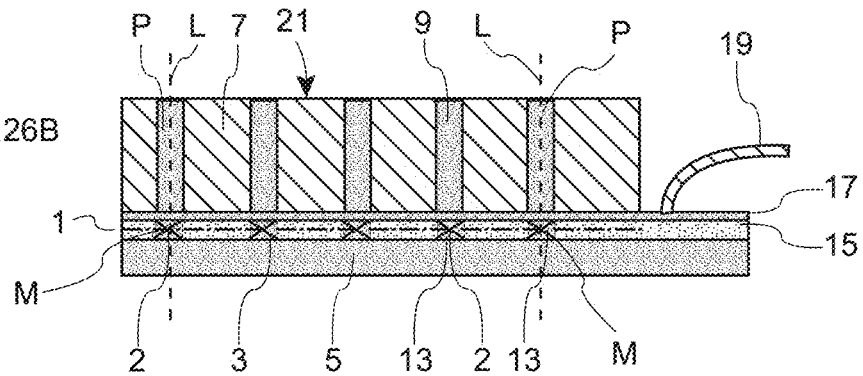

FIGS. 26A and 26B show a sixth optoelectronic device in a top view and cross-section. The device comprises an array of vertical μ-LEDs 13. Optically active pillar structures P, in particular with pillars or columns, are arranged above the array of μ-LEDs 13. The longitudinal axis L of the pillars P runs at least essentially through the centers of the recombination zones 2 of the μ-LEDs 13.

Pillar structures P may be free-standing in air or filled with a first filling material 7, in particular electrically insulating and optically transparent, above the light-emitting diodes. The filling material 7 may comprises a lower refractive index than the refractive index of the material 9 of the pillars P and/or the semiconductor material 3 of the μ-LEDs 3. The reverse form is also possible, i.e. material 7 has a higher refractive index than the material of the pillars, but this changes the light guidance of the pillars.

As already mentioned, the μ-LEDs are vertical micro-light emitting diodes 13, which comprise one, especially positive, electrical pole on their back side facing the reflective contact layer 5 and another electrical pole on the front side facing the pillars P.

The pole at the front of the light sources is electrically connected to an appropriate power supply (not shown) by means of a layer of an electrically conductive and optically transparent material 17, in particular ITO, and by means of a contact wire 19. The layer of material 17 is placed between the light sources and the pillars 17, as shown.

A second filling material 15 can be arranged in free spaces in the layer of μ-LEDs 13 and thus between the layer with the material 17 and the contacting layer 5.

Pillar structures P can also be described as micropillar structures or micropillars, since their dimensions, in particular their cross-section, can at least approximately correspond to the dimensions of the micro light-emitting diodes 13 or the pixels of an array 11.

Figure 27A:
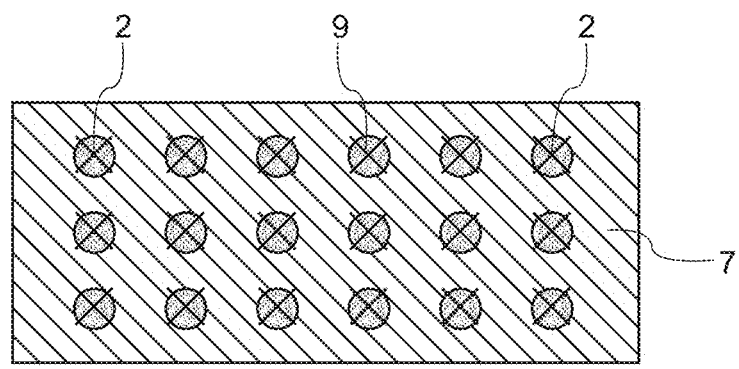
FIGS. 27A and 27B show a seventh embodiment of a μ-display with a photonic structure in a top view and as a cross section according to some aspects of the presented concept.
Figure 27B:
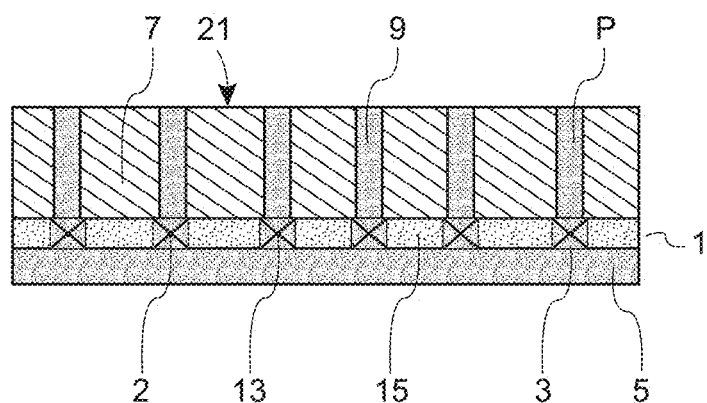

FIGS. 27A and 27B show a seventh optoelectronic device in a top view and cross-section. In contrast to the variant in FIGS. 26A and 26B, the device in FIGS. 27A and 27B comprises an array of horizontal micro-light-emitting diodes 13, the electrical poles of which are located at the rear of the microlight-emitting diodes 13. For electrical contacting, therefore, both electrical poles of a light source can be electrically connected via two electrically separated areas of the reflective contacting layer 5. The intermediate layer with the material 17 as in the variant with vertical micro light emitting diodes described above is therefore not required.

In comparison to the arrangements with the photonic crystal structures K according to FIGS. 21A to 24B, the variants with the pillars P can be manufactured more easily with standard technologies, since the structure sizes with diameters of up to 1 μm or more are significantly larger. The process requirements are therefore lower and high-resolution lithography can be sufficient for the manufacture of the pillars.

Pillar structures, in particular pillars or columns, made of the optically active semiconductor material 3 or a material 9 with a refractive index as high as possible can be precisely structured via individual pixels of the array 11 or via vertical micro-light emitting diodes 13 (FIGS. 26A and 26B) or via horizontal micro-light emitting diodes 13 (FIGS. 27A and 27B). The individual pixels or micro-lighting diodes 13 may be smaller than 1 μm in diameter and the pillars may have an aspect ratio height:diameter of at least 3:1. Pillars are preferably etched directly into the semiconductor material 3, as is possible in FIGS. 25A and 25B and in FIGS. 27A and 27B, because there is no third layer 17 as shown in FIG. 26B, or they are made of another material 9 with a high refractive index and preferably low absorption, which is applied to the surface of the array 11. A possible material with a high refractive index is for example $Nb_2O_5$. Pillar structures can be free-standing or filled with a material 7 of low refractive index. A possible filling material with low refractive index is for example $SiO_2$. Due to the higher refractive index of the pillars compared to the surrounding material, the emission parallel to the longitudinal axis of the pillars is enhanced compared to other spatial directions. Due to a waveguide effect, light along the longitudinal axis of the pillars is additionally coupled out more efficiently than light with other propagation directions. This improves the directionality of the emitted light.

Figure 28A:
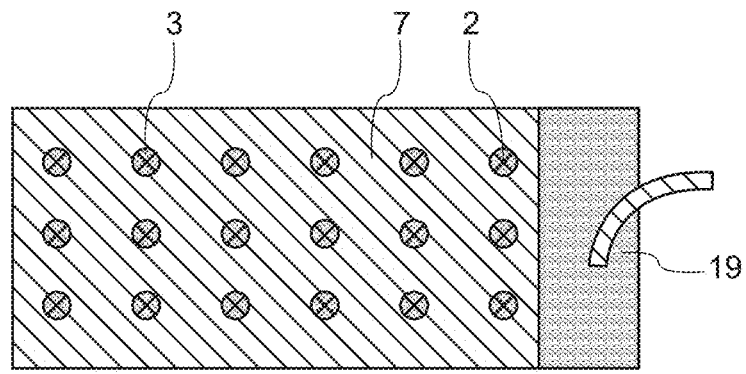
FIGS. 28A and 28B illustrate an eighth embodiment of a μ-display of a photonic structure in a top view and as a cross-section.
Figure 28B:
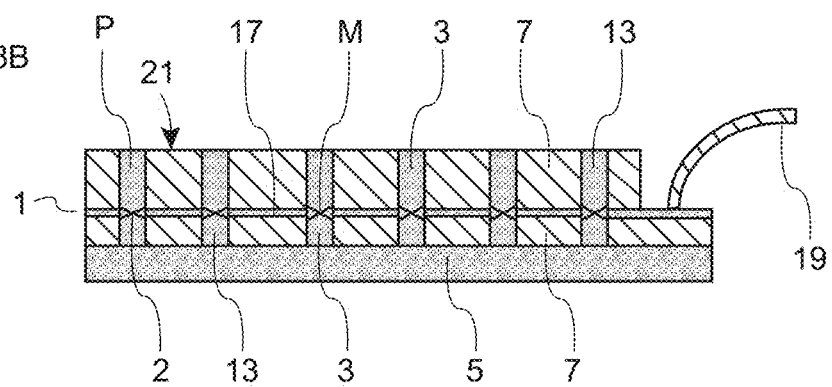

FIGS. 28A and 28B show an eighth proposed optoelectronic device in a top view and cross-section. The device comprises an array of μ-LED 13, each of which is configured with pillar P and thus in column form.

The length of the pillars P can correspond to half a wavelength of the emitted light in the semiconductor material 3 and the recombination zone 2 can preferably be located in the center M of a respective pillar and thus in a local maximum of the photonic state density. The aspect ratio height:diameter of the pillars P can be at least 3:1.

In the arrangement shown, the pillars P can be about 100 nm high and have a diameter of only about 30 nm. This requires a very finely resolved structuring technique and can be realized with current production technologies at wafer level with a lot of effort.

Alternatively, the dimensions can be upscaled to simplify manufacture, with the directionality of the emitted light decreasing as the size of the pillar structure increases. The length of the pillars P is preferably a multiple of half the wavelength of the emitted light in the semiconductor material, and the respective recombination zone 2 can be at a maximum of the photonic state density.

Due to the pillar structuring of the µ-LED 13, the emission parallel to the longitudinal axis of the pillars P is effectively amplified by the higher photonic state density. Due to a waveguide effect, light with a direction of propagation along the longitudinal axis of the pillars P is additionally coupled out more efficiently than light with other directions of propagation. The space between the pillars P is filled with a material 7, which preferably comprises a very low absorption coefficient and a lower refractive index than the semiconductor material 3. A possible filling material with a low refractive index is for example $SiO_2$.

In this arrangement of micro-lighting diodes 13, in particular vertical micro-lighting diodes 13 formed as pillars P or columns, a first pole, in particular a positive pole is electrically connected by means of a reflective contacting layer 5 for contacting recombination zones 2 arranged in a recombination plane 1. The contacting layer 5 is formed at the lower, first longitudinal ends of the µ-LEDs 13.

The respective other, in particular negative, second pole is electrically connected to a third layer of a conductive transparent material 17, in particular ITO, and connected by means of a bonding wire 19 for example to the corresponding pole of a power supply.

According to this arrangement, the third layer is formed in and along the recombination plane 1 in the longitudinal centers of the µ-LEDs 13, which are shaped as pillars P or columns.

Figure 29A:
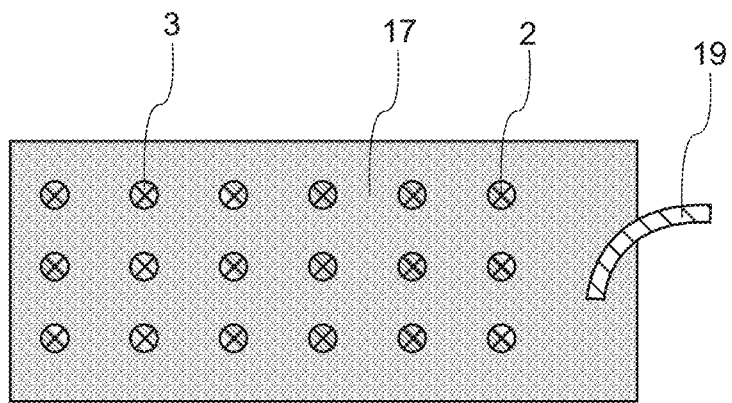
FIGS. 29A and 29B show a ninth embodiment of a μ-display of a photonic structure in a top view and as a cross-section according to some aspects of the presented concept.
Figure 29B:
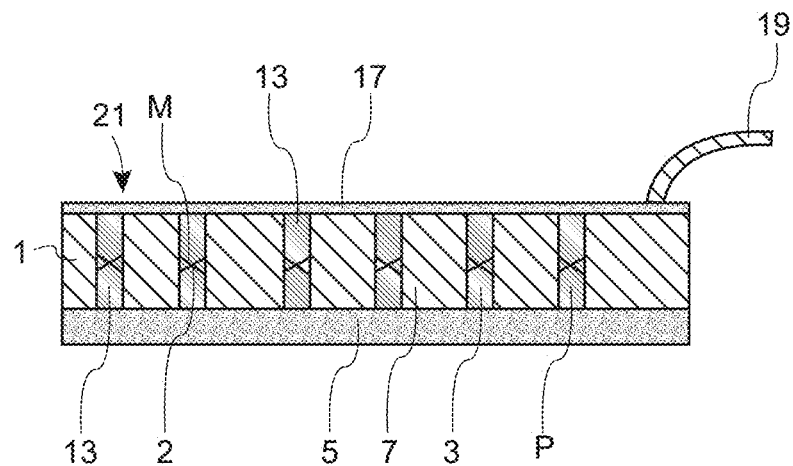

FIGS. 29A and 29B show a ninth optoelectronic device in a top view and cross-section. In contrast to the variant in FIGS. 28A and 28B, the device in FIGS. 29A and 29B comprises vertical µ-LEDs in the form of pillars P.

The electrical contact at the bottom, in particular the p-contact, is established via the bottom of the pillars P and in particular by contacting the contact layer 5. The electrical contact at the top, especially the n-contact, is on the upper side of the pillars P. The contact is established via an upper layer of optically transparent and electrically conductive material 17. The upper layer extends over the pillars P and the first filling material 7, with which the free spaces between the pillars P are filled. A possible material 17 for the upper layer is ITO (indium tin oxide), for example. A connection to a power supply can be established via the bonding wire 19.

The electrical contacting of the light-emitting diodes in the pillars P enables very strongly localized recombination zones 2, whereby the upper contact, in particular an n-contact, can be formed at the level of the recombination zones 2 or on the upper side of the pillars P. Each pillar P generates an individual pixel.

The emission of light parallel to the longitudinal axis of µ-LEDs 13 in the form of pillars as shown in FIGS. 28A to 29B is increased. This improves the directionality of the emitted light compared to conventional micro-light emitting diodes with small aspect ratio. Compared to an arrangement according to FIGS. 25A to 27B, the process of light generation can be influenced much more strongly by an arrangement according to FIGS. 28A to 29B, thus achieving high directionality and efficiency.

Figure 30:
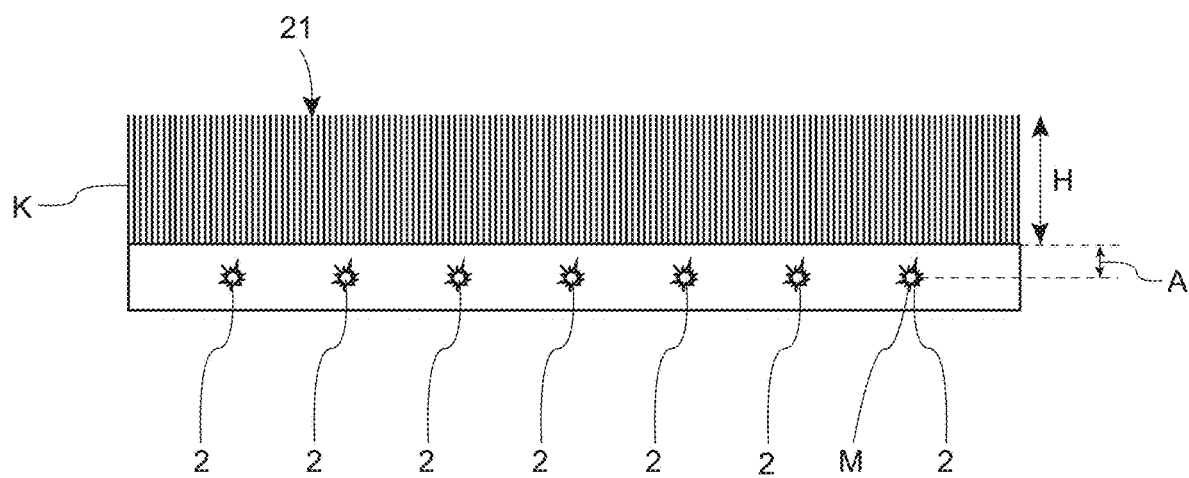
FIG. 30 shows a cross-sectional view of another variant of a device according to the invention.

FIG. 30 shows a cross-sectional view of another optoelectronic device in which a two-dimensional photonic crystal K is arranged over a layer with an array of light sources with recombination zones 2. The photonic crystal K is thereby arranged so close to the recombination zones 2 that the photonic crystal K changes an optical state density present in the region of the recombination zones 2, in particular in such a way that a band gap is generated for at least one optical mode with a direction of propagation parallel and/or at a small angle to the light exit surface 21 and/or the state density is increased for at least one optical mode with a direction of propagation perpendicular to the light exit surface 21.

This can be achieved in particular by the fact that the height H of the photonic crystal K is at least 300 to 500 nm, preferably up to 1 µm. The height H of the photonic crystal may depend on the high refractive index material of the photonic crystal.

Furthermore, a distance A between the center M of the recombination zones 2 and the bottom of the photonic crystal K is at most 1 µm and preferably a few 10 to a few hundred nm.

All the described configurations with a photonic crystal K are two-dimensional photonic crystals, which exhibit a periodic variation of the optical refractive index in two spatial directions perpendicular to each other and parallel to the light-emitting surface. Furthermore, it is preferably a pillar structure comprising an array of pillars P or columns, the longitudinal axis L of the pillars P being perpendicular to the light-emitting surface 21.

Figure 31:
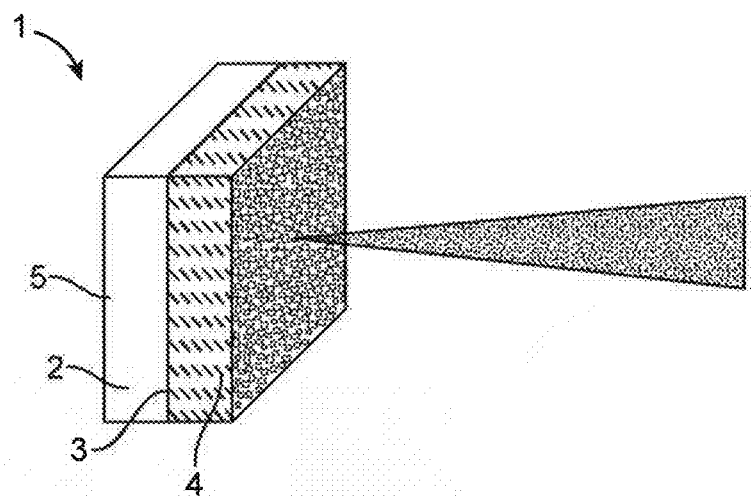
FIG. 31 shows an arrangement of an optoelectronic component with an emitter unit having a light-emitting surface to which a polarizing element with a three-dimensional photonic structure is applied.

FIG. 31 shows an optoelectronic device 1 with a photonic structure for emitting polarized light. The component 1 comprises an emitter unit 2, which has a light-emitting surface 3 and on which a polarizing element 4 in the form of a polarizing layer with a three-dimensional photonic structure is applied. With the help of photonic structures for polarization of electromagnetic radiation, it is especially possible to take special pictures and show them on suitable displays. According to the embodiment shown in FIG. 31, emitter unit 2 is a µ-LED 5, which emits light in the visible or possibly also in the ultraviolet wavelength range. The light emitted by the µ-LED 5 is guided into the three-dimensional photonic structure and here it is polarized in a certain direction of oscillation depending on the design and dimensioning of the structure. Depending on the design of the three-dimensional photonic structure, either circular or linear polarization can be used. The light emitted in this way therefore comprises a specific polarization, which is predetermined by the photonic structure.

Figure 32:
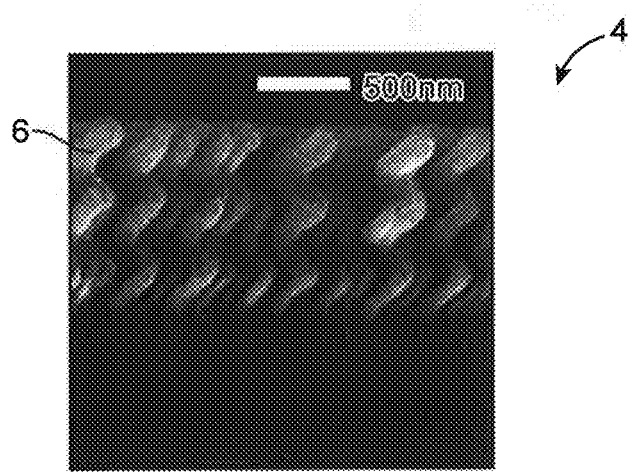
FIG. 32 illustrates a representation of a three-dimensional photonic structure with a large number of spiral-shaped structural elements.

If the three-dimensional photonic structure of polarization element 4 has spiral structure elements 6 as shown in FIG. 32, a circular polarization occurs. If, on the other hand, the structural elements of the three-dimensional photonic structure are rod-shaped, in particular in the form of so-called nanorods, this causes a linear polarization of the radiation guided through the three-dimensional photonic structure.

The optoelectronic device 1 shown in FIG. 31 is manufactured by the two-photon lithography process, the glancing angle deposition process, laser interference lithography or by holographic patterning. It should be noted that the spiral-shaped features 6 shown in FIG. 32 have been fabricated using the glancing angle deposition technique.

The illustration in FIG. 31 shows only a single optoelectronic component. However, a large number of these components can be manufactured together and provided as an array or µ-LED module, as shown in FIGS. 187, 189 to 192, for example. In this way, different components can be interconnected, but with complementary properties. Thus, components 1 or also arrays or µ-LED modules are combined for imaging, which have different polarization and/or transmission properties.

The radiation generated by several illumination units, each with complementary properties, polarized in different directions of oscillation, is projected onto a display or screen by means of common optics disclosed therein.

With the three-dimensional photonic structure arranged on the surface or light-emitting surface 3 of an LED chip as shown in FIG. 31, which forms a polarization element 4, it is possible to generate light with fundamentally different properties, in particular with defined polarization, than is possible with the currently known LEDs. The advantage is that due to the provision of a three-dimensional photonic structure on the chip surface, no additional optical components, such as a classical polarization filter, are required. This is particularly useful in the area of μ-LEDs, since such photonic structures are easier to produce by means of lithographic processes than by positioning and attaching separate polarization filters. The illumination unit can therefore be made comparatively small. Due to the structuring directly on the semiconductor chip of the LED 5, such an optoelectronic component 1 is also more energy-efficient than the known components in which the polarization is subsequently selected. Any photon that does not pass through the three-dimensional photonic structure due to its properties remains in the μ-LED chip and can be re-emitted by a reabsorption process.

Figure 33:
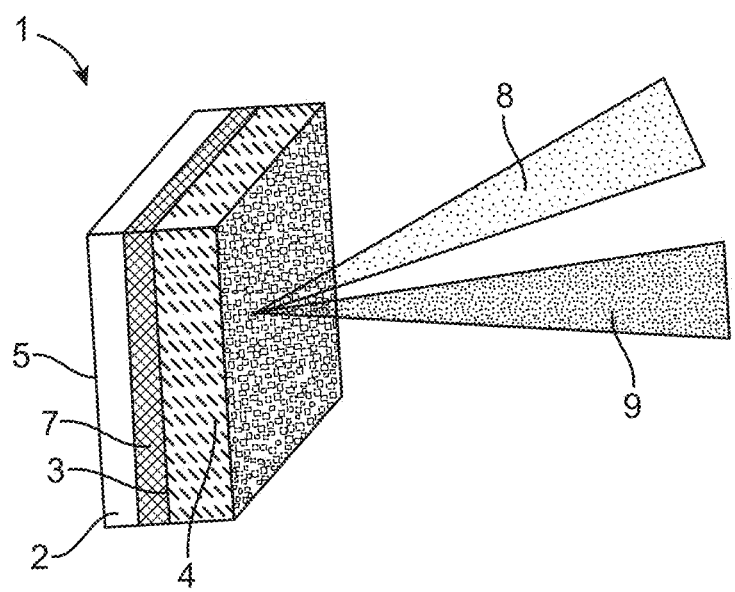
FIG. 33 shows another embodiment of an optoelectronic device with an emitter unit and a polarization element with a three-dimensional photonic structure.

FIG. 33 shows an illumination unit or an optoelectronic component 1 with an emitter unit 2, which comprises a light-emitting surface 3 on which a polarizing element 4 with a three-dimensional photonic structure that has wavelength-selective properties is applied. The photonic structure in this case is a three-dimensional photonic crystal. Alternatively, several two-dimensional photonic crystals can be arranged in layers one above the other.

The three-dimensional photonic structure is designed to have wavelength-specific transmittance and polarization properties. This means that the transmittance and polarization properties of the three-dimensional photonic structure vary depending on the wavelength of the incident radiation.

Component 1 shown in FIG. 33 has an emitter unit, which in turn has a μ-LED 5. A converter element 7 with a layer of converter material is also provided. The converter material emits a converted radiation 9 due to excitation by the excitation radiation 8 emitted by the LED 5, which comprises a different wavelength than the excitation radiation 8.

If both unconverted excitation radiation 8 and converted radiation 9 impinge on the three-dimensional photonic structure, these radiations are influenced in different ways depending on their wavelength with respect to transmission and polarization. As shown in FIG. 33, the converted radiation 9 is coupled out perpendicular to the surface of the LED chip, while the excitation radiation 8 is deflected laterally.

Such lighting units can be used in a preferred way in components in which radiation with different wavelengths is generated, whereby different functions can be implemented with a combination of μ-LEDs and converter elements. Depending on the design of the three-dimensional photonic structure and the wavelength of the excitation radiation 8 emitted by each LED, it is possible to achieve complete suppression of the excitation radiation 8, while the converted radiation 9 passes through the three-dimensional photonic structure. It is also conceivable that the excitation radiation 8 is deflected while the converted radiation 9 is coupled out perpendicular to the chip surface, as shown in FIG. 33. Of course, the mechanism can also be reversed. Furthermore, it is also conceivable to polarize the converted radiation 9 in a special way, while the excitation radiation 8 emerges unchanged via the chip surface. Here too, the mechanism can be reversed.

Figure 34:
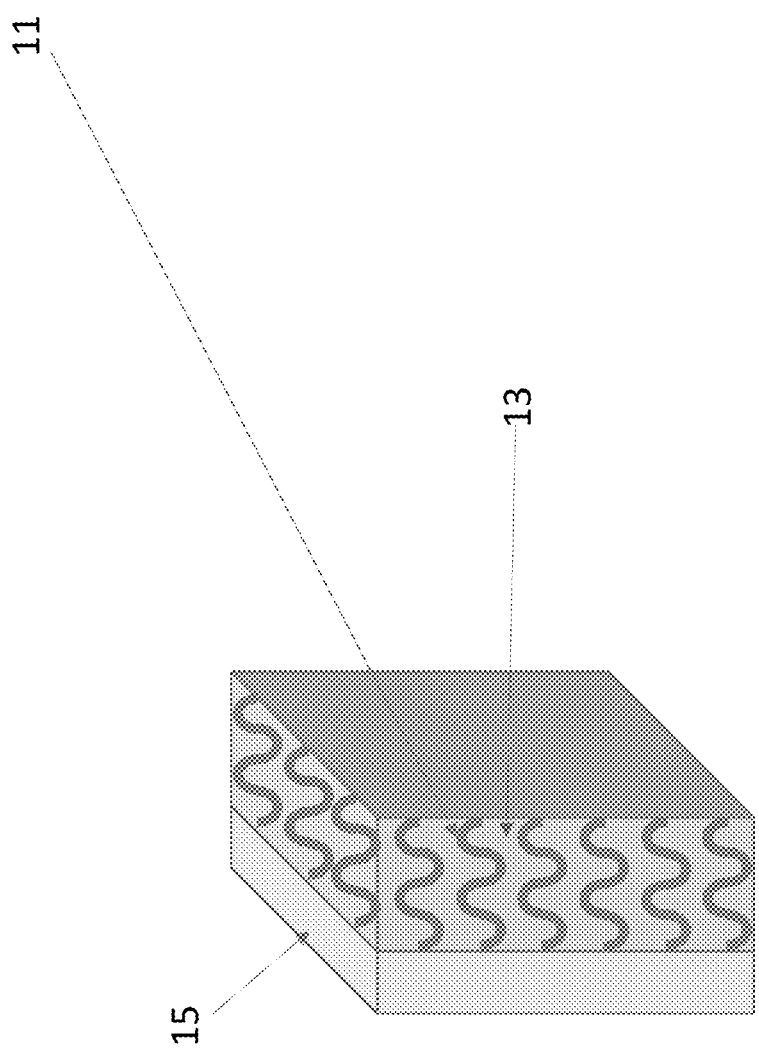
FIG. 34 shows an optoelectronic device with an emitter unit and a three-dimensional photonic structure into which converter material is filled.

The variant of an illumination unit shown in FIG. 34 comprises an emitter unit, here again in the form of a μ-LED 15, and a three-dimensional photonic structure 11, for example a spiral-shaped photonic structure 11. Converter material 13 is filled into structure 11.

Figure 35:
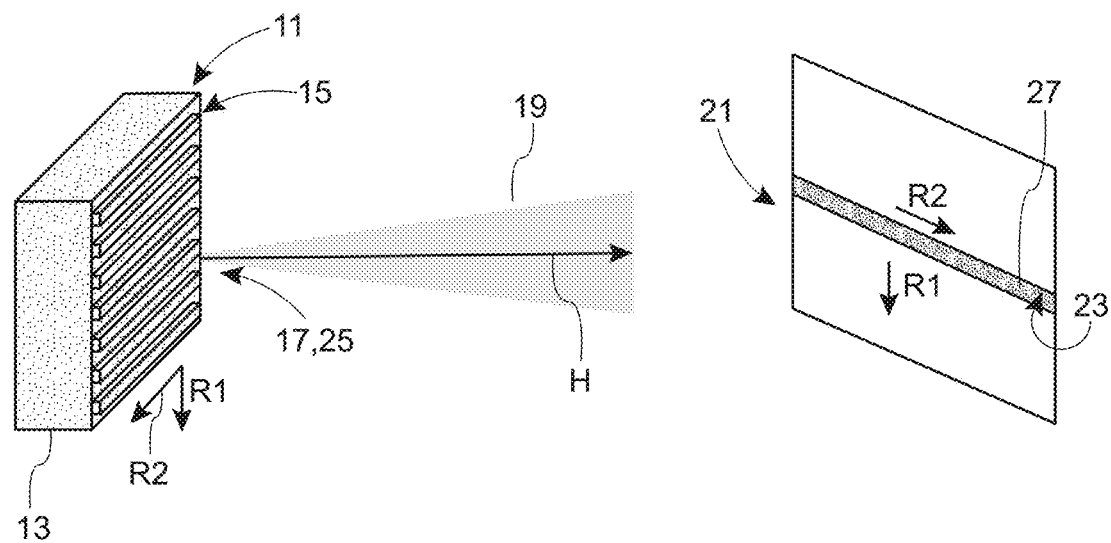
FIG. 35 illustrates a perspective view of a first variant of an arrangement with an emitter unit, which has a photonic structure for generating a specific far field.

The optoelectronic component 11 shown in FIG. 35 comprises at least one μ-LED 13, which is designed to emit electromagnetic radiation 19, such as visible or infrared light of one wavelength, via a light emission surface 15. A photonic structure 17 is provided for beam-shaping of the electromagnetic radiation before it exits via the light exit surface 15. The photonic structure 17 shapes the electromagnetic radiation 19 in such a way that the electromagnetic radiation 19 comprises a defined characteristic 23 (Far-field characteristics).

In particular, the photonic structure 17 of the illumination unit 11 of FIG. 35 is a one-dimensional photonic crystal 25, which in the variant shown extends to the light-emitting surface 15. The front side of the photonic crystal 25 thus forms the light-emitting surface 15. The one-dimensional photonic crystal 25 exhibits a periodic variation of the optical refractive index along a first direction R1.

The crystal 25 or the periodic variation are adjusted to beam the electromagnetic radiation emitted by a light source (not shown) of the μ-LED. Especially a light propagation along the first direction R1 is blocked. As a result, the emitted radiation 19 in far-field 21 comprises only a slight extension along the first direction R1. A characteristic feature of electromagnetic radiation 19 in far-field 21 is therefore that it forms a narrow strip 27. The electromagnetic radiation 19 is therefore collimated with respect to the first direction 19.

The light source is a μ-LED. This is typically a Lambertian radiator. By using the photonic structure 17 and the resulting beam-shaping a directed, collimated electromagnetic radiation 19 can be generated.

As FIG. 35 schematically shows, the emitted electromagnetic radiation 19 leaves the μ-LED 13 in the form of a light cone that substantially fans out along a second direction R2. The central axis of the light cone extends along a main radiation direction H, which is perpendicular to the light exit surface 15. Not shown is a collimating, optional optical system arranged downstream of the light exit surface 15 when viewed in the main radiation direction H. By means of the optics, the electromagnetic radiation 19 can be collimated in the second spatial direction R2, which is orthogonal to the first spatial direction R1. The electromagnetic radiation 19 can thus be collimated in the far field 21 with respect to the two directions R1, R2. A luminous point is created. This luminous point is particularly favourable for displays as mentioned at the beginning, because the beam is strongly collimated in both directions in space.

An optoelectronic component 11 as shown in FIG. 35 is particularly well suited for use in an optical scanner. Here, the illumination device 11 can be used especially for line scan applications due to the stripe-like light image in far field 21.

Figure 36:
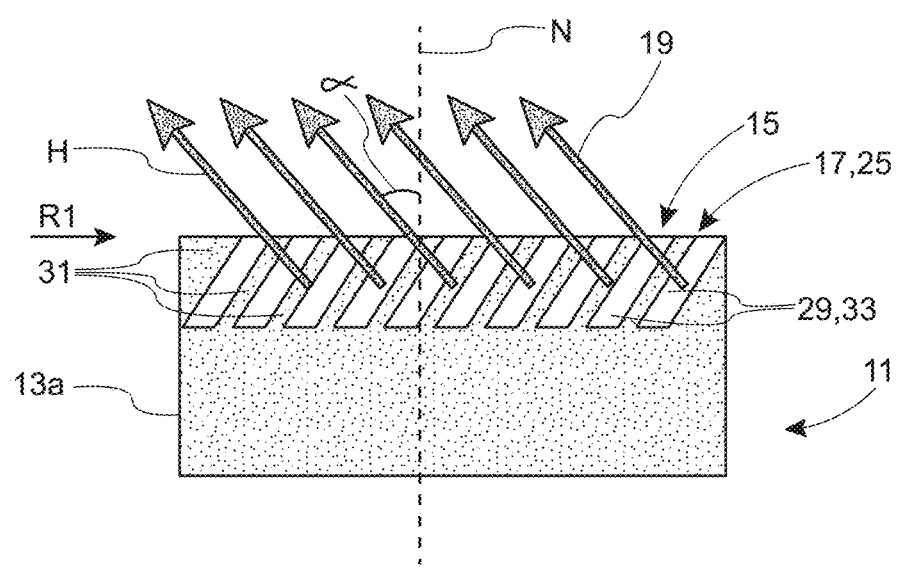
FIG. 36 shows a sectional view of a second variant of an arrangement with an emitter unit to illustrate further aspects of the proposed principle.

In the optoelectronic device 11 shown in FIG. 36, a one-dimensional photonic crystal 25 is formed on the upper side of an emitter unit 13a. The front face of the crystal 25 forms the light-emitting surface 15 for electromagnetic radiation generated by an unrepresented optoelectronic light source, for example an LED or μ-LED, which is emitted through the photonic crystal 25 via the light-emitting surface 25.

In contrast to the variant shown in FIG. 35, the main direction of radiation H of the electromagnetic radiation 19 of the lighting unit of FIG. 36 is at an angle α to the normal N of the light-emitting surface 15. The angle α is not equal to zero degrees. For example, the angle α can be in the range between 30 and 60 degrees. This is achieved by the fact that the one-dimensional photonic crystal 25 comprises a periodically repeating sequence of two materials 31, 33 with different optical refractive indices extending in a first direction R1. The materials 31, 33 have a parallelogram-like cross-section and abutting interfaces of the materials 31, 33 do not run orthogonally but are inclined to the light-emitting surface 15, as shown schematically in FIG. 36.

Such a structure can be formed, for example, by etching trenches 29 running parallel to each other at an angle to the light emission surface 15 into the substrate 31 having the light emission surface 15. The trenches 29 can be filled with a material 33, which comprises a different optical refractive index than the substrate material 33, which has been etched away. The angle α may depend on the inclination of the trenches 29 to the light-emitting surface 15. The width of the trenches 29 and the width of any substrate material 31 remaining between two trenches 29 influences the wavelengths at which the photonic crystal 25 can be affected. Typically, the width of the trenches 29 and the width of the substrate material 33 remaining between two trenches, and thus also the periodicity of the photonic crystal structure 25, are adapted to the wavelength of the electromagnetic radiation provided by the light source or a converter material located between the light source and the photonic crystal.

Using the one-dimensional photonic crystal 25, component 11 of FIG. 36 can in turn generate a light strip 27 in the far field 21, as described in relation to FIG. 35. In contrast to the variant in FIG. 35, the main radiation direction H in the variant in FIG. 36 is tilted by the angle α relative to the normal N. By means of a downstream collimating optic, the strip 27 can be brought into a point-like or circular structure in the far field 21.

Figure 37:
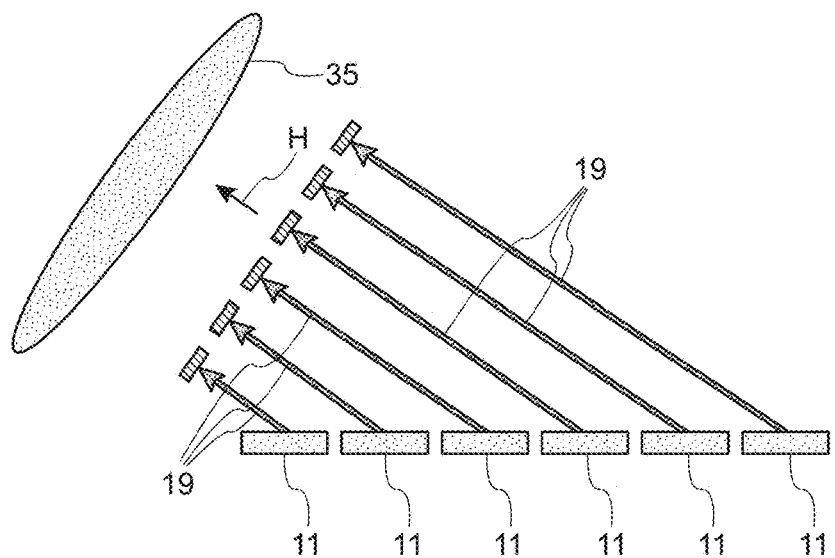
FIG. 37 shows an arrangement of a plurality of arrangements according to the two preceding figures.

The variant shown in FIG. 37 comprises a linear or array arrangement of several optoelectronic components 11 of FIG. 36, the light beams 19 emitted by the individual components 11 having the same main radiation direction H. The light beams 19 can also be collimated by an additional collimating optic 35, in particular a lens, in a second direction, which, in the representation of FIG. 37, is perpendicular to the image plane. This results in a point or circular image of the emitted radiation 19 in the far field behind the lens 35.

The use of a photonic crystal in an illumination device 11 as shown in FIGS. 36 and 37 results in an effectively higher resolution for a line-array arrangement of illumination devices 11 as shown in FIG. 37. μ-display or modules having such features allow very directional radiation, so that the pixel sharpness is very high. This means that the contrast remains very high even with adjacent pixels and optical crosstalk is reduced. In addition, smaller beam cross-sections can be realized, especially in the far field, downstream of optics 35. Since collimation in the first direction R1 (cf. FIG. 36) is already achieved by the photonic crystals 25 integrated in the illumination devices 11, optics 35 and possibly further, subsequent optics can be made more compact.

Figure 38:
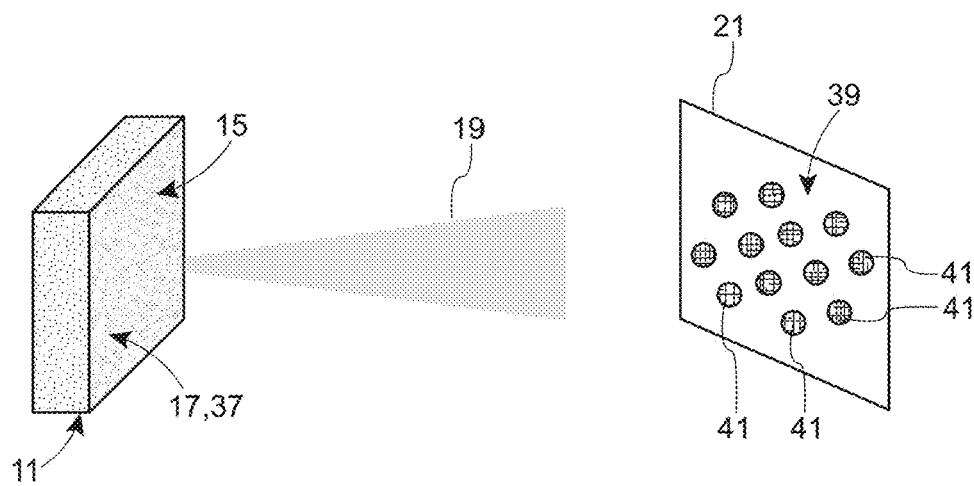
FIG. 38 shows a perspective view of a third variant of an arrangement with an emitter unit, which has a photonic structure to generate a defined far field.

In the variant of FIG. 38, the optoelectronic component or lighting unit 11 comprises a photonic structure 17, which is a two-dimensional photonic crystal 37, whose front side forms the light-emitting surface 15. Viewed from the light exit surface 15, at least one optoelectronic light source, optionally with converter material, is arranged behind the photonic crystal 37. The photonic crystal 37 is designed to shape the electromagnetic radiation 19 emitted via the light exit surface in such a way that it produces a defined, discrete pattern 39 in the far field 21. In the example shown, the pattern 39 consists of several distributed light spots 41, although other patterns are also possible. In particular, the photonic crystal can be formed to produce only one central pixel. This structure is particularly useful for displays.

Figure 39:
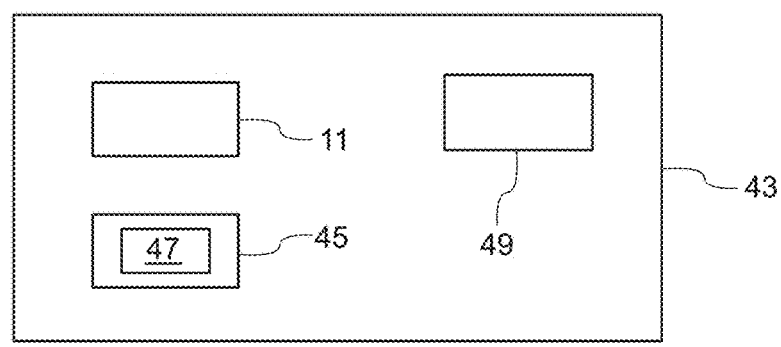
FIG. 39 illustrates a block diagram of a surface topography detection system with an arrangement according to one of the preceding figures.

The illumination device 11 in FIG. 38 is suitable for use in a surface topography detection system 43, for example, as shown in the block diagram in FIG. 39. In addition to the illumination device 11, the system 43 includes a detection unit 45 with a camera 47, which is designed to detect the pattern 39 when it illuminates an object (not shown).

Furthermore, an analysis device 49 is provided which is designed to detect a distortion of the pattern 39 in relation to a given reference pattern. The reference pattern can, for example, be determined from the detection of pattern 39 when it is projected onto a flat surface. The analyser 49 is also adapted to determine a shape and/or a structure of the object illuminated by the pattern 39 in the far field 39 depending on the detected distortion of the pattern 39. By means of the system 43, face recognition can thus be realized, for example. In the case of applications in the Augmented Reality area, some pixels can be formed with a crystal such as the one shown in FIG. 38 in order to detect the reflection on the eye a direction of vision or its change. This allows a user to follow and superimpose information into the field of view for sharp vision.

In the variant shown in FIG. 39, downstream optics for pattern generation can be dispensed with, since pattern 39 can already be generated using photonic crystal 37. The lighting device 11 as shown in FIG. 38 and the associated system 43 as shown in FIG. 39 can therefore be implemented in a particularly compact form.

In the following, various devices and arrangements as well as methods for manufacturing, processing and operating as items are again listed as an example. The following items present different aspects and implementations of the proposed principles and concepts, which can be combined in various ways. Such combinations are not limited to those listed below:

565. μ-LED, comprising:
a layer stack of a p-doped layer;
an n-doped layer;
an active region located between the p-doped and n-doped layer;
wherein the layer stack rises above a major surface and the active region is located above a center of the layer stack as viewed from the major surface, wherein the layer stack has a reducing diameter from the major surface;
a reflective layer over a surface of the layer stack.

566. μ-LED according to item 565,
in which the stack of layers comprise the shape of a hemisphere or a paraboloid or an ellipsoid.

567. μ-LED according to any of the preceding items, in which areas of the active layer adjacent to the reflective layer comprise an increased bandgap.

568. μ-LED according to any of the preceding items, in which areas of the active layer adjacent to the reflective layer exhibit quantum well intermixing.

569. μ-LED according to any of the preceding items, in which the reflective layer comprises a dielectric between the active region and the layer of the layer stack adjacent to the surface region.

570. μ-LED arrangement for generating a pixel of a display, comprising
a flat carrier substrate; and
at least one μ-LED, which is arranged on a mounting side of the carrier substrate wherein the μ-LED is adapted to emit light transverse to a carrier substrate plane in a direction away from the carrier substrate;
a flat reflector element;
wherein the reflector element is spatially arranged on the assembly side relative to the at least one μ-LED and is configured to reflect light emitted by the at least one μ-LED in the direction of the carrier substrate;
wherein the carrier substrate is at least partially transparent so that light reflected from the reflector element propagates through the carrier substrate and emerges at a display side of the carrier substrate opposite the mounting side.

571. μ-LED arrangement according to item 570, wherein a diffuser layer is provided and/or a reflector material has diffuser particles for scattering the light reflected by the at least one μ-LED on the side of the reflector element directed towards the at least one μ-LED.

572. μ-LED arrangement according to item 571, wherein the diffuser layer and/or the diffuser particles comprise $Al_2O_2$ and/or $TiO_2$.

573. μ-LED arrangement according to any of the preceding items, wherein the reflector element surrounds the at least one μ-LED in a circular, polygonal or parabolic shape.

574. μ-LED arrangement according to any of the preceding items, wherein the reflector element forms an electrical contact of the at least one μ-LED.

575. μ-LED arrangement according to any of the preceding items, wherein the reflector element is configured and shaped such that at least 90% of the light emitted by the at least one μ-LED is incident on the mounting side of the carrier substrate at an angle between 45 and 90 degrees relative to the carrier substrate plane.

576. μ-LED arrangement according to any of the preceding items, in which the at least one μ-LED comprises three μ-LEDs surrounded by the reflector element 577. μ-LED arrangement according to item 576, in which the at least three μ-LEDs have a contact area on the side facing the reflector element, which is covered with a transparent cover layer for common electrical contact.

578. μ-LED array according to any of the preceding items, wherein the supporting substrate comprises polyamide, a transparent plastic, resin or glass.

579. μ-LED arrangement according to any of the preceding items, wherein the reflector element is formed as a reflective layer of the at least one μ-LED.

580. μ-LED arrangement according to any of the preceding items, wherein a passivation layer is additionally provided for attenuating or eliminating reflections of the light at mesa edges of the at least one μ-LED.

581. μ-LED arrangement according to any of the preceding items, wherein a light absorbing coating is provided on the assembly side and/or display side of the carrier substrate outside the reflector element.

582. μ-LED arrangement according to any of the preceding items, wherein the display side of the supporting substrate has an uneven and/or roughened structure.

583. μ-LED arrangement according to any of the preceding items, wherein a color filter element is arranged on the display side of the carrier substrate opposite the reflector element; wherein the color filter element allows a primary color spectrum of the at least one μ-LED to pass and attenuates deviating color spectra.

584a. μ-LED arrangement according to any of the preceding items, in which a light-shaping structure, in particular a photonic structure with features after one of the following objects is incorporated in the carrier substrate, which first and second regions with different refractive indexes are incorporated.

584b. μ-LED arrangement according to any of the preceding items, in which a light-shaping and/or light-converting structure having first and second areas is arranged on the display side of the carrier substrate.

585. μ-LED arrangement according to item 583 or 584, where first areas comprise a converter material.

586. μ-LED arrangement according to any of the preceding items, comprising a converter material surrounding the at least one μ-LED and filling the space between μ-LED and reflector material.

587. μ-LED arrangement according to any of the preceding items, comprising a converter material on the display side of the supporting substrate.

588. Optical display comprising a plurality of pixel elements each according to any of the preceding items.

589. A method for producing an optical pixel element, comprising the steps of
fixing of at least one μ-LED on an assembly side of a flat carrier substrate;
creating a reflector element;
wherein the reflector element is formed as a light-reflecting layer on the at least one μ-LED so that light emitted from the at least one μ-LED is reflected towards the carrier substrate.

590. Photonic structure on an optoelectronic device, in particular a μ-LED, comprising
a set of layers including an active zone for generating electromagnetic radiation forming the optoelectronic device, and
at least one layer on a main radiation surface having a photonic crystal structure.

591. Photonic structure on an optoelectronic device according to item 590, the layers of the set of layers and the at least one layer having the photonic crystal structure are arranged one upon another along a growth direction of the layers, and wherein the photonic crystal structure comprise a periodicity in a plane perpendicular to the growth direction.

592. Photonic structure on an optoelectronic device according to item 590, in which the photonic crystal structure has first and second regions of different refractive index.

593. Photonic structure on an optoelectronic device according to any of the preceding items, wherein the photonic structure has a first periodicity in a first direction and a second periodicity in a second direction.

594. Photonic structure on an optoelectronic device as defined in item 593, in which the first and second periodicity are the same.

595. Photonic structure on an optoelectronic device according to any of the preceding items, in which the photonic crystal structure extends at least partially into one of the layers of the set of layers.

596. Photonic structure on an optoelectronic device according to any of the preceding items, the periodicity corresponding to about half a specific wavelength, the wavelength corresponding to the wavelength of electromagnetic radiation to be diffracted by the photonic crystal structure.

597. Photonic structure on an optoelectronic device according to any of the preceding items, wherein the layer having the photonic crystal structure is a dielectric layer containing or consisting of, for example, silicon dioxide, $SiO_2$, and/or wherein the space within the photonic crystal structure is filled with or consists of a second material having a refractive index different from the refractive index of a first material forming the photonic crystal structure.

598. Photonic structure on an optoelectronic device according to any of the preceding items, wherein a lower surface of the layer having the photonic crystal structure is disposed on an upper surface of the set of layers.

599. Photonic structure on an optoelectronic device according to item 598, wherein a portion of at least one layer of the set of layers protrudes into the layer with the photonic crystal structure.

600. Photonic structure on an optoelectronic device according to item 597 or 599, wherein the upper surface of the set of layers is provided with a surface roughening, for example, a wigwam surface roughening.

601. Photonic structure on an optoelectronic device after any of the foregoing, wherein the photonic crystal structure is located at a distance from the upper surface of the set of layers.

602. Photonic structure on an optoelectronic device according to any of the preceding items, further comprising a mirror layer disposed on the layer having the photonic crystal structure.

603. Photonic structure on an optoelectronic device according to any of the preceding items, further comprising a metal mirror layer, with the set of semiconductor layers disposed between the metal mirror layer and the layer containing the photonic crystal structure.

604. Photonic structure on an optoelectronic device according to any of the preceding items, wherein the optoelectronic device is a µ-LED.

605. Optoelectronic device comprising:
at least one optoelectronic light emitting device, for example a µ-LED, wherein said optoelectronic light emitting device is configured to emit light through at least one light emitting surface of said optoelectronic light emitting device,
at least one photonic crystal structure, said photonic crystal structure being disposed between the light-emitting surface of said optoelectronic light-emitting device and a light-emitting surface of said optoelectronic device.

606. Method for producing an optoelectronic device, in particular according to any of the preceding items, comprising method:
growing of a set of layers including an active zone for the generation of electromagnetic radiation,
growing at least one layer having a photonic crystal structure on the upper side of the set of layers,
optionally providing a mirror layer over the layer with the photonic crystal structure,
optionally providing a mirror layer under the set of layers with the active zone,
optionally executing an etching process, such as a Mesa dry etching process.

607. Method for producing a µ-LED comprising a creating of an out-coupling structure in a surface region of a semiconductor body providing the active layer of the µ-LED by means of
structuring of the surface area; and
planarizing the structured surface area to obtain a planarized surface of the surface area.

608. Method according to item 607, wherein the step of structuring the surface area comprises at least one of the following steps:
generating of a random topology at the surface area;
roughening the surface of the surface region of the semiconductor body comprising a first material;
applying, in particular layer-by-layer applying of a transparent second material having a high refractive index, in particular greater than 2, to the surface region and roughening of the second material;
creating an ordered topology on the surface area;
applying, in particular layer-by-layer applying of a transparent second material having a high refractive index, in particular greater than 2, to the surface region and structuring of periodic photonic structures or non-periodic photonic structures, in particular quasi-periodic or deterministic aperiodic photonic structures, into the second material.

609. Method according to item 608,
characterised in that
the transparent second material with the high refractive index $Nb_2O_5$.

610. Method according to any of the preceding items, in which the step of planarizing comprises:
applying, in particular layer by layer, a transparent third material of low refractive index, in particular less than 1.5, to the structured surface region; and
optionally thinning the applied transparent third material of low refractive index until the surface of the structured surface region terminates flat and/or smooth with highest elevations in the first material of the semiconductor body or in the second material of high refractive index.

611. Method according to item 610, in which
the transparent third material having a low refractive index $SiO_2$, and is applied in particular by means of TEOS (tetraethylorthosilicate).

612. µ-LED comprising an out-coupling structure in a surface region of a semiconductor body providing the µ-LED
in which the surface area is planarized so that a smooth surface area is created.

613. µ-LED according to item 612, characterised in that the smooth surface region comprises a roughness in the range of less than 20 nanometres, in particular less than 1 nanometre, as mean roughness value.

614. µ-LED to any of the preceding items, wherein the out-coupling structure comprises a transparent third material with a low refractive index, in particular $SiO_2$, on a roughened first material of the semiconductor of the device.

615. µ-LED according to any of the preceding items, in which the output coupling structure comprises a transparent third material of low refractive index, in particular $SiO_2$, on a roughened transparent second material of high refractive index, in particular $Nb_2O_5$, the second material being attached to a first material of the semiconductor of the device.

616. µ-LED according to any of the preceding items, in which the output structure comprises a transparent third material of low refractive index, in particular $SiO_2$, on a transparent second material of high refractive index, the second material being attached to a first material of the semiconductor of the device and comprising periodic photonic crystals or non-periodic photonic structures, in particular quasi-periodic or deterministic aperiodic photonic structures.

617. Converter element for an optoelectronic component, which has at least one layer comprising a converter material which, when excited by an incident excitation radiation, emits a converted radiation into an emission region,
characterized in that the layer has at least in some areas a structure on which the converter material is arranged at least in sections and which is configured in such a way that the radiation is emitted as a directed beam of rays into the emission area.

618. Converter element according to item 617, characterised in that the structure is quasi-periodic or deterministically aperiodic.

619. Converter element according to item 617 or 618, characterised in that the layer comprises at least one photonic crystal, a quasi-periodic photonic structure or a deterministically aperiodic photonic structure.

620. Converter element according to any of the preceding items,
characterised in that the structure comprises at least one recess in which the converter material is located.

621. Converter element according to any of the preceding items,
characterised in that the layer comprises an optical band gap.

622. Converter element according to any of the preceding items,
characterized in that the structure comprises an average thickness of at least 500 nm.

623. Converter element according to any of the preceding items,
characterized in that the layer with the structure is configured such that the directed beam of rays is emitted perpendicularly to a plane in which the layer is arranged.

624. Converter element according to any of the preceding items,
characterized in that an optical filter element is arranged at least on one side of the layer.

625. Light-shaping structure for an optoelectronic device comprising at least one layer with a converter material which, when excited by an incident excitation radiation, emits a converted radiation into an emission region
characterized in that the layer has at least in some areas a structure on which the converter material is arranged at least in sections and which is configured in such a way that the radiation is emitted as a directed beam of rays into the emission area.

626. Light-shaping structure according to item 625, characterised in that the structure is quasi-periodic or deterministically aperiodic.

627. Light-shaping structure according to item 625 or 626,
characterised in that the layer comprises at least one photonic crystal, a quasi-periodic photonic structure or a deterministically aperiodic photonic structure.

628. Light-shaping structure according to any of the preceding items,
characterised in that the structure comprises at least one recess in which the converter material is located.

629. Light-shaping structure according to any of the preceding items,
characterised in that the layer comprises an optical band gap.

630. Light-shaping structure according to any of the preceding items,
characterized in that the structure comprises an average thickness of at least 500 nm.

631. Light-shaping structure according to any of the preceding items,
characterized in that the layer with the structure is configured such that the directed beam of rays is emitted perpendicularly to a plane in which the layer is arranged.

632. Light-shaping structure according to any of the preceding items,
characterized in that an optical filter element is arranged at least on one side of the layer.

633. µ-LED arrangement comprising a µ-LED and a converter element according to any of the preceding items, wherein the µ-LED is adapted to radiate an excitation radiation into the converter element, and wherein the converter element comprises at least one layer comprising a converter material.

634. µ-LED arrangement comprising a µ-LED and having a light-shaping structure according to any of the preceding items, wherein the µ-LED is adapted to irradiate an excitation radiation into the light-shaping structure, and wherein the light-shaping structure comprises at least one layer comprising a converter material.

635. µ-LED arrangement according to item 633 or 634, characterized in that the layer is part of a semiconductor substrate of the µ-LED.

636. µ-LED arrangement according to any of the items 633 to 635,
characterised in that the structure of the converter element or light-shaping structure is formed in the semiconductor substrate of the µ-LED.

637. µ-LED arrangement according to any of the items 633 to 636,
characterized in that the structure with the converter material is configured in such a way that the converted radiation is emitted into the emission region perpendicular to a plane in which the semiconductor substrate is arranged.

638. µ-LED arrangement according to any of the items 633 to 637,
characterised in that the structure of the converter element or light-shaping structure is at least partially disposed in an active layer of the µ-LED.

639. Method for producing a µ-LED arrangement according to any of the items 633 to 638,
characterised in that the structure of the converter element or the light-shaping structure is formed by at least one etching step in a semiconductor substrate of the µ-LED.

640. Method according to item 639,
characterised in that the structure of the converter element or light-shaping structure is at least partially filled with the converter material.

641. Optoelectronic device or µ-LED array, comprising:
an arrangement comprising a plurality of µ-LEDs for generating light emerging from a light exit surface from the optoelectronic device, and
at least one photonic structure arranged between the light-emitting surface and the plurality of µ-LEDs.

642. Optoelectronic device according to item 641, in which the photonic structure is configured for beam-shaping of the light generated by the µ-LEDs, in particular in such a way that the light emerges at least substantially perpendicularly from the light exit surface.

643. Optoelectronic device according to any of the preceding items, in which the photonic structure comprises a photonic crystal.

644. Optoelectronic device according to any of the preceding items, in which
the arrangement is an array in which the µ-LEDs represent a plurality of pixels and are arranged in a layer, and in that a photonic structure is arranged or formed in the layer.

645. Optoelectronic device according to any of the preceding items, characterized in that
the arrangement is an array in which the µ-LEDs represent a plurality of pixels arranged in a first layer and in that a photonic crystal is arranged in a further, second layer, the second layer being located between the first layer and the light-emitting surface.

646. Optoelectronic device according to any of the preceding items, characterized in that
the arrangement comprises a plurality of µ-LEDs arranged in a first layer, and that a photonic crystal is arranged in the further, second layer, the second layer being located between the first layer and the light-emitting surface.

647. Optoelectronic device according to any of the preceding items, characterized in that
each of the µ-LEDs comprises a recombination zone and the photonic structure is located so close to the recombination zones that the photonic structure changes an optical state density present in the region of the recombination zones, in particular in such a way that a band gap is generated for at least one optical mode with a direction of propagation parallel and/or at a small angle to the light exit surface.

648. Optoelectronic device according to any of the preceding items, characterized in that
the photonic structure is arranged in relation to a plane parallel to the light-emitting surface independently of the positioning of the light points, and/or
the photonic structure is a two-dimensional photonic crystal, which exhibits a periodic variation of the optical refractive index in two spatial directions perpendicular to each other and spanning the plane.

649. Optoelectronic device according to any of the preceding items, characterized in that
the photonic structure comprises a plurality of pillar structures extending at least partially between the light-emitting surface and the plurality of µ-LEDs, wherein one pillar is associated with each µ-LED and is aligned with the light-emitting surface when viewed in a direction perpendicular to the light-emitting surface.

650. Optoelectronic device according to item 649, characterised in that
the device is an array in which the µ-LEDs represent a plurality of pixels arranged in a first layer and in that the pixels are arranged in a further, second layer, the second layer being located between the first layer and the light-emitting surface.

651. Optoelectronic device according to item 649, characterised in that
the device comprises a plurality of µ-LEDs, arranged in a first layer, and that the pillars are arranged or formed in a further, second layer, the second layer being located between the first layer and the light-emitting surface.

652. Optoelectronic device according to item 649, characterised in that
the arrangement is an array in which the µ-LEDs represent a plurality of pixels, one pixel being formed by each pillar.

653. Method for producing an optoelectronic device,
in particular a device according to any of the preceding items, wherein an arrangement comprising a plurality of µ-LEDs is provided or made for generating light emerging from a light exit surface from the optoelectronic device, and at least one photonic structure is arranged between the light-emitting surface and the plurality of µ-LEDs.

654. µ-LED arrangement having at least one µ-LED which emits radiation via a light-emitting surface, and having a polarization element which adjoins the light-emitting surface at least in sections and changes a polarization and/or an intensity of a radiation emanating from the µ-LED when the radiation passes through the polarization element,
characterised in that
the polarizing element comprises a photonic structure.

655. µ-LED arrangement according to item 654, characterized in that
it is a three-dimensional photonic structure and/or that the polarizing element is configured in the form of a layer which is arranged at least in regions on the light-emitting surface.

656. µ-LED arrangement according to item 654 or 655, in which the µ-LED is a vertical µ-LED with one connecting contact on opposite sides.

657. µ-LED arrangement according to any of the preceding items,
characterized in that
the µ-LED, which is configured to emit light, in particular red, green, blue, ultraviolet or infrared light, which is irradiated into the polarizing element, and that the polarizing element polarizes the radiation in an oscillation direction when passing through the polarizing element.

658. µ-LED arrangement according to any of the preceding items, wherein
the polarising element has spiral and/or rod-shaped structural elements.

659. µ-LED arrangement according to any of the preceding items, wherein
the µ-LED comprises at least one converter element with a converter material which, excited by excitation radiation emanating from the µ-LED, emits converted radiation.

660. µ-LED arrangement according to any of the preceding items,
characterised in that
the polarizing element comprises at least one three-dimensional photonic crystal.

661. µ-LED array according to any of the preceding items, wherein
the polarizing element comprises at least two two-dimensional photonic crystals arranged one behind the other along a beam path of the radiation penetrating the polarizing element.

662. µ-LED array according to any of the preceding items, wherein
the polarizing element has at least two different polarization properties and/or degrees of transmission depending on a wavelength of the radiation passing through the polarizing element.

663. µ-LED arrangement according to any of the preceding items,
characterised in that
the µ-LED has a converter element with a converter material which, excited by excitation radiation emanating from the µ-LED, emits converted radiation, and in that excitation radiation incident on the polarizing element is polarized differently and/or absorbed to a different extent when passing through the polarizing element compared with converted radiation passing through.

664. µ-LED arrangement according to any of the preceding items, where
a three-dimensional structure of the polarizing element is at least partially incorporated in a semiconductor layer of the µ-LED adjacent to the light-emitting surface.

665. µ-LED array according to any of the preceding items, which is a three-dimensional photonic structure and converter material is disposed in the three-dimensional photonic structure.

666. Method for producing a µ-LED arrangement having at least one µ-LED which emits radiation via a light-emitting surface, and having a polarization element which adjoins the light-emitting surface at least in sections and changes a polarization and/or an intensity of a radiation emanating from the µ-LED when the radiation passes through the polarization element,
characterised in that
an in particular three-dimensional photonic structure, in particular by two-photon lithography or glancing angle deposition, is applied to the light-emitting surface of the µ-LED as polarization element and/or the photonic structure is arranged in a semiconductor layer of the µ-LED adjoining the light-emitting surface.

667. Method according to item 666, characterized in that the photonic structure is dimensioned as a function of the wavelength of the radiation emitted by the µ-LED 668. Use of a µ-LED array according to any of the preceding items in a device for generating three-dimensional images.

669. Use of a µ-LED array according to any of the preceding items, characterized in that the µ-LED arrangement is used after one of the objects 654 to 665 for computer-aided generation of three-dimensional images for an augmented reality application.

670. Optoelectronic component, in particular comprising a µ-LED array
at least one µ-LED which emits electromagnetic radiation via a light emission surface, and
a photonic structure for beam-shaping of the electromagnetic radiation before it exits via the light emission surface, wherein the photonic structure shapes the electromagnetic radiation such that the electromagnetic radiation has a specific far field.

671. Optoelectronic component according to item 670, characterized in that
the photonic structure is a one-dimensional photonic structure, in particular a one-dimensional photonic crystal 672. Optoelectronic component according to item 670 or 671,
characterized in that
the photonic structure is formed, in particular as a one-dimensional photonic crystal, in such a way that the radiated electromagnetic radiation is at least approximately collimated in a first spatial direction.

673. Optoelectronic component according to item 672, characterized in that
a collimating optical system is arranged downstream of the light exit surface, as viewed in the main radiation direction, the optical system being designed to collimate the electromagnetic radiation in a further, second spatial direction (R2), which is orthogonal to the first spatial direction.

674. Optoelectronic component according to one of the preceding items, characterized in that
the photonic structure, in particular formed as a one-dimensional photonic crystal, is designed in such a way that a main radiation direction of the electromagnetic radiation runs at an angle to the normal of the light exit surface, the angle being not equal to zero degrees.

675. Optoelectronic component according to item 674, characterized in that
the photonic structure formed as a one-dimensional photonic crystal is arranged in a layer below the light-emitting surface, wherein the one-dimensional photonic crystal comprises a periodically repeating sequence of two materials with different optical refractive indices extending in a first direction, wherein the materials have abutting interfaces, which are not orthogonal but inclined to the light-emitting surface.

676. Optoelectronic component according to one of the preceding items, characterized in that
the photonic structure is a two-dimensional photonic structure, in particular a two-dimensional photonic crystal 677. Optoelectronic component according to item 676, characterized in that
the two-dimensional photonic structure is designed such that the electromagnetic radiation produces a defined, in particular a discrete, pattern in the far field.

678. Optoelectronic component according to any of the preceding items, characterized in that
the photonic structure is arranged in a layer, in particular a semiconductor layer, below the light emission surface, and/or the photonic structure is formed in a semiconductor layer of the optoelectronic emitter unit, and/or
the optoelectronic emitter unit comprises a converter material layer and the photonic structure is formed in the converter material layer or in a layer between the converter material layer and the light-emitting surface.

679. Optoelectronic component according to one of the preceding items, characterized in that
the photonic structure, in particular instead of a photonic crystal, is a quasi-periodic or deterministically aperiodic photonic structure.

680. Surface topography recognition system, with:
an optoelectronic device, comprising:
at least one optoelectronic emitter unit which emits electromagnetic radiation via a light exit surface, and
a photonic structure for beam-shaping of the electromagnetic radiation before it exits via the light emission surface, wherein the photonic structure shapes the electromagnetic radiation such that the electromagnetic radiation has a specific far field,
wherein the photonic structure is a two-dimensional photonic structure, in particular a two-dimensional photonic crystal, and
wherein the two-dimensional photonic structure is designed such that the electromagnetic radiation generates a defined, in particular a discrete, pattern in the far field, and
wherein said surface topography detection system further comprises
a detection unit, in particular with a camera, which is designed to detect the pattern in the far field 681. surface topography recognition system according to item 680 characterized in that
it comprises an analysis device adapted to detect a distortion of the pattern with respect to a predetermined reference pattern.

682. Surface topography detection system according to item 681,
characterized in that
the analysis means is adapted to determine a shape and/or a structure of an object illuminated by the pattern as a function of the distortion detected.

683. Scanner for scanning an object, comprising at least one optoelectronic component for one of the previous objects.

The description with the help of the exemplary embodiments does not limit the various embodiments shown in the examples to these. Rather, the disclosure depicts several aspects, which can be combined with each other and also with each other. Aspects that relate to processes, for example, can thus also be combined with aspects where light extraction is the main focus. This is also made clear by the various objects shown above.

The invention thus comprises any features and also any combination of features, including in particular any combination of features in the subject-matter and claims, even if that feature or combination is not explicitly specified in the exemplary embodiments.

The invention claimed is:
1. A µ-LED arrangement for generating a pixel of a display, comprising:
a carrier substrate;
at least three µ-LEDs, which are arranged on an assembly side of the carrier substrate;

wherein the at least three μ-LEDs are adapted to emit light of different colors transverse to a carrier substrate plane in a direction away from the carrier substrate;

a reflector element;

wherein the reflector element is spatially arranged on the assembly side of the carrier substrate;

wherein the reflector element is covering and laterally surrounding the at least three μ-LEDs and is configured to reflect the light emitted by the at least three μ-LEDs in a second direction of the carrier substrate;

wherein the carrier substrate is at least partially transparent so that the light reflected from the reflector element propagates through the carrier substrate and emerges at a display side of the carrier substrate opposite the assembly side; and wherein the at least three μ-LEDs have a common electrical contact on a side of the at least three μ-LEDs facing the reflector element.

2. The μ-LED arrangement according to claim 1, wherein a diffuser layer is provided and/or a reflector material has diffuser particles for scattering the light reflected by the at least three μ-LEDs on a side of the reflector element directed towards the at least three μ-LEDs.

3. The μ-LED arrangement according to claim 1, wherein the reflector element forms an electrical contact of the at least three μ-LEDs.

4. The μ-LED arrangement according to claim 1, wherein the reflector element is configured and shaped such that at least 90% of the light emitted by the at least three μ-LEDs is incident on the assembly side of the carrier substrate at an angle between 45 and 90 degrees relative to the carrier substrate plane.

5. The μ-LED arrangement according to claim 1, wherein a passivation layer is additionally provided for attenuating or eliminating reflections of the light at mesa edges of the at least three μ-LEDs.

6. The μ-LED arrangement according to claim 1, wherein a light absorbing coating is provided on the assembly side and/or the display side of the carrier substrate outside the reflector element.

7. The μ-LED arrangement according to claim 1,
wherein a color filter element is arranged on the display side of the carrier substrate opposite the reflector element; and wherein the color filter element allows a primary color spectrum of the at least three μ-LEDs to pass and attenuates deviating color spectra.

8. The μ-LED arrangement according to claim 1, in which a light-shaping structure, in particular a photonic structure is incorporated in or on the carrier substrate, which first and second regions with different refractive indexes are incorporated.

9. The μ-LED arrangement according to claim 1, in which a light-shaping and/or a light-converting structure having a first area and a second area is arranged on the display side of the carrier substrate.

10. The μ-LED arrangement according to claim 1, comprising a converter material surrounding at least one μ-LED of the at least three μ-LEDs and filling a space between the at least one μ-LED and a reflector material.

11. The μ-LED arrangement according to claim 2, wherein the diffuser layer and/or the diffuser particles comprise $Al_2O_2$ and/or $TiO_2$.

12. The μ-LED arrangement according to claim 1, wherein the reflector element surrounds the at least three μ-LEDs in a circular, polygonal or parabolic shape.

13. The μ-LED arrangement according to claim 1, wherein the carrier substrate comprises polyamide, a transparent plastic, resin or glass.

14. The μ-LED arrangement according to claim 1, wherein the reflector element is formed as a reflective layer of the at least three μ-LEDs.

15. The μ-LED arrangement according to claim 1, wherein the display side of the carrier substrate has an uneven and/or roughened structure.

16. The μ-LED arrangement according to claim 9, wherein the first area and the second area comprise a converted material.

17. The μ-LED arrangement according to claim 1, further comprising a converter material on the display side of the carrier substrate.

* * * * *

UNITED STATES PATENT AND TRADEMARK OFFICE
CERTIFICATE OF CORRECTION

| | |
|---|---|
| PATENT NO. | : 11,610,868 B2 |
| APPLICATION NO. | : 17/039097 |
| DATED | : March 21, 2023 |
| INVENTOR(S) | : Peter Brick |

It is certified that error appears in the above-identified patent and that said Letters Patent is hereby corrected as shown below:

On the Title Page

In item (30) Foreign Application Priority Data, the 1st priority application reads as follows:
Apr. 23, 2019 (DE) 10 2019 110 199.8

The 1st priority application should read as follows:
-- Apr. 23, 2019 (DE) 10 2019 110 499.8 --

Signed and Sealed this
Ninth Day of May, 2023

Katherine Kelly Vidal
*Director of the United States Patent and Trademark Office*